(12) United States Patent
Yoshioka

(10) Patent No.: US 12,107,103 B2
(45) Date of Patent: Oct. 1, 2024

(54) IMAGING APPARATUS AND ELECTRONIC EQUIPMENT FOR PEELING OFF PREVENTION IN LENS

(71) Applicant: SONY SEMICONDUCTOR SOLUTIONS CORPORATION, Kanagawa (JP)

(72) Inventor: Hirotaka Yoshioka, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 83 days.

(21) Appl. No.: 17/755,640

(22) PCT Filed: Oct. 30, 2020

(86) PCT No.: PCT/JP2020/040797
§ 371 (c)(1),
(2) Date: May 4, 2022

(87) PCT Pub. No.: WO2021/095562
PCT Pub. Date: May 20, 2021

(65) Prior Publication Data
US 2022/0392937 A1 Dec. 8, 2022

(30) Foreign Application Priority Data
Nov. 13, 2019 (JP) .................... 2019-205538

(51) Int. Cl.
*H01L 27/146* (2006.01)
*G02B 3/02* (2006.01)

(52) U.S. Cl.
CPC .......... *H01L 27/14625* (2013.01); *G02B 3/02* (2013.01)

(58) Field of Classification Search
CPC ......... H01L 27/14625; H01L 27/14612; H01L 27/14621; H01L 27/14627; H01L 27/14636; H01L 27/14645; G02B 3/02; G02B 7/021; G02B 13/0085; G02B 27/0018; G02B 3/00; H04N 25/70
See application file for complete search history.

(56) References Cited

FOREIGN PATENT DOCUMENTS

| CN | 111065949 A | 4/2020 |
|---|---|---|
| JP | 2009-123788 A | 6/2009 |
| JP | 2015-061193 A | 3/2015 |

(Continued)

OTHER PUBLICATIONS

International Search Report and Written Opinion of PCT Application No. PCT/JP2020/040797, issued on Jan. 26, 2021, 10 pages of ISRWO.

*Primary Examiner* — Twyler L Haskins
*Assistant Examiner* — Angel L Garces-Rivera
(74) *Attorney, Agent, or Firm* — CHIP LAW GROUP

(57) ABSTRACT

The present disclosure relates to an imaging apparatus and electronic equipment that make it possible to reduce peeling stresses at angled sections included in the four corners of a lens, and prevent the lens from being peeled off. An imaging apparatus includes a solid-state imaging element that generates a pixel signal by photoelectric conversion according to a light amount of incident light, a glass substrate provided on the solid-state imaging element, and a lens provided on the glass substrate, in which four corners of the lens that is substantially rectangular when seen in a plan view do not have angles equal to or smaller than 90°. The present technology may be applied to an imaging apparatus and the like, for example.

10 Claims, 79 Drawing Sheets

PEELING STRESS APPLIED TO ANGLED SECTION

(56) References Cited

FOREIGN PATENT DOCUMENTS

| | | |
|---|---|---|
| JP | 2019-047237 A | 3/2019 |
| JP | 2019-213151 A | 12/2019 |
| WO | WO-2012052751 A1 | 4/2012 |
| WO | 2019/044540 A1 | 3/2019 |
| WO | 2019/131488 A1 | 7/2019 |
| WO | 2019/235246 A1 | 12/2019 |

F I G. 5 7
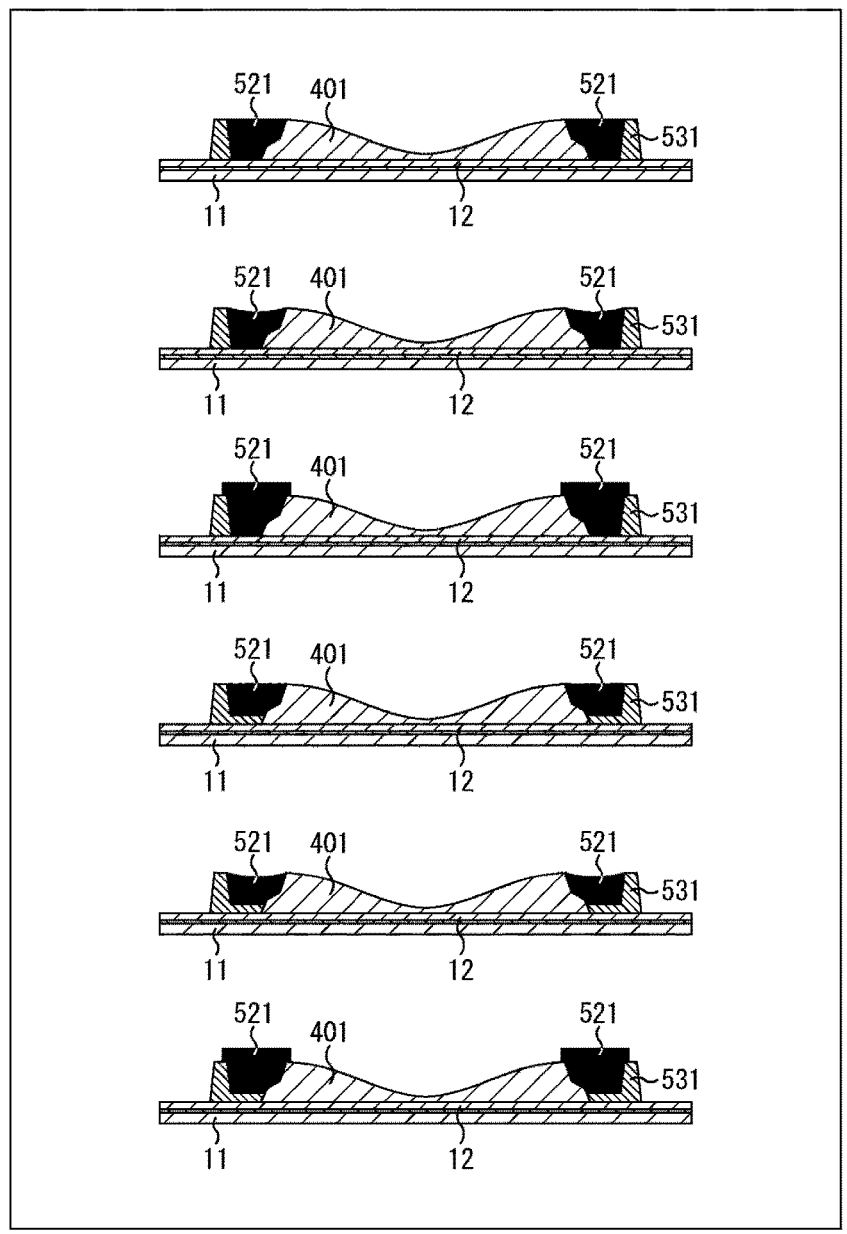

UV LIGHT SOURCE WITH DIRECTIONAL ANGLE > 60°

UV LIGHT SOURCE WITH DIRECTIONAL ANGLE > 30°

IMAGING APPARATUS AND ELECTRONIC EQUIPMENT FOR PEELING OFF PREVENTION IN LENS

CROSS REFERENCE TO RELATED APPLICATIONS

This application is a U.S. National Phase of International Patent Application No. PCT/JP2020/040797 filed on Oct. 30, 2020, which claims priority benefit of Japanese Patent Application No. JP 2019-205538 filed in the Japan Patent Office on Nov. 13, 2019. Each of the above-referenced applications is hereby incorporated herein by reference in its entirety.

TECHNICAL FIELD

The present disclosure relates to an imaging apparatus and electronic equipment, and in particular relates to an imaging apparatus and electronic equipment that make it possible to reduce peeling stresses at angled sections included in four corners of a lens, and prevent the lens from being peeled off.

BACKGROUND ART

In recent years, solid-state imaging elements used in mobile terminal apparatuses with a camera, digital still cameras, or the like have an increasingly larger number of pixels, more reduced size, and smaller height.

Along with an increase of the number of pixels and a size reduction of cameras, typically, a distance between a lens and a solid-state imaging element along their optical axes becomes shorter, and an infrared cut filter is arranged near the lens.

For example, there is a proposed technology that realizes a size reduction of a solid-state imaging element by configuring, on the solid-state imaging element, the lowermost-layer lens in a lens group including a plurality of lenses.

CITATION LIST

Patent Literature

[PTL 1]
Japanese Patent Laid-open No. 2015-061193

SUMMARY

Technical Problem

However, in a case where the lowermost-layer lens is configured on the solid-state imaging element, contraction stresses are concentrated at angled sections included in the four corners of a lens when seen in a plan view, and the lens in this state can easily be peeled off.

The present disclosure has been made in view of such a situation, and in particular makes it possible to reduce peeling stresses of angled sections included in the four corners of a lens, and prevent the lens from being peeled off.

Solution to Problem

An imaging apparatus according to an aspect of the present disclosure includes a solid-state imaging element that generates a pixel signal by photoelectric conversion according to a light amount of incident light, a glass substrate provided on the solid-state imaging element, and a lens provided on the glass substrate, in which four corners of the lens that is substantially rectangular when seen in a plan view do not have angles equal to or smaller than 90°.

Electronic equipment according to another aspect of the present disclosure includes an imaging apparatus including a solid-state imaging element that generates a pixel signal by photoelectric conversion according to a light amount of incident light, a glass substrate provided on the solid-state imaging element, and a lens provided on the glass substrate, in which four corners of the lens that is substantially rectangular when seen in a plan view do not have angles equal to or smaller than 90°.

In an aspect of the present disclosure, a configuration includes a solid-state imaging element that generates a pixel signal by photoelectric conversion according to a light amount of incident light, a glass substrate provided on the solid-state imaging element, and a lens provided on the glass substrate. Four corners of the lens that is substantially rectangular when seen in a plan view do not have angles equal to or smaller than 90°.

The imaging apparatus and the electronic equipment may be discrete apparatuses or may be modules to be incorporated into other apparatuses.

BRIEF DESCRIPTION OF DRAWINGS

FIG. 57 is a figure for explaining examples in which a light blocking film is formed on the side surface by configuring the lens and a bank such that the lens and the bank are connected.

DESCRIPTION OF EMBODIMENTS

Suitable embodiments according to the present disclosure are explained in detail below with reference to the attached figures. Note that overlapping explanations about constituent elements having substantially identical functional configurations in the present specification and figures are omitted by giving the constituent elements identical reference signs.

Modes for implementing the present disclosure (referred to as embodiments below) are explained below. Note that the explanations are given in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment
11. Eleventh Embodiment
12. Twelfth Embodiment
13. Thirteenth Embodiment
14. Fourteenth Embodiment
15. Fifteenth Embodiment
16. Sixteenth Embodiment
17. Seventeenth Embodiment
18. Eighteenth Embodiment
19. Nineteenth Embodiment
20. Twentieth Embodiment
21. Twenty-First Embodiment
22. Twenty-Second Embodiment
23. Twenty-Third Embodiment
24. Examples of Application to Electronic Equipment
25. Use Examples of Solid-State Imaging Apparatus
26. Examples of Application to Endoscopic Surgery Systems
27. Examples of Application to Mobile Bodies

1. First Embodiment

<Configuration Examples of Imaging Apparatus>

Figure 1:
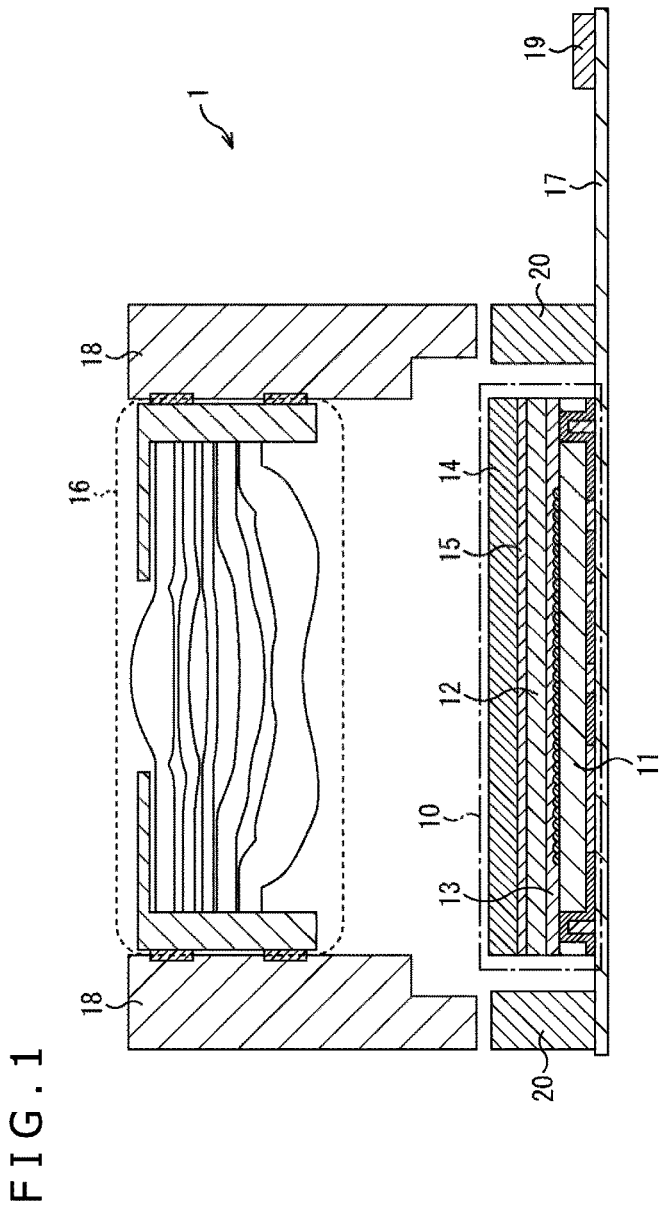
FIG. 1 is a figure for explaining a configuration example of a first embodiment of an imaging apparatus according to the present disclosure.

With reference to FIG. 1, a configuration example of an imaging apparatus according to a first embodiment of the present disclosure that reduces occurrence of ghosts and flares while realizing a size reduction and a height reduction of the apparatus configuration is explained. Note that FIG. 1 is a side-surface cross-sectional view of the imaging apparatus.

An imaging apparatus 1 in FIG. 1 includes a solid-state imaging element 11, a glass substrate 12, an IRCF (infrared cut filter) 14, a lens group 16, a circuit board 17, an actuator 18, a connector 19, and a spacer 20.

The solid-state imaging element 11 is an image sensor including a generally-called CMOS (Complementary Metal Oxide Semiconductor), CCD (Charge Coupled Device), or the like, and is fixed onto the circuit board 17 in an electrically connected state. As mentioned later with reference to FIG. 4, the solid-state imaging element 11 includes a plurality of pixels arranged in an array. Each of the pixels generates a pixel signal according to the light amount of incident light that is condensed and caused to enter via the lens group 16 from above in the figure, and outputs the pixel signal as an image signal to the outside from the connector 19 via the circuit board 17.

The glass substrate 12 is provided on the top surface section, in FIG. 1, of the solid-state imaging element 11, and the glass substrate 12 and the solid-state imaging element 11 are pasted together by using an adhesive (GLUE) 13 that is transparent, that is, has a refractive index which is substantially identical to the refractive index of the glass substrate 12.

The IRCF 14 that cuts infrared light in incident light is provided on the top surface section, in FIG. 1, of the glass substrate 12, and the IRCF 14 and the glass substrate 12 are pasted together by using an adhesive (GLUE) 15 that is transparent, that is, has a refractive index which is substantially identical to the refractive index of the glass substrate 12. The IRCF 14 includes a blue plate glass, for example, and cuts (eliminates) infrared light.

That is, the solid-state imaging element 11, the glass substrate 12, and the IRCF 14 are stacked on one another, and pasted together by using the transparent adhesives 13 and 15 to have an integrated configuration which is connected to the circuit board 17. Note that because the solid-state imaging element 11, the glass substrate 12, and the IRCF 14 surrounded by a dash-dotted line in the figure are pasted together by using the adhesives 13 and 15 having substantially identical refractive indexes to have an integrated configuration, the solid-state imaging element 11, the glass substrate 12, and the IRCF 14 are simply referred to also as an integrated configuration section 10 in explanations below.

In addition, the IRCF 14 may be pasted onto the glass substrate 12 after the solid-state imaging element 11 is diced at a step of manufacturing the solid-state imaging element 11 or may be formed by being diced into a piece for each solid-state imaging element 11 after a large-sized IRCF 14 is pasted onto the entire glass substrate 12 in a wafer shape including a plurality of solid-state imaging elements 11. Any of these techniques may be adopted.

The spacer 20 is configured on the circuit board 17 such that the spacer 20 surrounds the whole including the integrally-configured solid-state imaging element 11, the glass substrate 12, and the IRCF 14. In addition, the actuator 18 is provided on the spacer 20. The actuator 18 has a cylindrical shape. The actuator 18 has therein the lens group 16 including a plurality of lenses that are stacked on one another inside the cylindrical shape, and drives the lens group 16 vertically in FIG. 1.

According to such a configuration, the actuator 18 realizes auto focusing by moving the lens group 16 vertically in FIG. 1 (in the forward/backward direction of the optical axis) to thereby adjust the focal point such that an image of a subject which is not depicted, but is located in the upward direction in the figure is formed on the imaging surface of the solid-state imaging element 11 according to the distance to the subject.

Figure 2:
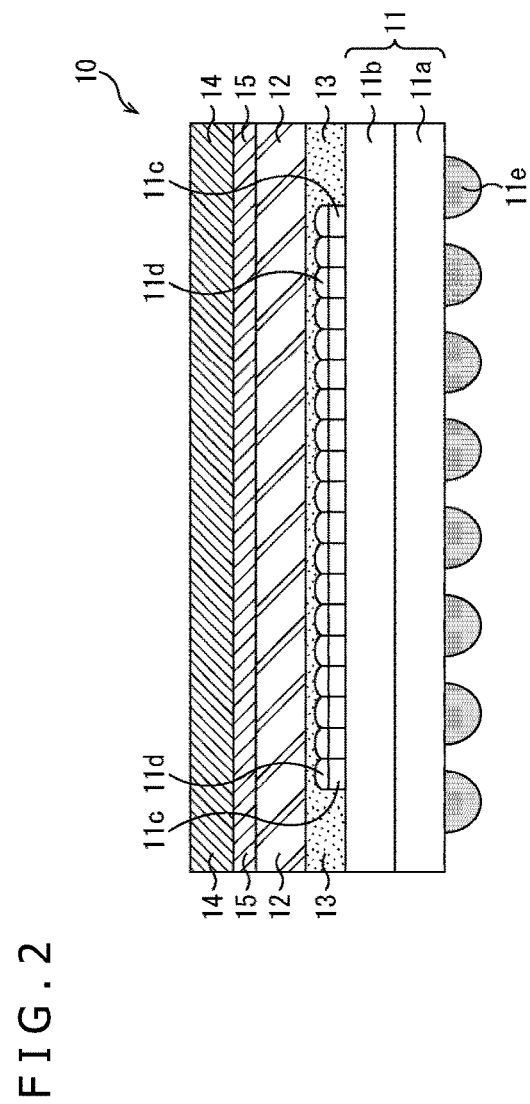
FIG. 2 is an external appearance schematic view of an integrated configuration section including a solid-state imaging element in the imaging apparatus in FIG. 1.

<External Appearance Schematic View> Next, the configuration of the integrated configuration section 10 is explained with reference to FIGS. 2, 3A, 3B, 4, 5, and 6. FIG. 2 depicts an external appearance schematic view of the integrated configuration section 10.

The integrated configuration section 10 depicted in FIG. 2 is a semiconductor package obtained by packaging the solid-state imaging element 11 including a stacked substrate including a lower substrate 11a and an upper substrate 11b that are stacked on one another.

A plurality of solder balls 11e which are backside electrodes for electrical connection with the circuit board 17 in FIG. 1 are formed on the lower substrate 11a of the stacked substrate included in the solid-state imaging element 11.

R (red), G (green), and B (blue) color filters 11c and on-chip lenses 11d are formed on the top surface of the upper substrate 11b. In addition, the upper substrate 11b is connected with the glass substrate 12 for protecting the on-chip lenses 11d by a cavity-less structure via the adhesive 13 including a glass sealing resin.

Figure 3A:
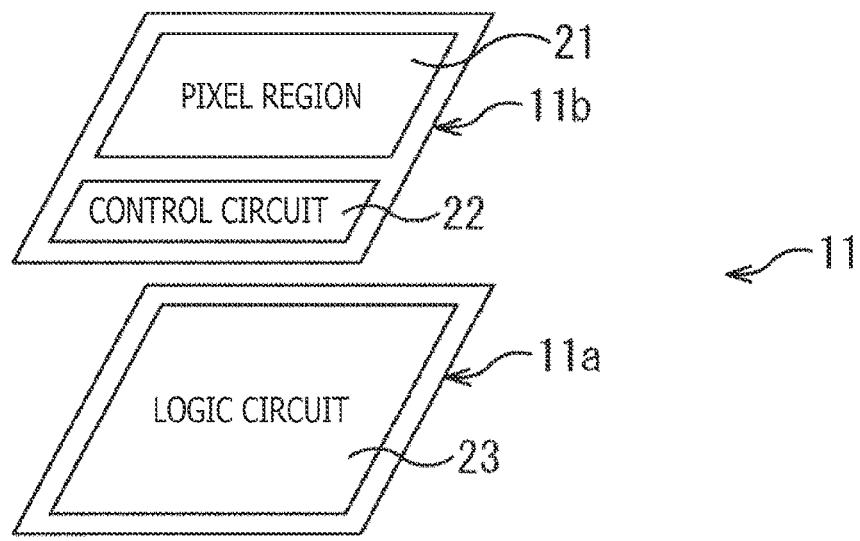
FIGS. 3A and 3B depicts figures for explaining a substrate configuration of the integrated configuration section.

For example, as depicted in A in FIG. 3A, a pixel region 21 having pixel sections that perform photoelectric conversion, and are arrayed two-dimensionally, and a control circuit 22 that controls the pixel sections are formed on the upper substrate 11b, and a logic circuit 23 such as a signal processing circuit that processes pixel signals output from the pixel sections is formed on the lower substrate 11a.

Figure 3B:
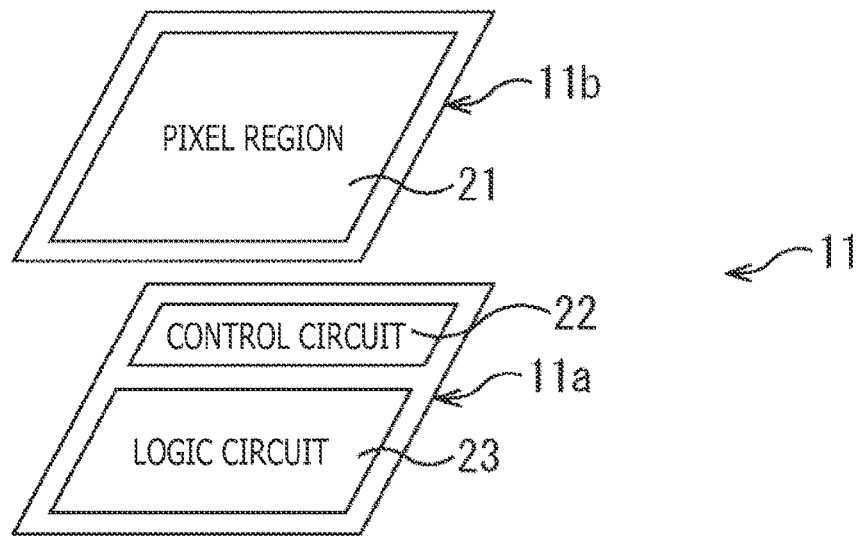

Alternatively, as depicted in FIG. 3B, in another possible configuration, only the pixel region 21 may be formed on the upper substrate 11b, and the control circuit 22 and the logic circuit 23 may be formed on the lower substrate 11a.

By forming the logic circuit 23 or both the control circuit 22 and the logic circuit 23 on the lower substrate 11a different from the upper substrate 11b on which the pixel region 21 is formed as mentioned above, and stacking the lower substrate 11a and the upper substrate 11b one on another, the size of the imaging apparatus 1 can be reduced as compared with a case that the pixel region 21, the control circuit 22, and the logic circuit 23 are arranged in the plane direction on one semiconductor substrate.

In explanations below, the upper substrate 11b on which at least the pixel region 21 is formed is referred to as a pixel sensor substrate 11b, and the lower substrate 11a on which at least the logic circuit 23 is formed is referred to as a logic board 11a.

<Configuration Examples of Stacked Substrate>

Figure 4:
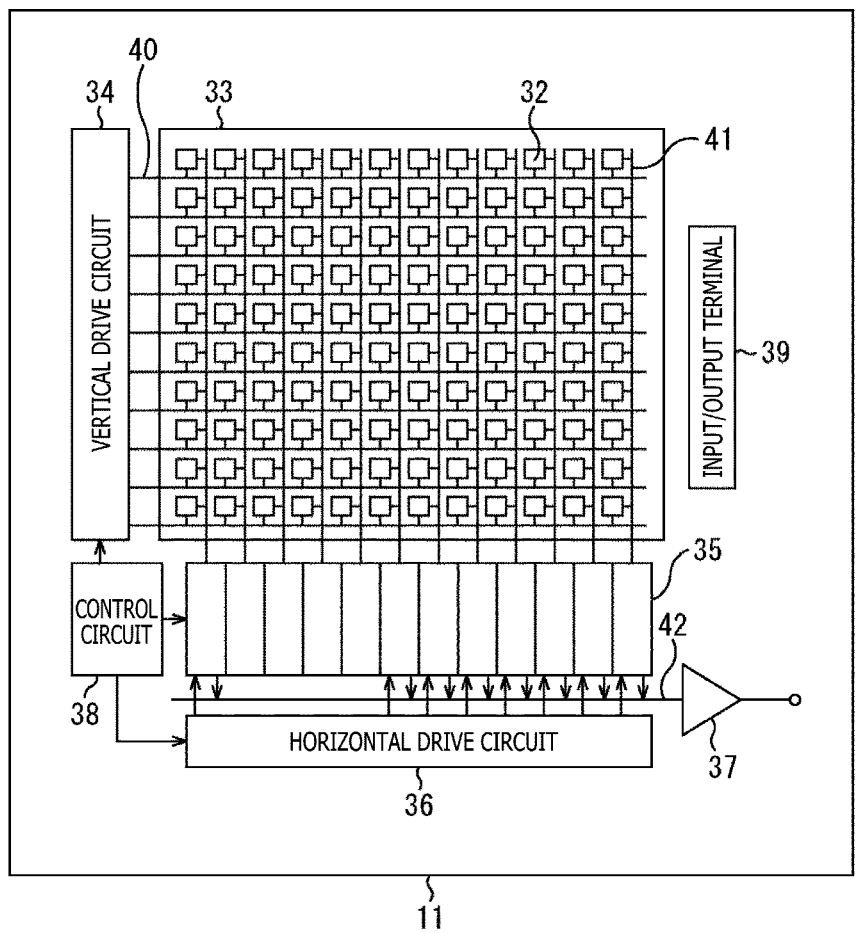
FIG. 4 is a figure depicting a circuit configuration example of a stacked substrate.

FIG. 4 depicts a circuit configuration example of the solid-state imaging element 11.

The solid-state imaging element 11 includes a pixel array section 33 having pixels 32 that are arrayed two-dimensionally, a vertical drive circuit 34, column signal processing circuits 35, a horizontal drive circuit 36, an output circuit 37, a control circuit 38, and an input/output terminal 39.

A pixel 32 has a photodiode as a photoelectric converting element and a plurality of pixel transistors. A circuit configuration example of the pixels 32 is mentioned later with reference to FIG. 5.

In addition, the pixels 32 can also have a shared pixel structure. The pixel shared structure includes a plurality of photodiodes, a plurality of transfer transistors, one shared floating diffusion (floating diffusion region), and other shared pixel transistors each type of which is present singly. That is, in the shared pixels, the photodiodes and the transfer transistors included in a plurality of unit pixels are configured to share the other pixel transistors each type of which is present singly.

The control circuit 38 receives input clocks and data as commands about operation modes or the like, and outputs data of inside information of the solid-state imaging element 11 and the like. That is, on the basis of vertical synchronizing signals, horizontal synchronization signals, and master clocks, the control circuit 38 generates clock signals and control signals which serve as reference signals for operation of the vertical drive circuit 34, the column signal processing circuits 35, the horizontal drive circuit 36, and the like. Then, the control circuit 38 outputs the generated clock signals and control signals to the vertical drive circuit 34, the column signal processing circuits 35, the horizontal drive circuit 36, and the like.

For example, the vertical drive circuit 34 includes a shift register, selects a predetermined pixel driving wire 40, supplies pulses for driving pixels 32 to the selected pixel driving wire 40, and drives pixels 32 one row after another row. That is, the vertical drive circuit 34 selects and scans the pixels 32 in the pixel array section 33 sequentially in the vertical direction one row after another row, and supplies, through vertical signal lines 41, the column signal processing circuits 35 with pixel signals based on signal charge generated according to received light amounts at the photoelectric converting sections of the pixels 32.

Each column signal processing circuit 35 is arranged corresponding to a column of pixels 32, and performs signal processing such as noise elimination on a signal output from a pixel 32 in one line and in the corresponding pixel column. For example, the column signal processing circuits 5 perform signal processing such as CDS (Correlated Double Sampling) for eliminating fixed pattern noise unique to the pixels or AD conversion.

For example, the horizontal drive circuit 36 includes a shift register, and outputs horizontal scanning pulses sequentially to thereby select each of the column signal processing circuits 35 one after another, and causes a pixel signal to be output from each of the column signal processing circuits 35 to a horizontal signal line 42.

The output circuit 37 performs signal processing on signals supplied sequentially from each of the column signal processing circuits 35 through the horizontal signal line 42, and outputs the signals. For example, the output circuit 37 performs only buffering in some cases, and performs black level adjustment, column variation correction, various types of digital signal processing, and the like in some other cases. The input/output terminal 39 exchanges signals with the outside.

The thus-configured solid-state imaging element 11 is a CMOS image sensor called a column AD CMOS image sensor having a column signal processing circuit 35 that performs a CDS process and an AD conversion process, and is arranged for each pixel column.

<Circuit Configuration Examples of Pixels>

Figure 5:
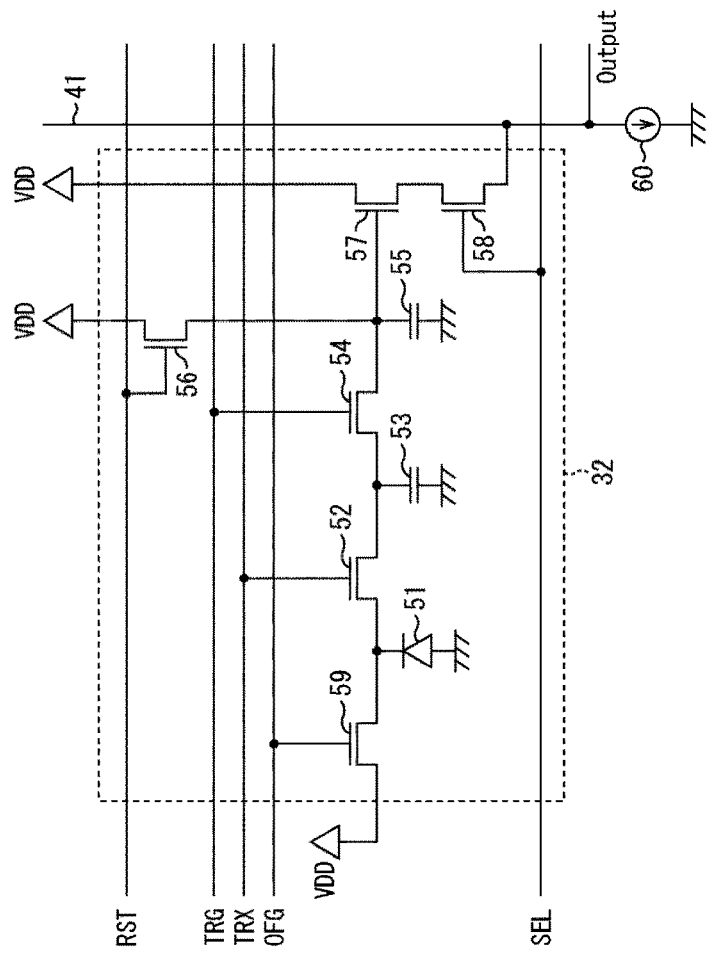
FIG. 5 is a figure depicting an equivalent circuit of a pixel.

FIG. 5 depicts an equivalent circuit of a pixel 32.

The pixel 32 depicted in FIG. 5 has a configuration that realizes an electronic global shutter function.

The pixel 32 has a photodiode 51 as a photoelectric converting element, a first transfer transistor 52, a memory section (MEM) 53, a second transfer transistor 54, an FD (floating diffusion region) 55, a reset transistor 56, an amplification transistor 57, a selection transistor 58, and a discharge transistor 59.

The photodiode 51 is a photoelectric converting section that generates electric charge (signal charge) according to a received light amount, and accumulates the electric charge. The photodiode 51 has an anode terminal which is grounded, and also a cathode terminal which is connected to the memory section 53 via the first transfer transistor 52. In addition, the cathode terminal of the photodiode 51 is connected also with the discharge transistor 59 for discharging unnecessary electric charge.

When the first transfer transistor 52 is turned on according to a transfer signal TRX, the first transfer transistor 52 reads out electric charge generated at the photodiode 51, and transfers the electric charge to the memory section 53. The memory section 53 is a charge retaining section that retains electric charge temporarily until the electric charge is transferred to the FD 55.

When the second transfer transistor 54 is turned on according to a transfer signal TRG, the second transfer transistor 54 reads out electric charge retained at the memory section 53, and transfers the electric charge to the FD 55.

The FD 55 is a charge retaining section that retains electric charge read out from the memory section 53 in order to read out the electric charge as a signal. When the reset transistor 56 is turned on according to a reset signal RST, the reset transistor 56 resets the potential of the FD 55 by discharging electric charge accumulated in the FD 55 to a constant voltage source VDD.

The amplification transistor 57 outputs a pixel signal according to the potential of the FD 55. That is, the amplification transistor 57 is included in a source follower circuit together with a load MOS 60 as a constant current source, and a pixel signal representing a level according to electric charge accumulated in the FD 55 is output from the amplification transistor 57 to the column signal processing circuit 35 (FIG. 4) via the selection transistor 58. The load MOS 60 is arranged in the column signal processing circuit 35, for example.

The selection transistor 58 is turned on when the pixel 32 is selected according to a selection signal SEL, and outputs a pixel signal of the pixel 32 to the column signal processing circuit 35 via the vertical signal line 41.

When the discharge transistor 59 is turned on according to a discharge signal OFG, the discharge transistor 59 discharges unnecessary electric charge accumulated in the photodiode 51 to the constant voltage source VDD.

The transfer signals TRX and TRG, the reset signal RST, the discharge signal OFG, and the selection signal SEL are supplied from the vertical drive circuit 34 via the pixel driving wire 40.

Operation of the pixels 32 is explained simply.

First, before the start of exposure, the discharge signal OFG at High level is supplied to the discharge transistors 59. Thereby, the discharge transistors 59 are turned on, electric charge accumulated in the photodiodes 51 is discharged to the constant voltage source VDD, and the photodiodes 51 of all the pixels are reset.

When the discharge transistors 59 are turned off according to the discharge signal OFG at Low level after the photodiodes 51 are reset, exposure is started in all the pixels in the pixel array section 33.

After an elapse of predetermined exposure time that has been determined in advance, the first transfer transistors 52 are turned on according to the transfer signal TRX in all the pixels in the pixel array section 33, and electric charge accumulated in the photodiodes 51 is transferred to the memory sections 53.

After the first transfer transistors 52 are turned off, the electric charge retained at the memory sections 53 of the pixels 32 is read out by the column signal processing circuits 35 sequentially one row after another row. In the read operation, the second transfer transistors 54 of pixels 32 in a row being read are turned on according to the transfer signal TRG, and the electric charge retained at the memory sections 53 is transferred to the FDs 55. Then, the selection transistors 58 are turned on according to the selection signal SEL. Thereby, signals representing levels according to the electric charge accumulated in the FDs 55 are output from the amplification transistors 57 to the column signal processing circuits 35 via the selection transistors 58.

As mentioned above, the pixels 32 having the pixel circuit in FIG. 5 are capable of global shutter operation (imaging) in which identical exposure time is set for all the pixels in the pixel array section 33, electric charge is temporarily retained in the memory sections 53 after the end of exposure, and the electric charge is read out from the memory sections 53 sequentially one row after another row.

Note that the circuit configuration of the pixels 32 is not limited to the configuration depicted in FIG. 5, and, for example, a circuit configuration that does not have a memory section 53 but performs generally-called rolling shutter operation can also be adopted.

<Basic Structure Examples of Solid-State Imaging Apparatus>

Figure 6:
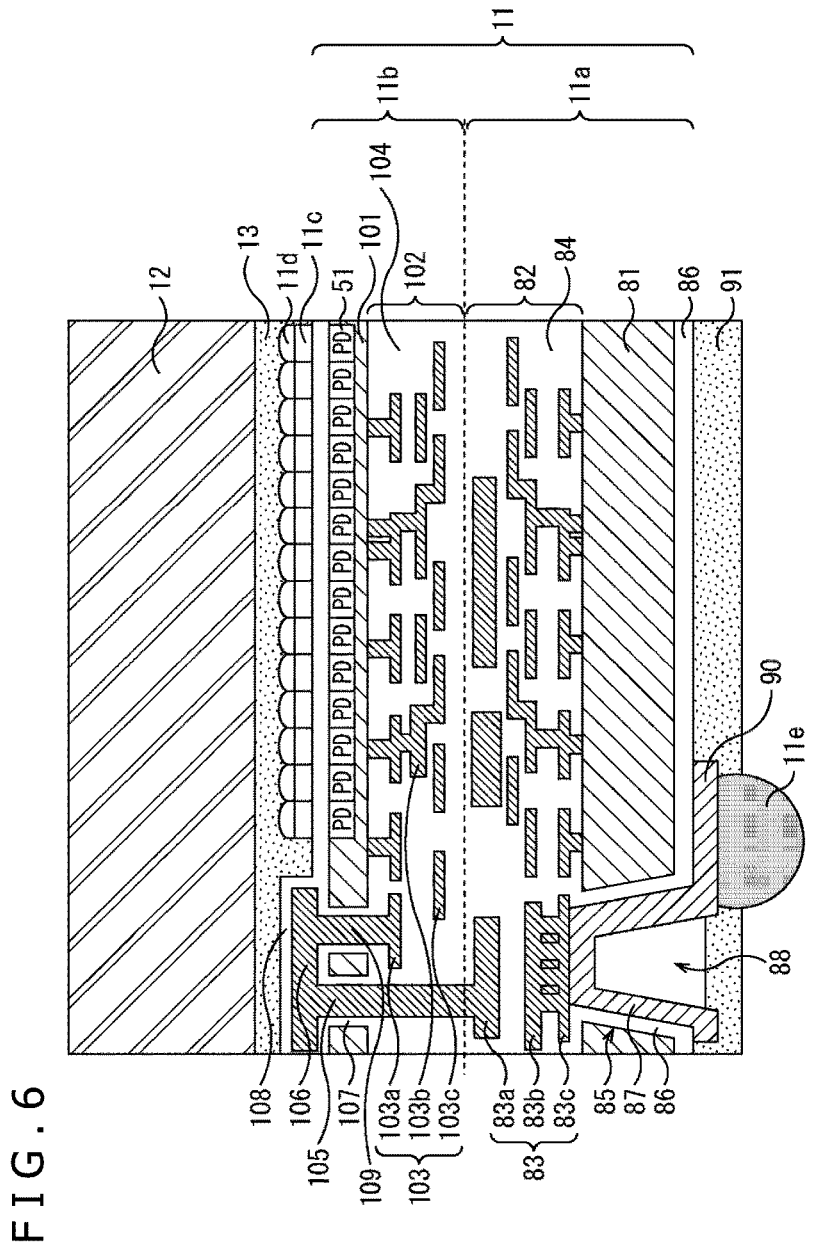
FIG. 6 is a figure depicting a specific structure of the stacked substrate.

Next, the specific structure of the solid-state imaging element 11 is explained with reference to FIG. 6. FIG. 6 is a cross-sectional view depicting an enlarged view of a portion of the solid-state imaging element 11.

In the logic board 11a, a multilayer wiring layer 82 is formed on the upper side (the pixel-sensor-substrate-11b side) of a semiconductor substrate 81 (referred to as a silicon substrate 81 below) including silicon (Si), for example. The control circuit 22 and the logic circuit 23 in FIGS. 3A and 3B are configured by the multilayer wiring layer 82.

The multilayer wiring layer 82 includes a plurality of wiring layers 83 including an uppermost wiring layer 83a closest to the pixel sensor substrate 11b, a middle wiring layer 83b, a lowermost wiring layer 83c closest to the silicon substrate 81, and the like, and interlayer dielectric films 84 formed between the wiring layers 83.

The plurality of wiring layers 83 are formed by using copper (Cu), aluminum (Al), tungsten (W), or the like, for example, and the interlayer dielectric films 84 include a silicon oxide film, a silicon nitride film, or the like, for example. All layers in each of the plurality of wiring layers 83 and the interlayer dielectric films 84 may include an identical material or may include two or more materials that are used differently between layers.

A silicon through hole 85 that penetrates the silicon substrate 81 is formed at a predetermined position of the silicon substrate 81. A connection conductor 87 is embedded via an insulating film 86 on the inner wall of the silicon through hole 85, and thereby a through silicon via (TSV) 88 is formed. The insulating film 86 can include an SiO2 film, an SiN film, or the like, for example.

Note that whereas the insulating film 86 and the connection conductor 87 are formed along the inner wall surface, and the inside of the silicon through hole 85 is a cavity in the through silicon via 88 depicted in FIG. 6, the whole of the inside of the silicon through hole 85 is filled with the connection conductor 87 in some cases depending on the internal diameter. Stated differently, it does not matter whether the inside of the through hole is filled with the conductor or part of the inside of the through hole is a cavity. The same is true also of a through chip via (TCV: Through Chip Via) 105 or the like mentioned later.

The connection conductor 87 of the through silicon via 88 is connected with a rewire 90 formed on the lower-surface side of the silicon substrate 81, and the rewire 90 is connected with a solder ball 11e. The connection conductor 87 and the rewire 90 can include copper (Cu), tungsten (W), tungsten (W), polysilicon, or the like, for example.

In addition, a solder mask (solder resist) 91 is formed to cover the rewire 90 and the insulating film 86 on the lower-surface side of the silicon substrate 81, except for a region where the solder ball 11e is formed.

On the other hand, in the pixel sensor substrate 11b, a multilayer wiring layer 102 is formed on the lower side (logic-board-11a side) of a semiconductor substrate 101 (referred to as a silicon substrate 101 below) including silicon (Si). The pixel circuits of the pixel region 21 in FIGS. 3A and 3B are configured by the multilayer wiring layer 102.

The multilayer wiring layer 102 includes a plurality of wiring layers 103 including an uppermost wiring layer 103a closest to the silicon substrate 101, a middle wiring layer 103b, a lowermost wiring layer 103c closest to the logic board 11a, and the like, and interlayer dielectric films 104 formed between the wiring layers 103.

The same types of material as the materials of the wiring layers 83 and the interlayer dielectric films 84 mentioned above can be adopted as materials to be used as the plurality of wiring layers 103 and the interlayer dielectric films 104. In addition, the plurality of wiring layers 103 and the interlayer dielectric films 104 are similar to the wiring layers 83 and the interlayer dielectric films 84 mentioned above in that one or two or more materials may be included and used differently.

Note that whereas the multilayer wiring layer 102 of the pixel sensor substrate 11b includes the wiring layers 103 including three layers, and the multilayer wiring layer 82 of the logic board 11a includes the wiring layers 83 including four layers in the example in FIG. 6, the total numbers of wiring layers are not limited to these, and any numbers of layers can be included in the multilayer wiring layer 102 of the pixel sensor substrate 11b and the multilayer wiring layer 82 of the logic board 11a.

In the silicon substrate 101, a photodiode 51 formed by a PN junction is formed for each pixel 32.

In addition, although not depicted, but omitted, the multilayer wiring layer 102 and the silicon substrate 101 have a plurality of pixel transistors such as the first transfer transistors 52 or the second transfer transistor 54, the memory sections (MEM) 53, and the like that are formed therein.

A through silicon via 109 connected with the wiring layer 103a of the pixel sensor substrate 11b, and the through chip via 105 connected with the wiring layer 83a of the logic board 11a are formed at predetermined positions of the silicon substrate 101 where the color filters 11c and the on-chip lenses 11d are not formed.

The through chip via 105 and the through silicon via 109 are connected by a connection wire 106 formed on the top surface of the silicon substrate 101. In addition, an insulating film 107 is formed between the silicon substrate 101 and each of the through silicon via 109 and the through chip via 105. Furthermore, the color filters 11c and the on-chip lenses 11d are formed on the top surface of the silicon substrate 101 via a flattening film (insulating film) 108.

As mentioned above, the solid-state imaging element 11 depicted in FIG. 2 has a stacked structure formed by pasting together the multilayer-wiring-layer-102 side of the logic board 11a and the multilayer-wiring-layer-82 side of the pixel sensor substrate 11b. In FIG. 6, surfaces on which the multilayer-wiring-layer-102 side of the logic board 11a and the multilayer-wiring-layer-82 side of the pixel sensor substrate 11b are pasted together are represented by a broken line.

In addition, in the solid-state imaging element 11 of the imaging apparatus 1, the wiring layers 103 of the pixel sensor substrate 11b and the wiring layers 83 of the logic board 11a are connected by two through vias which are the through silicon via 109 and the through chip via 105, and the wiring layers 83 of the logic board 11a and the solder ball (backside electrode) 11e are connected by the through silicon via 88 and the rewire 90. Thereby, the planar area size of the imaging apparatus 1 can be reduced to the utmost.

Furthermore, by adopting a cavity-less structure between the solid-state imaging element 11 and the glass substrate 12, and pasting together the solid-state imaging element 11 and the glass substrate 12 by using the adhesive 13, the height can also be reduced.

Accordingly, according to the imaging apparatus 1 depicted in FIG. 1, a semiconductor apparatus (semiconductor package) having a smaller size can be realized.

According to the configuration of the imaging apparatus 1 like the one above, the IRCF 14 is provided on the solid-state imaging element 11 and the glass substrate 12, and accordingly it becomes possible to reduce occurrence of flares and ghosts due to internal diffused reflection of light.

Figure 7:
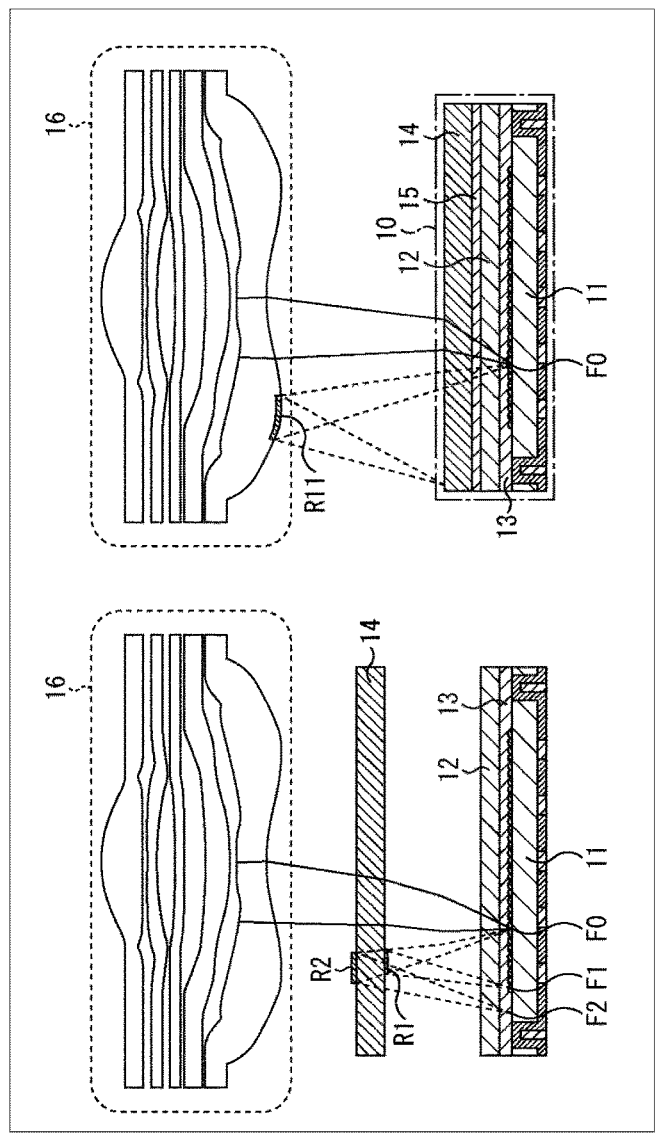
FIG. 7 is a figure for explaining that ghosts and flares resulting from internal diffused reflection do not occur in the imaging apparatus in FIG. 1.

That is, in a case where the IRCF 14 is configured to be spaced apart from the glass substrate (Glass) 12, and near a middle portion between the lens (Lens) 16 and the glass substrate 12 as depicted in the left portion in FIG. 7, incident light is condensed as represented by solid lines, enters the solid-state imaging element (CIS) 11 at a position F0 via the IRCF 14, the glass substrate 12, and the adhesive 13, and then is reflected at a the position F0, and generates reflection light as represented by dotted lines.

As represented by the dotted lines, for example, part of the reflection light reflected at the position F0 is reflected off of a backside (the surface on the lower side in FIG. 7) R1 of the IRCF 14 arranged at the position spaced apart from the glass substrate 12 via the adhesive 13 and the glass substrate 12, and enters again the solid-state imaging element 11 at a position F1 again via the glass substrate 12 and the adhesive 13.

In addition, as represented by the dotted lines, for example, other part of the reflection light reflected at the focal point F0 is transmitted through the adhesive 13 and the glass substrate 12, and the IRCF 14 arranged at the position spaced apart from the glass substrate 12, is reflected off of a top surface (the surface on the upper side in FIG. 7) R2 of the IRCF 14, and enters again the solid-state imaging element 11 at a position F2 via the IRCF 14, the glass substrate 12, and the adhesive 13.

The light that enters again at the positions F1 and F2 generates flares and ghosts resulting from internal diffused reflection. More specifically, as depicted in an image P1 in FIG. 8, when illumination L is captured as an image in the solid-state imaging element 11, the illumination L appears as flares and ghosts as represented by reflection light R21 and R22.

In contrast to this, if the IRCF 14 is configured on the glass substrate 12 as in the imaging apparatus 1 as depicted in the right portion in FIG. 7 corresponding to the configuration of the imaging apparatus 1 in FIG. 1, incident light represented by solid lines is condensed, enters the solid-state imaging element 11 at the position F0 via the IRCF 14, the adhesive 15, the glass substrate 12, and the adhesive 13, and then is reflected as represented by dotted lines. Then, the reflected light is reflected off of a surface R11 of a lowermost-layer lens on the lens group 16 via the adhesive 13, the glass substrate 12, the adhesive 15, and the IRCF 14, but is reflected within such an area that the solid-state imaging element 11 cannot receive the reflected light sufficiently because the lens group 16 is at a position that is sufficiently far from the IRCF 14.

Here, the solid-state imaging element 11, the glass substrate 12, and the IRCF 14 surrounded by a dash-dotted line in the figure are pasted together and integrated by using the adhesives 13 and 15 having substantially identical refractive indexes to be configured as the integrated configuration section 10. Because the integrated configuration section 10 has substantially identical refractive indexes, occurrence of internal diffused reflection at the boundary of layers having different refractive indexes is reduced, and, for example, occurrence of re-entrance at the positions F1 and F2 which are near the position F0 in the left portion in FIG. 7 is reduced.

Figure 8:
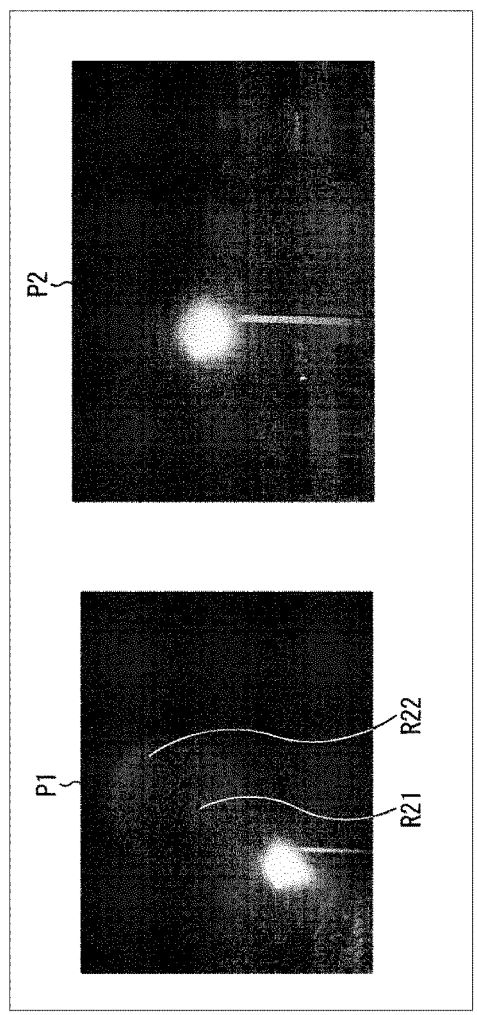
FIG. 8 is a figure for explaining that ghosts and flares resulting from internal diffused reflection do not occur in an image captured by the imaging apparatus in FIG. 1.

Thereby, in a case where the imaging apparatus 1 in FIG. 1 captures an image of the illumination L, the imaging apparatus 1 can capture an image in which occurrence of flares and ghosts resulting from internal diffused reflection like the reflection light R21 and R22 in the image P1 is reduced, as depicted in an image P2 in FIG. 8.

As a result, according to the configuration like the imaging apparatus 1 according to the first embodiment depicted in FIG. 1, a size reduction and a height reduction of the apparatus configuration can be realized, and also occurrence of flares and ghosts resulting from internal diffused reflection can be reduced.

Note that the image P1 in FIG. 8 is an image of the illumination L captured at night by the imaging apparatus 1 including the configuration in the left portion in FIG. 7, and the image P2 is an image of the illumination L captured at night by the imaging apparatus 1 (in FIG. 1) including the configuration in the right portion in FIG. 7.

In addition, whereas the configuration can realize auto focusing by moving the lens group 16 vertically in FIG. 1 by using the actuator 18 to thereby adjust the focal length according to the distance to a subject in the examples explained thus far, the actuator 18 may not be provided, and the lens group 16 may be lenses that function as a generally-called fixed focal length lens whose focal length cannot be adjusted.

2. Second Embodiment

Whereas the IRCF 14 is pasted onto the glass substrate 12 pasted on the imaging-surface side of the solid-state imaging element 11 in the example explained in the first embodiment, furthermore, a lowermost-layer lens included in the lens group 16 may be provided on the IRCF 14.

Figure 9:
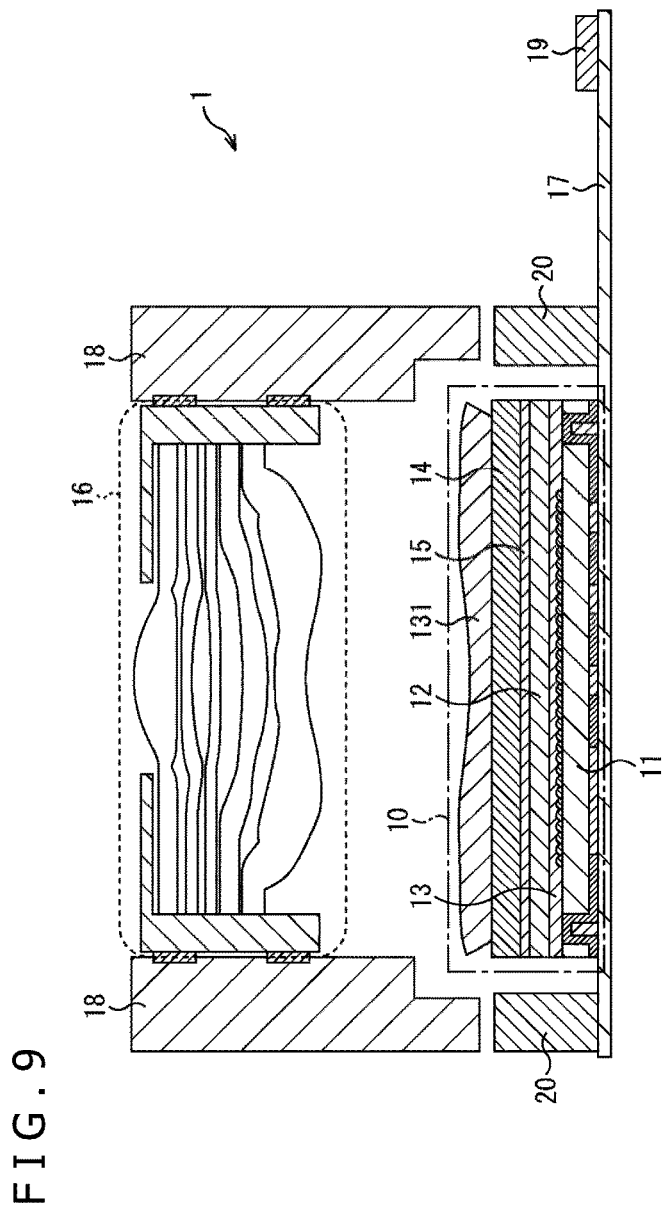
FIG. 9 is a figure for explaining a configuration example of a second embodiment of the imaging apparatus according to the present disclosure.

FIG. 9 depicts a configuration example of the imaging apparatus 1 in which the lowermost-layer lens, in terms of the direction of incidence of light, in the lens group 16 including a plurality of lenses included in the imaging apparatus 1 in FIG. 1 is configured on the IRCF 14 separately from the lens group 16. Note that configurations in FIG. 5 that have functions basically identical to configurations in FIG. 1 are given identical reference signs, and explanations thereof are omitted as appropriate.

That is, the imaging apparatus 1 in FIG. 9 is different from the imaging apparatus 1 in FIG. 1 in that furthermore a lowermost-layer lens 131, in terms of the direction of incidence of light, in the plurality of lenses included in the lens group 16 is further provided separately from the lens group 16 on the top surface of the IRCF 14 in the figure. Note that the lens group 16 in FIG. 9 is given the identical reference sign to the lens group 16 in FIG. 1 but is different from the lens group 16 in FIG. 1 strictly in not including the lowermost-layer lens 131 in terms of the direction of incidence of light.

According to the configuration of the imaging apparatus 1 as in FIG. 9, the IRCF 14 is provided on the glass substrate 12 provided on the solid-state imaging element 11, and furthermore the lowermost-layer lens 131 included in the lens group 16 is provided on the IRCF 14. Accordingly, it becomes possible to reduce occurrence of flares and ghosts due to internal diffused reflection of light.

Figure 10:
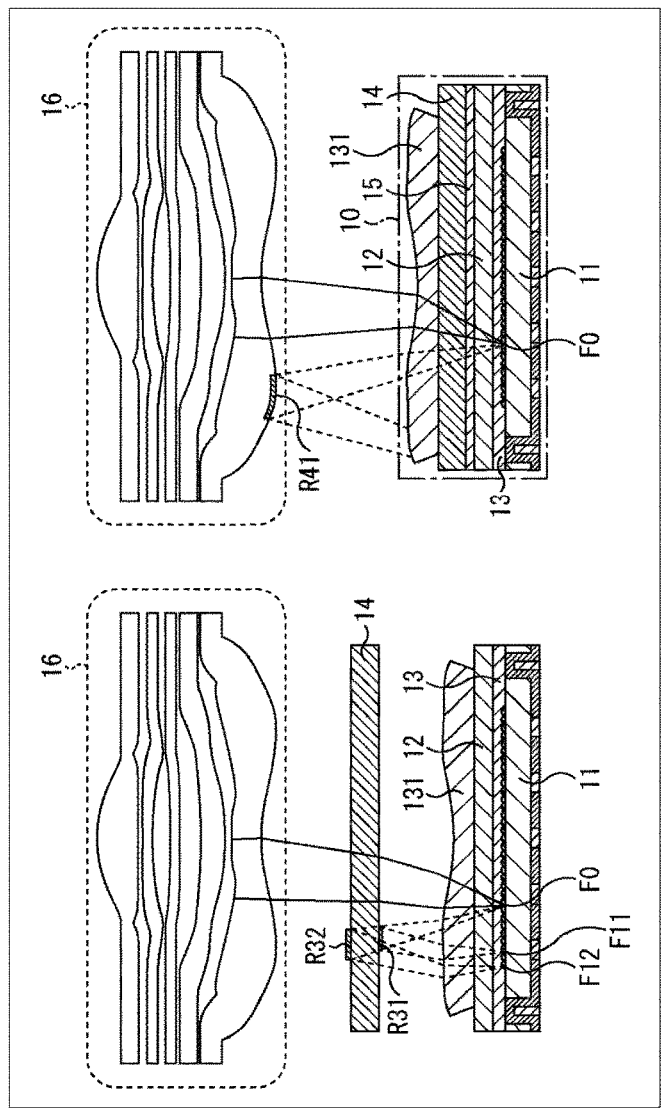
FIG. 10 is a figure for explaining that ghosts and flares resulting from internal diffused reflection do not occur in the imaging apparatus in FIG. 9.

That is, in a case where the lowermost-layer lens 131, in terms of the direction of incidence of light, of the lens group 16 is provided on the glass substrate 12, and the IRCF 14 is configured to be spaced apart from the lens 131 and near a middle portion between the lens group 16 and the lens 131 as depicted in the left portion in FIG. 10, incident light represented by solid lines is condensed, enters the solid-state imaging element 11 at the position F0 via the IRCF 14, the lens 131, the glass substrate 12, and the adhesive 13, and then is reflected at the position F0, and generates reflection light as represented by dotted lines.

As represented by the dotted lines, for example, part of the reflection light reflected at the position F0 is reflected off of a backside (the surface on the lower side in FIG. 2) R31 of the IRCF 14 arranged at the position spaced apart from the lens 131 via the adhesive 13, the glass substrate 12, and the lens 131, and enters again the solid-state imaging element 11 at a position F11 via the lens 131, the glass substrate 12, and the adhesive 13.

In addition, as represented by the dotted lines, for example, other part of the reflection light reflected at the focal point F0 is transmitted through the adhesive 13, the glass substrate 12, and the lens 131, and the IRCF 14 arranged at the position spaced apart from the lens 131, is reflected off of a top surface (the surface on the upper side in FIG. 7) R32 of the IRCF 14, and enters again the solid-state imaging element 11 at a position F12 via the IRCF 14, the lens 131, the glass substrate 12, and the adhesive 13.

The light that enters again at the positions F11 and F12 appear as flares and ghosts in the solid-state imaging element 11. In this regard, principles basically similar to the principles of generation of the reflection lights R21 of the illumination L in the image P1 explained with reference to FIG. 8 in a case where the reflection lights R21 re-enters at the positions F1 and F2 in FIG. 7 apply.

In contrast to this, similarly to the configuration in the imaging apparatus 1 in FIG. 9, if the lowermost-layer lens 131 in the lens group 16 is configured on the IRCF 14 as depicted in the right portion in FIG. 10, incident light is condensed as represented by solid lines, enters the solid-state imaging element 11 at the position F0 via the lens 131, the IRCF 14, the adhesive 15, the glass substrate 12, and the adhesive 13, and then is reflected, and generates reflection light as represented by dotted lines due to a surface R41 on the lens group 16 at a position which is sufficiently far via the adhesive 13, the glass substrate 12, the adhesive 15, the IRCF 14, and the lens 131, but occurrence of flares and ghosts can be reduced because the light is reflected within such an area that it is substantially impossible for the solid-state imaging element 11 to receive the light.

That is, because the solid-state imaging element 11, the adhesive 13, the glass substrate 12, and the IRCF 14 have an integrated configuration obtained by being pasted together by using the adhesives 13 and 15 having substantially identical refractive indexes, by having substantially identical refractive indexes, the integrated configuration section 10 which is the integrated configuration, and is surrounded by a dash-dotted line in the figure reduces occurrence of internal diffused reflection at the boundary between layers having different refractive indexes, and reduces entrance of reflection light and the like to the positions F11 and F12 near the position F0 as depicted in the left portion in FIG. 10, for example.

As a result, according to the configuration like the imaging apparatus 1 according to the second embodiment depicted in FIG. 10, a size reduction and a height reduction of the apparatus configuration can be realized, and also occurrence of flares and ghosts resulting from internal diffused reflection can be reduced.

3. Third Embodiment

Whereas the lowermost-layer lens 131 is provided on the IRCF 14 in the example explained in the second embodiment, the lowermost-layer lens 131 and the IRCF 14 may be pasted together by using an adhesive.

Figure 11:
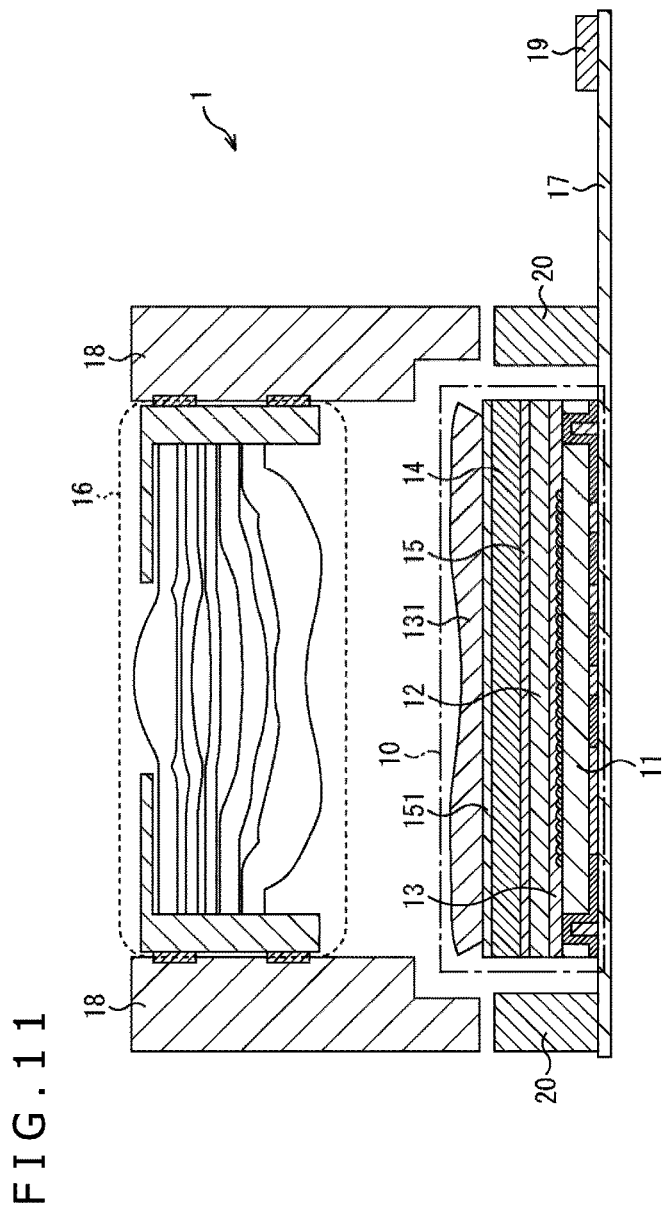
FIG. 11 is a figure for explaining a configuration example of a third embodiment of the imaging apparatus according to the present disclosure.

FIG. 11 depicts a configuration example of the imaging apparatus 1 in which the lowermost-layer lens 131 and the IRCF 14 are pasted together by using an adhesive. Note that configurations of the imaging apparatus 1 in FIG. 11 that have functions identical to configurations of the imaging apparatus 1 in FIG. 9 are given identical reference signs, and explanations thereof are omitted as appropriate.

That is, the imaging apparatus 1 in FIG. 11 is different from the imaging apparatus 1 in FIG. 9 in that the lowermost-layer lens 131 and the IRCF 14 are pasted together by using an adhesive 151 that is transparent, that is, has a substantially identical refractive index.

In the configuration like the imaging apparatus 1 in FIG. 11 also, it becomes possible to reduce occurrence of flares and ghosts similarly to the imaging apparatus 1 in FIG. 9.

In addition, in a case where the flatness of the lens 131 is not high, there is a fear that the IRCF 14 is misaligned with the optical axis of the lens 131 even if it is attempted to fix the lens 131 to the IRCF 14 without using the adhesive 151, however, by pasting together the lens 131 and the IRCF 14 by using the adhesive 151, it becomes possible to fix the lens 131 to the IRCF 14 such that the IRCF 14 is not misaligned with the optical axis of the lens 131 even if the flatness of the lens 131 is not high, and it becomes possible to reduce generation of distortions of an image that are caused by the misalignment of the optical axes.

4. Fourth Embodiment

Whereas the lowermost-layer lens 131 in terms of the direction of incidence of light is provided on the IRCF 14 in the example explained in the second embodiment, not only the lowermost-layer lens 131, but also a plurality of lens groups included in the lowermost layers of the lens group 16 may be provided on the IRCF 14.

Figure 12:
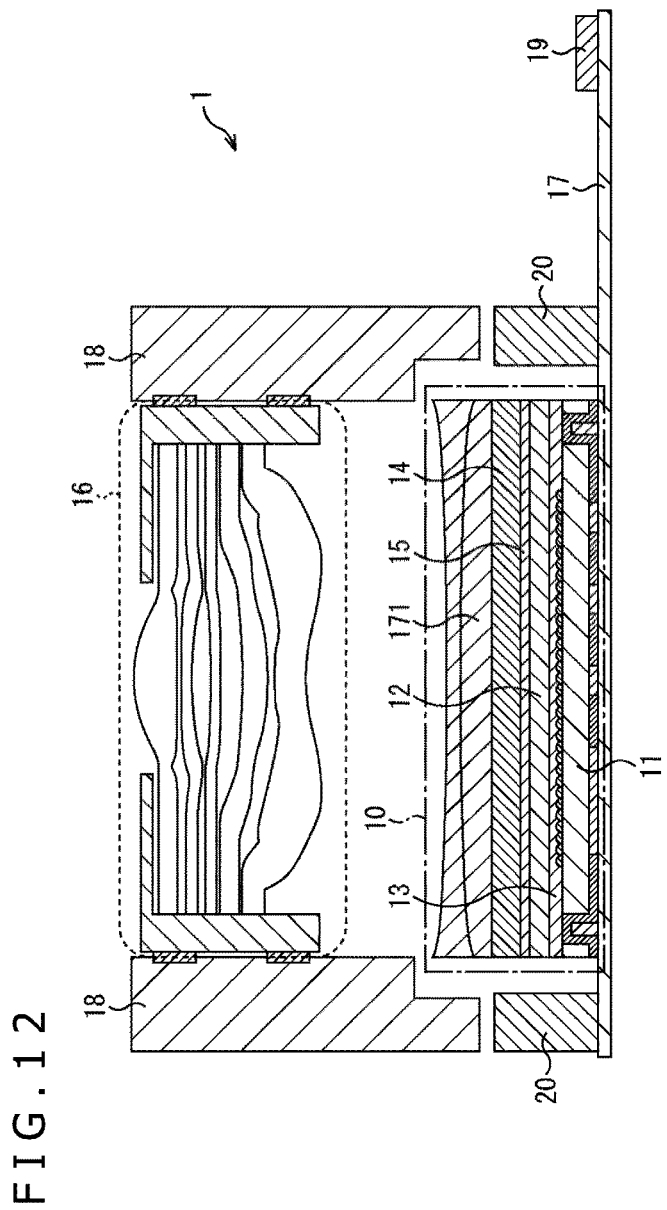
FIG. 12 is a figure for explaining a configuration example of a fourth embodiment of the imaging apparatus according to the present disclosure.

FIG. 12 depicts a configuration example of the imaging apparatus 1 in which a lens group including a plurality of lenses included in the lowermost layers, in terms of the direction of incidence, in the lens group 16 is configured on the IRCF 14. Note that configurations of the imaging apparatus 1 in FIG. 12 that have functions identical to configurations of the imaging apparatus 1 in FIG. 9 are given identical reference signs, and explanations thereof are omitted as appropriate.

That is, the imaging apparatus 1 in FIG. 12 is different from the imaging apparatus 1 in FIG. 9 in that, instead of the lens 131, a lens group 171 including a plurality of lenses included in the lowermost layers, in terms of the direction of incidence of light, in the lens group 16 is provided on the IRCF 14. Note that whereas FIG. 12 depicts an example about the lens group 171 including two lenses, the lens group 171 may include a larger number of lenses.

In such a configuration also, it becomes possible to reduce occurrence of flares and ghosts similarly to the imaging apparatus 1 in FIG. 9.

In addition, because the lens group 171 including the plurality of lenses included in the lowermost layers in the plurality of lenses included in the lens group 16 is configured on the IRCF 14, the number of lenses included in the lens group 16 can be reduced, and the weight of the lens group 16 can be reduced. Accordingly, it becomes possible to reduce the driving force amount of the actuator 18 used for auto focusing, and it becomes possible to realize a size reduction and an electrical power reduction of the actuator 18.

Note that instead of the lens group 171, the lens 131 in the imaging apparatus 1 in FIG. 11 according to the third embodiment may be pasted onto the IRCF 14 by using the transparent adhesive 151.

5. Fifth Embodiment

Whereas the glass substrate 12 is pasted onto the solid-state imaging element 11 by using the adhesive 13, and the IRCF 14 is pasted onto the glass substrate 12 by using the adhesive 15 in the example explained in the second embodiment, the glass substrate 12, the adhesive 15, and the IRCF 14 may be replaced with a configuration having combined functions including the function of the glass substrate 12 and the function of the IRCF 14, and the configuration may be pasted onto the solid-state imaging element 11 by using the adhesive 13.

Figure 13:
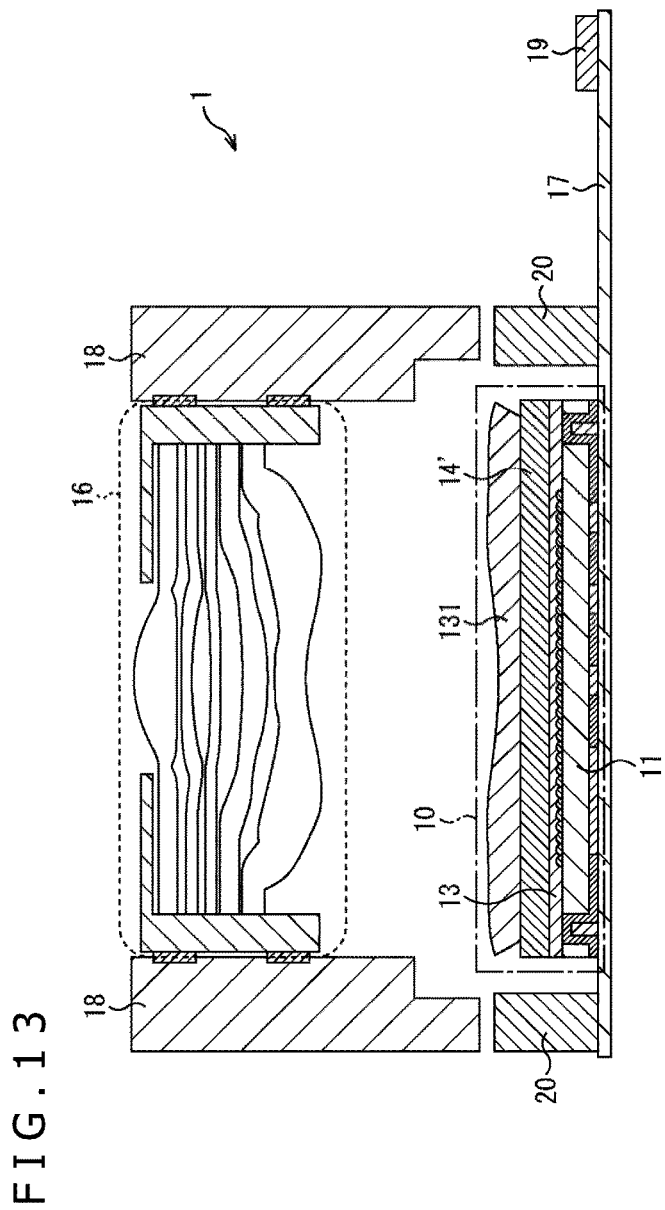
FIG. 13 is a figure for explaining a configuration example of a fifth embodiment of the imaging apparatus according to the present disclosure.

FIG. 13 depicts a configuration example of the imaging apparatus 1 in which the glass substrate 12, the adhesive 15, and the IRCF 14 are replaced with a configuration having combined functions including the function of the glass substrate 12 and the function of the IRCF 14, the configuration is pasted onto the solid-state imaging element 11 by using the adhesive 13, and the lowermost-layer lens 131 is provided on the configuration. Note that configurations of the imaging apparatus 1 in FIG. 13 that have functions identical to configurations of the imaging apparatus 1 in FIG. 9 are given identical reference signs, and explanations thereof are omitted as appropriate.

That is, the imaging apparatus 1 in FIG. 13 is different from the imaging apparatus 1 in FIG. 9 in that the glass substrate 12 and the IRCF 14 are replaced with an IRCF glass substrate 14' having the function of the glass substrate 12 and the function of the IRCF 14, the IRCF glass substrate 14' is pasted onto the solid-state imaging element 11 by using the adhesive 13, and furthermore the lowermost-layer lens 131 is provided on the IRCF 14'.

In such a configuration also, it becomes possible to reduce occurrence of flares and ghosts similarly to the imaging apparatus 1 in FIG. 9.

That is, currently, for a size reduction of the solid-state imaging element 11, in a structure referred to as the CSP (Chip Size Package) structure, the glass substrate 12 and the solid-state imaging element 11 are adhered to each other, the glass substrate is used as the base substrate, the solid-state imaging element 11 is processed into a thin element, and thereby it becomes possible to realize a small-sized solid-state imaging element. In FIG. 13, the IRCF glass substrate 14' realizes the function as the glass substrate 12 having high flatness in addition to the function of the IRCF 14, and thereby it becomes possible to realize a height reduction.

Note that the glass substrate 12, the adhesive 15, and the IRCF 14 in the imaging apparatus 1 in FIG. 1, FIG. 11 and FIG. 12 according to the first embodiment, the third embodiment, and the fourth embodiment may be replaced with the IRCF glass substrate 14' having the function of the glass substrate 12 and the function of the IRCF 14.

6. Sixth Embodiment

Whereas the glass substrate 12 is pasted onto the solid-state imaging element 11 having the CSP structure by using the adhesive 13, furthermore the IRCF 14 is pasted onto the glass substrate 12 by using the adhesive 15, and furthermore the lens group 171 including the plurality of lowermost-layer lenses in the plurality of lenses included in the lens group 16 is provided on the IRCF 14 in the example explained the fourth embodiment, the solid-state imaging element 11 having the COB (Chip on Board) structure may be used instead of the solid-state imaging element 11 having the CSP structure.

Figure 14:
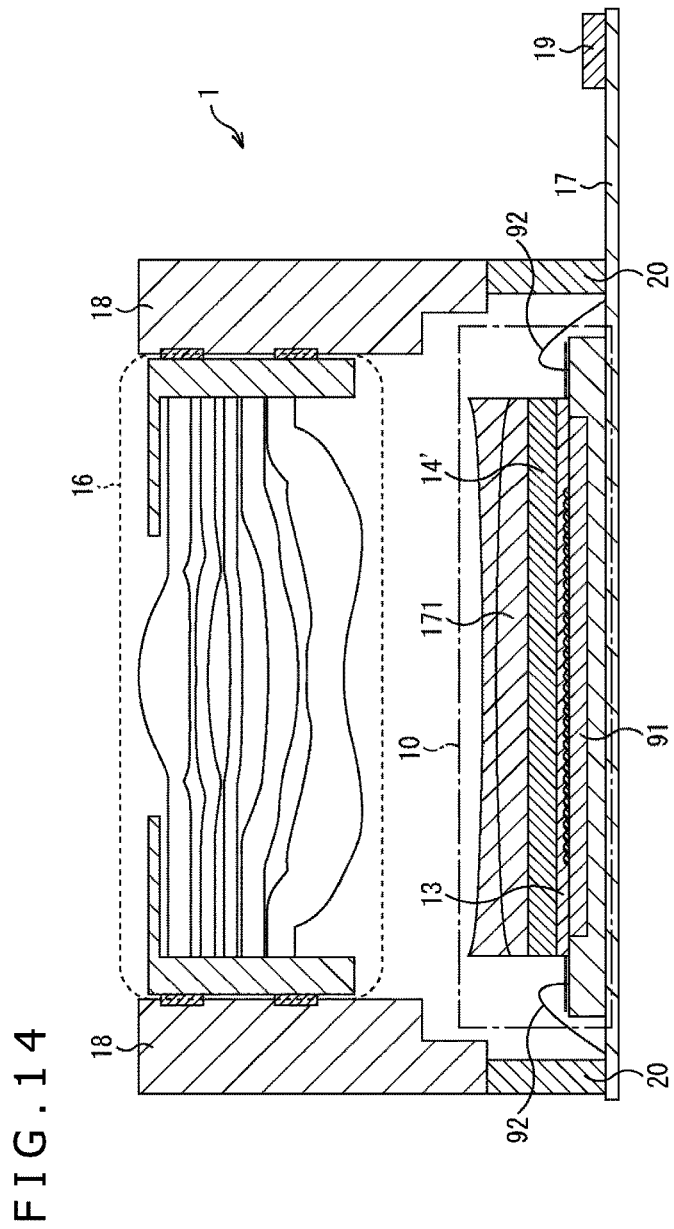
FIG. 14 is a figure for explaining a configuration example of a sixth embodiment of the imaging apparatus according to the present disclosure.

FIG. 14 depicts a configuration example in which the glass substrate 12 and the IRCF 14 in the imaging apparatus 1 in FIG. 12 are replaced with the IRCF glass substrate 14' having the function of the glass substrate 12 and the function of the IRCF 14, and also the solid-state imaging element 11 having the COB (Chip on Board) structure is used instead of the solid-state imaging element 11 having the CSP structure. Note that configurations of the imaging apparatus 1 in FIG. 14 that have functions identical to configurations of the imaging apparatus 1 in FIG. 12 are given identical reference signs, and explanations thereof are omitted as appropriate.

That is, the imaging apparatus 1 in FIG. 14 is different from the imaging apparatus 1 in FIG. 12 in that the glass substrate 12 and the IRCF 14 are replaced with the IRCF glass substrate 14' having the function of the glass substrate 12 and the function of the IRCF 14, and a solid-state imaging element 91 having the COB (Chip on Board) structure is used instead of the solid-state imaging element 11 having the CSP structure.

In such a configuration also, it becomes possible to reduce occurrence of flares and ghosts similarly to the imaging apparatus 1 in FIG. 12.

In addition, whereas the CSP structure is used typically for size reductions of the solid-state imaging element 11 along with size reductions of the imaging apparatus 1 in recent years, the CSP structure requires complicated processing such as pasting together with the glass substrate 12 or the IRCF glass substrate 14' or placement of wires for terminals of the solid-state imaging element 11 on the back side of the light reception surface, and so the costs increase as compared with the solid-state imaging element 11 having the COB structure. In view of this, not only the solid-state imaging element 11 having the CSP structure, the solid-state imaging element 91 having the COB structure connected with the circuit board 17 by a wire bond 92 or the like may be used.

Because, by using the solid-state imaging element 91 having the COB structure, it is possible to make it easy to connect the solid-state imaging element 91 to the circuit board 17, it becomes possible to simplify processing, and the costs can be reduced.

Note that the solid-state imaging element 11 having the CSP structure in the imaging apparatus 1 in FIG. 1, FIG. 9, FIG. 11, and FIG. 13 according to the first embodiment to the third embodiment and the fifth embodiment may be replaced with the solid-state imaging element 11 having the COB (Chip on Board) structure.

7. Seventh Embodiment

Whereas the glass substrate 12 is provided on the solid-state imaging element 11, and furthermore the IRCF 14 is provided on the glass substrate in the example explained in the second embodiment, the IRCF 14 may be provided on the solid-state imaging element 11, and furthermore the glass substrate 12 may be provided on the IRCF 14.

Figure 15:
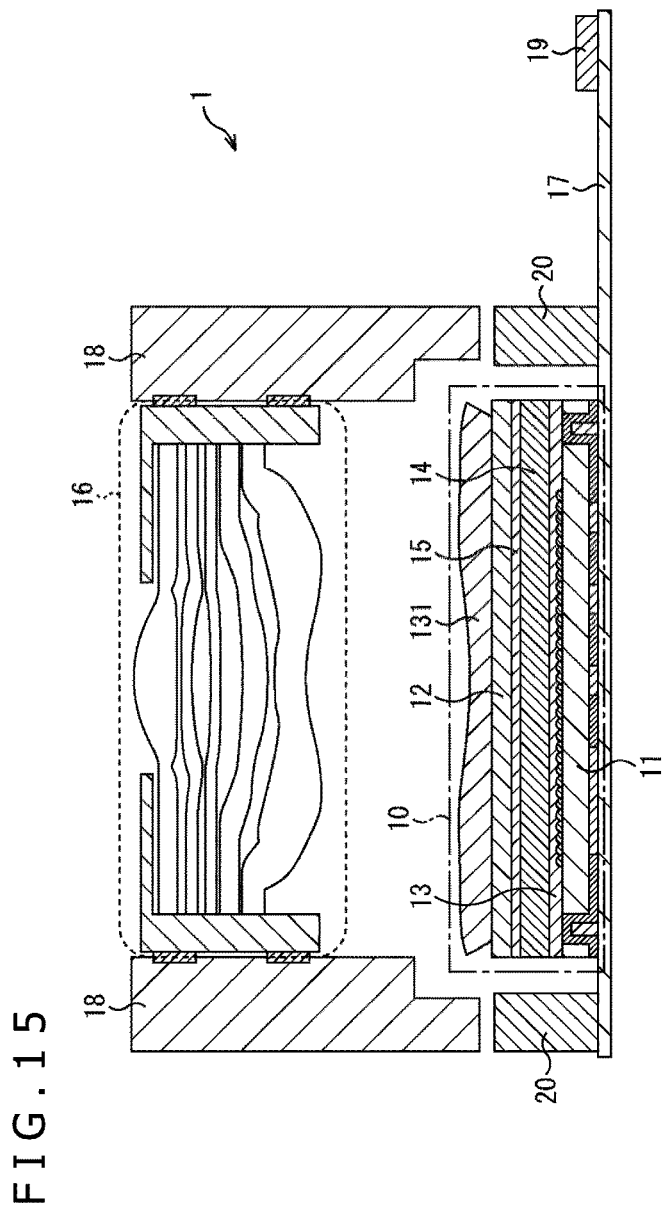
FIG. 15 is a figure for explaining a configuration example of a seventh embodiment of the imaging apparatus according to the present disclosure.

FIG. 15 depicts a configuration example of the imaging apparatus 1 in which the IRCF 14 is provided on the solid-state imaging element 11, and furthermore the glass substrate 12 is provided on the IRCF 14 in a case where the glass substrate 12 is used.

The imaging apparatus 1 in FIG. 15 is different from the imaging apparatus 1 in FIG. 9 in that the glass substrate 12 and the IRCF 14 are replaced with each other, the IRCF 14 is pasted onto the solid-state imaging element 11 by using the transparent adhesive 13, furthermore the glass substrate 12 is pasted onto the IRCF 14 by using the transparent adhesive 15, and the lens 131 is provided on the glass substrate 12.

In such a configuration also, it becomes possible to reduce occurrence of flares and ghosts similarly to the imaging apparatus 1 in FIG. 9.

In addition, the IRCF 14 typically has low flatness due to the influence of temperatures or external disturbances characteristically, and there is a fear that the IRCF 14 causes distortions in an image on the solid-state imaging element 11.

In view of this, measures are typically taken by adopting a special material that maintains flatness by coating of a coating material or the like on both surfaces of the IRCF 14, and so on, and this increases the costs.

In contrast to this, the IRCF 14 having low flatness is sandwiched by the solid-state imaging element 11 and the glass substrate 12 having high flatness in the imaging apparatus 1 in FIG. 15, thereby it becomes possible to ensure the flatness at low costs, and it becomes possible to reduce distortions of an image.

Accordingly, according to the imaging apparatus 1 in FIG. 15, it becomes possible to reduce occurrence of flares and ghosts, and also it becomes possible to reduce distortions of an image caused by the characteristics of the IRCF 14. In addition, because a coating including a special material to maintain the flatness becomes unnecessary, it becomes possible to reduce the costs.

Note that the glass substrate 12 and the IRCF 14 may be replaced with each other, and pasted by using the adhesives 13 and 15 also in the imaging apparatus 1 in FIG. 1, FIG. 11, and FIG. 12 according to the first embodiment, the third embodiment, and the fourth embodiment.

8. Eighth Embodiment

Whereas the IRCF 14 is used as a configuration to cut infrared light in the example explained in the first embodiment, a configuration other than the IRCF 14 may be used as long as the configuration is capable of cutting infrared light, and, for example, an infrared cut resin may be used for coating, instead of the IRCF 14.

Figure 16:
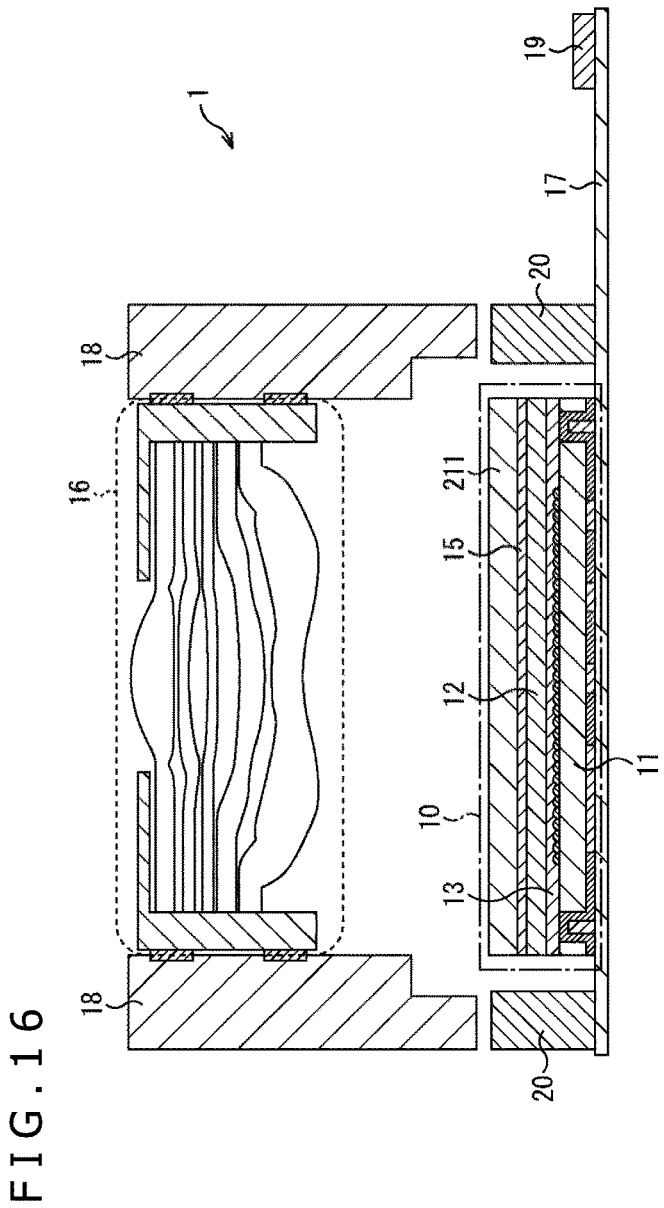
FIG. 16 is a figure for explaining a configuration example of an eighth embodiment of the imaging apparatus according to the present disclosure.

FIG. 16 is a configuration example of the imaging apparatus 1 in which an infrared cut resin is used instead of the IRCF 14. Note that configurations of the imaging apparatus 1 in FIG. 16 that have functions identical to the imaging apparatus 1 in FIG. 1 are given identical reference signs, and explanations thereof are omitted as appropriate.

That is, the imaging apparatus 1 in FIG. 16 is different from the imaging apparatus 1 in FIG. 1 in that an infrared cut resin 211 is provided instead of the IRCF 14. The infrared cut resin 211 is provided by coating, for example.

In such a configuration also, it becomes possible to reduce occurrence of flares and ghosts similarly to the imaging apparatus 1 in FIG. 1.

In addition, ones having infrared cut effects are used typically as a result of further improvements of resins in recent years, and it has been known that the glass substrate 12 can be coated with the infrared cut resin 211 at the time of production of the CSP solid-state imaging element 11.

Note that the infrared cut resin 211 may be used instead of the IRCF 14 in the imaging apparatus 1 in FIG. 9, FIG. 11, FIG. 12, and FIG. 15 according to the second embodiment to the fourth embodiment and the seventh embodiment.

9. Ninth Embodiment

Whereas the glass substrate 12 which is a flat plate is provided on the solid-state imaging element 11 in an adhered state that there are no cavities or the like therebetween in a case where the glass substrate 12 is used in the example explained in the second embodiment, a cavity may be provided between the glass substrate 12 and the solid-state imaging element 11.

Figure 17:
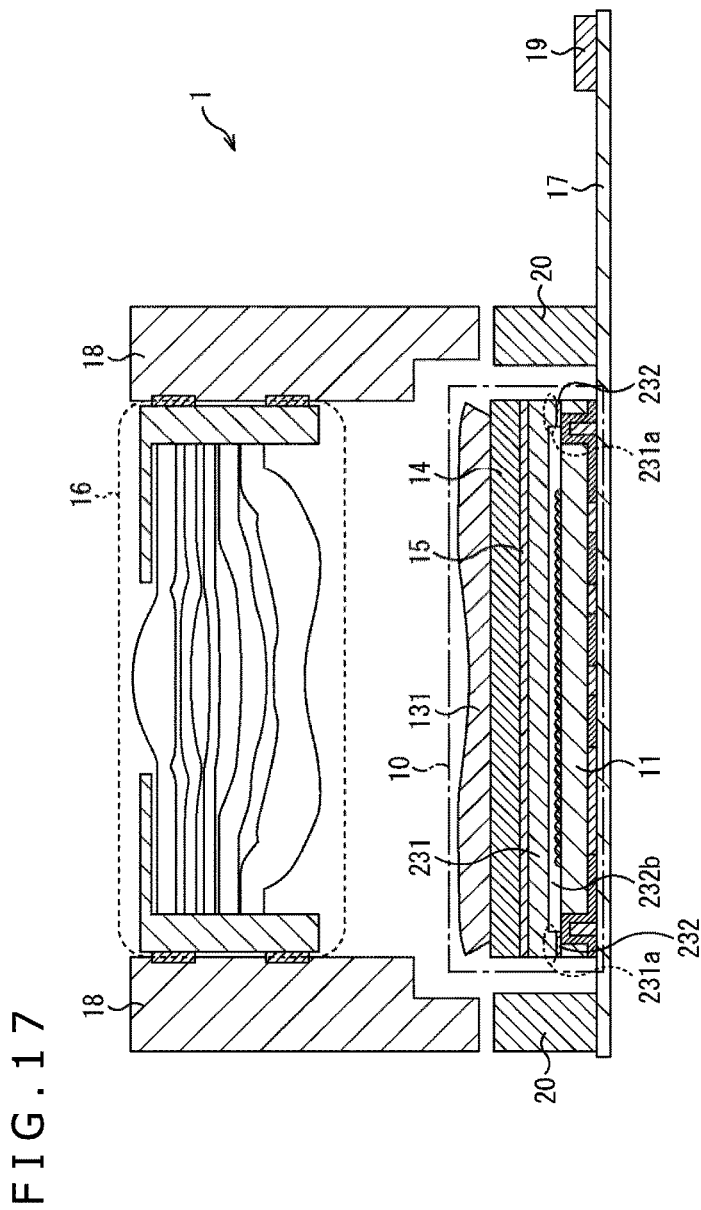
FIG. 17 is a figure for explaining a configuration example of a ninth embodiment of the imaging apparatus according to the present disclosure.

FIG. 17 depicts a configuration example of the imaging apparatus 1 in which a cavity is provided between the glass substrate 12 and the solid-state imaging element 11. Configurations of the imaging apparatus 1 in FIG. 17 that have functions identical to configurations of the imaging apparatus 1 in FIG. 9 are given identical reference signs, and explanations thereof are omitted as appropriate.

That is, the imaging apparatus 1 in FIG. 17 is different from the imaging apparatus in FIG. 9 in that a glass substrate 231 including a convexity 231a on its circumference is provided instead of the glass substrate 12. The convexity 231a at the circumference abuts against the solid-state imaging element 11, and the convexity 231a is adhered onto the solid-state imaging element 11 by using a transparent adhesive 232. Thereby, a cavity 231b including an air layer is formed between the glass substrate 231 and the imaging surface of the solid-state imaging element 11.

In such a configuration also, it becomes possible to reduce occurrence of flares and ghosts similarly to the imaging apparatus 1 in FIG. 9.

Note that the glass substrate 231 may be used instead of the glass substrate 12 in the imaging apparatus 1 in FIG. 1, FIG. 11, FIG. 12, and FIG. 16 according to the first embodiment, the third embodiment, the fourth embodiment, and the eighth embodiment, and only the convexity 231a may be adhered by using the adhesive 232 to thereby form the cavity 231b.

10. Tenth Embodiment

Whereas the lowermost-layer lens 131 in the lens group 16 is configured on the IRCF 14 provided on the glass substrate 12 in the example in the second embodiment, a coating agent of an organic multilayer film having an infrared cut function may be included instead of the IRCF 14 on the glass substrate 12.

Figure 18:
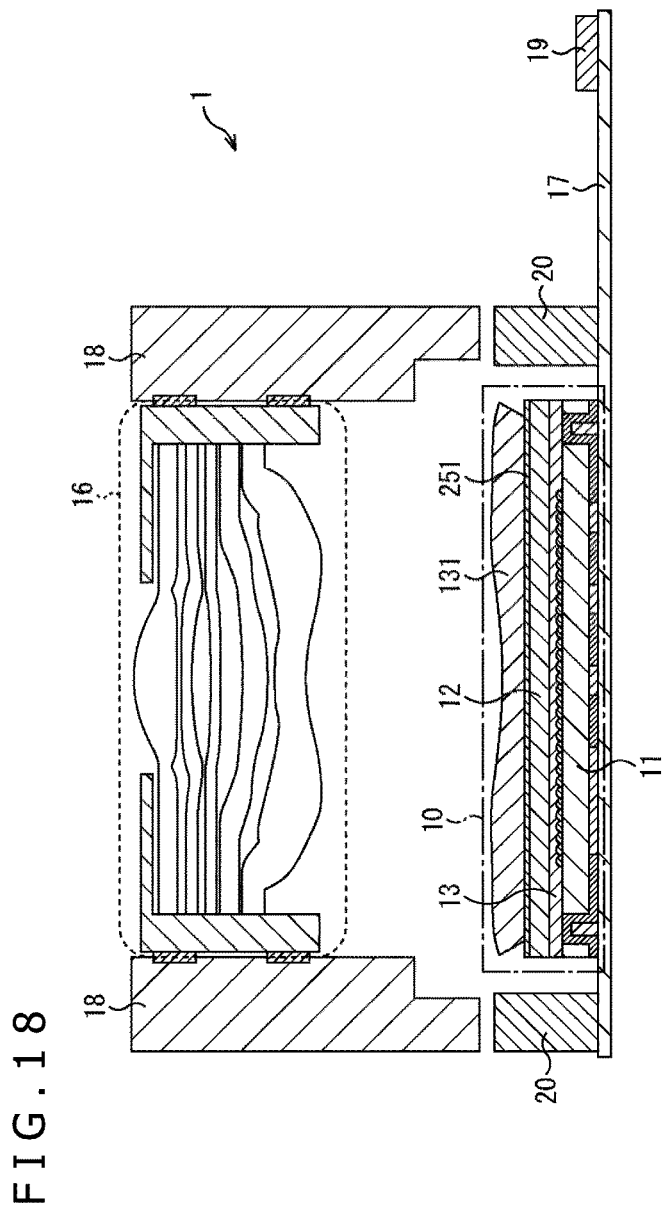
FIG. 18 is a figure for explaining a configuration example of a tenth embodiment of the imaging apparatus according to the present disclosure.

FIG. 18 depicts a configuration example of the imaging apparatus 1 including a coating agent of an organic multilayer film having an infrared cut function instead of the IRCF 14 on the glass substrate 12.

The imaging apparatus 1 in FIG. 18 is different from the imaging apparatus 1 in FIG. 9 in that a coating agent 251 of an organic multilayer film having an infrared cut function is included instead of the IRCF 14 on the glass substrate 12.

In such a configuration also, it becomes possible to reduce occurrence of flares and ghosts similarly to the imaging apparatus 1 in FIG. 9.

Note that the coating agent 251 of the organic multilayer film having the infrared cut function may be used instead of the IRCF 14 in the imaging apparatus 1 in FIG. 1, FIG. 6, FIG. 7, FIG. 10, and FIG. 12 according to the first embodiment, the third embodiment, the fourth embodiment, the seventh embodiment, and the ninth embodiment.

11. Eleventh Embodiment

Whereas the lowermost-layer lens 131 in the lens group 16 is included on the coating agent 251 of the organic multilayer film having the infrared cut function instead of the IRCF 14 on the glass substrate 12 in the example explained in the tenth embodiment, furthermore an AR (Anti Reflection) coat may be provided on the lens 131.

Figure 19:
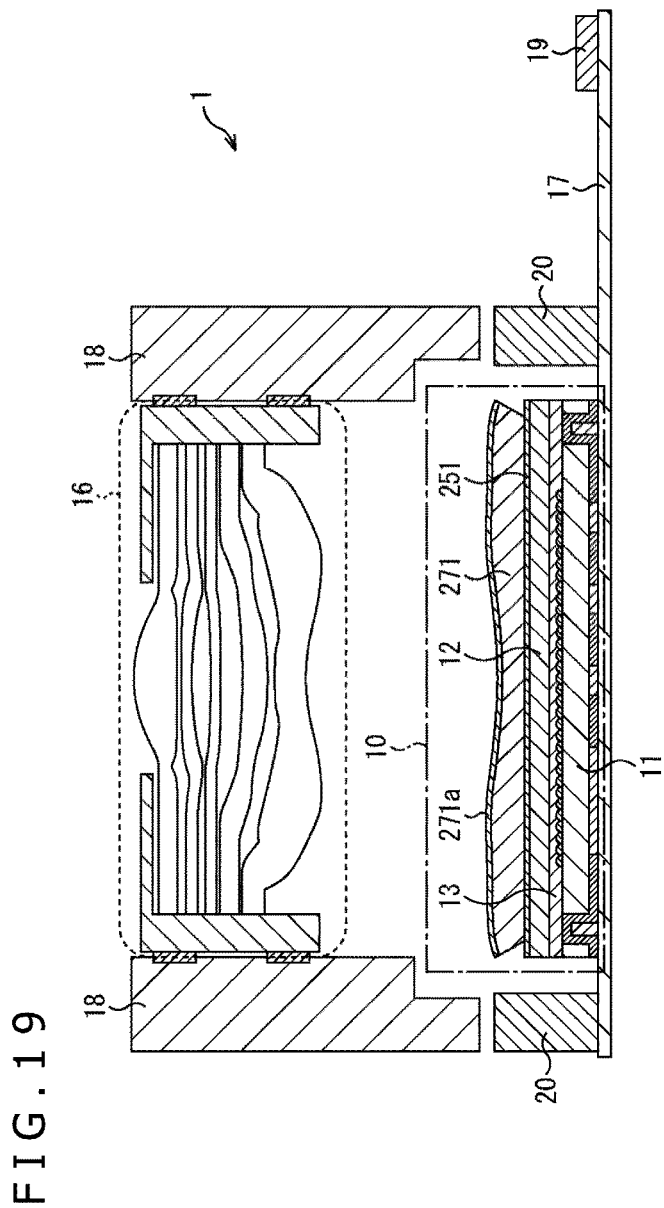
FIG. 19 is a figure for explaining a configuration example of an eleventh embodiment of the imaging apparatus according to the present disclosure.

FIG. 19 depicts a configuration example of the imaging apparatus 1 in which an AR coat is provided on the lens 131 in the imaging apparatus 1 in FIG. 13.

That is, the imaging apparatus 1 in FIG. 19 is different from the imaging apparatus 1 in FIG. 18 in that a lowermost-layer lens 271 that is included in the lens group 16, and provided with an AR coat 271a is provided instead of the lens 131. One that is formed, for example, by vacuum deposition, sputtering, WET coating, or the like can be adopted as the AR coat 271a.

In such a configuration also, it becomes possible to reduce occurrence of flares and ghosts similarly to the imaging apparatus 1 in FIG. 9.

In addition, because the AR coat 271a of the lens 271 reduces internal diffused reflection of reflection light from the solid-state imaging element 11, it becomes possible to reduce occurrence of flares and ghosts more reliably.

Note that the lens 271 provided with the AR coat 271a may be used instead of the lens 131 in the imaging apparatus 1 in FIG. 9, FIG. 11, FIG. 13, FIG. 15, FIG. 17, and FIG. 18 according to the second embodiment, the third embodiment, the fifth embodiment, the seventh embodiment, the ninth embodiment, and the tenth embodiment. In addition, an AR coat similar to the AR coat 271a may be provided on the surface (the uppermost surface in the figures) of the lens group 171 in the imaging apparatus 1 in FIG. 12 and FIG. 14 according to the fourth embodiment and the sixth embodiment.

It is desirable if the AR coat 271a is a single layer film or a multilayer structure film of the following films. That is, the AR coat 271a is, for example, a transparent silicon resin, an acrylic resin, an epoxy resin, a resin such as a styrene resin, an insulating film (e.g. SiCH, SiCOH, and SiCNH) including Si (silicon), C (carbon), and H (hydrogen) as its principal components, an insulating film (e.g. SiON and SiN) including Si (silicon) and N (nitrogen) as its principal components, an SiO2 film formed by using an oxidant and a material gas which is at least any of silicon hydroxide, alkylsilane, alkoxysilane, polysiloxane, or the like, a P—SiO film, an HDP-SiO film, or the like.

12. Twelfth Embodiment

Whereas the lens 271 provided with the AR (Anti Reflection) coat 271a is used instead of the lens 131 in the example explained in the eleventh embodiment, a configuration other than an AR coat may be adopted as long as an anti-reflection function can be realized, and, for example, a moss eye structure which is a minute concave and convex structure that prevents reflection may be adopted.

Figure 20:
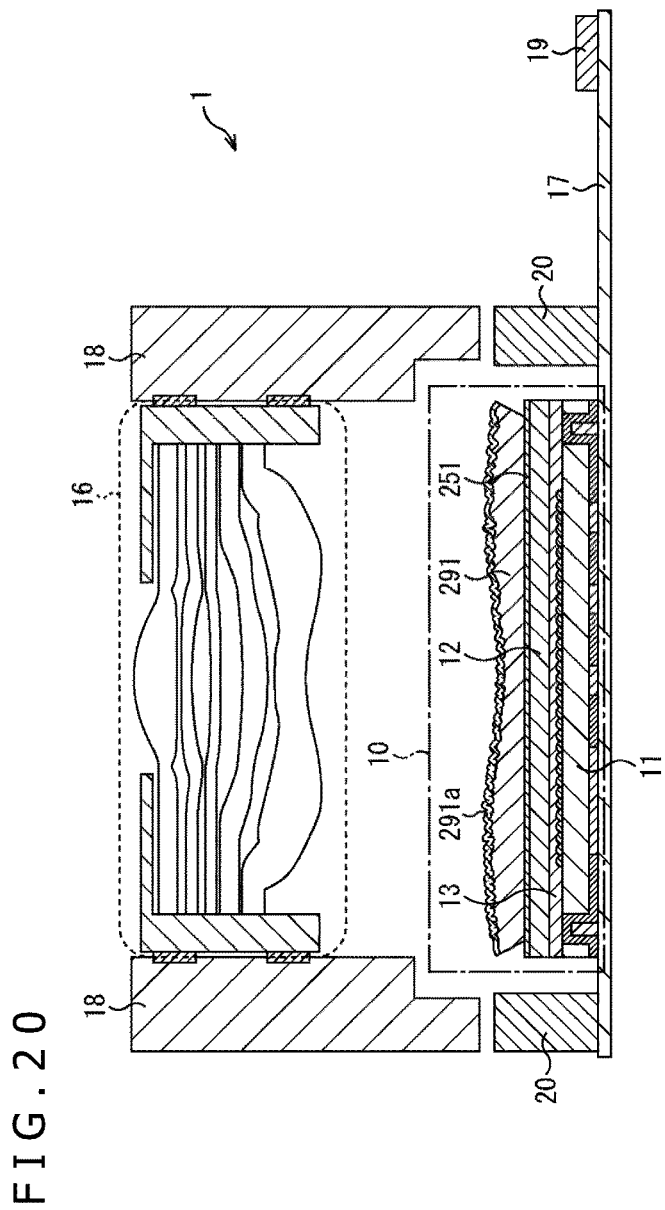
FIG. 20 is a figure for explaining a configuration example of a twelfth embodiment of the imaging apparatus according to the present disclosure.

FIG. 20 depicts a configuration example of the imaging apparatus 1 in which a lens 291 provided with an anti-reflection function realized by a moss eye structure is provided instead of the lens 131 in the imaging apparatus 1 in FIG. 19.

That is, the imaging apparatus 1 in FIG. 20 is different from the imaging apparatus 1 in FIG. 18 in that a lowermost-layer lens 291 that is included in the lens group 16, and provided with an anti-reflection treatment section 291a having been subjected to a process for forming a moss eye structure is provided instead of the lens 131.

In such a configuration also, it becomes possible to reduce occurrence of flares and ghosts similarly to the imaging apparatus 1 in FIG. 18.

In addition, because the lens 291 is provided with the anti-reflection treatment section 291a having been subjected to the process for forming the moss eye structure, and reduces internal diffused reflection of reflection light from the solid-state imaging element 11, it becomes possible to reduce occurrence of flares and ghosts more reliably. Note that the anti-reflection treatment section 291a may be one that has been subjected to an anti-reflection treatment other than the process for forming the moss eye structure as long as an anti-reflection function can be realized.

It is desirable if the anti-reflection treatment section 291a is a single layer film or a multilayer structure film of the following films. That is, the anti-reflection treatment section 291a is, for example, a transparent silicon resin, an acrylic resin, an epoxy resin, a resin such as a styrene resin, an insulating film (e.g. SiCH, SiCOH, and SiCNH) including Si (silicon), C (carbon), and H (hydrogen) as its principal components, an insulating film (e.g. SiON and SiN) including Si (silicon) and N (nitrogen) as its principal components, an SiO2 film formed by using an oxidant and a material gas which is at least any of silicon hydroxide, alkylsilane, alkoxysilane, polysiloxane or the like, a P—SiO film, an HDP-SiO film, or the like.

Note that the lens 291 provided with the anti-reflection treatment section 291a may be used instead of the lens 131 in the imaging apparatus 1 in FIG. 9, FIG. 11, FIG. 13, FIG. 15, FIG. 17, and FIG. 18 according to the second embodiment, the third embodiment, the fifth embodiment, the seventh embodiment, the ninth embodiment, and the tenth embodiment. In addition, an anti-reflection treatment similar to the treatment for forming the anti-reflection treatment section 291a may be performed on a surface of the lens group 171 in the imaging apparatus 1 in FIG. 12 and FIG. 14 according to the fourth embodiment and the sixth embodiment.

13. Thirteenth Embodiment

Whereas the lowermost-layer lens 131 in the lens group 16 is provided on the IRCF 14 in the example explained in the fourth embodiment, a configuration having an infrared cut function and a function similar to the function of the lowermost-layer lens 131 may replace the lowermost-layer lens 131.

Figure 21:
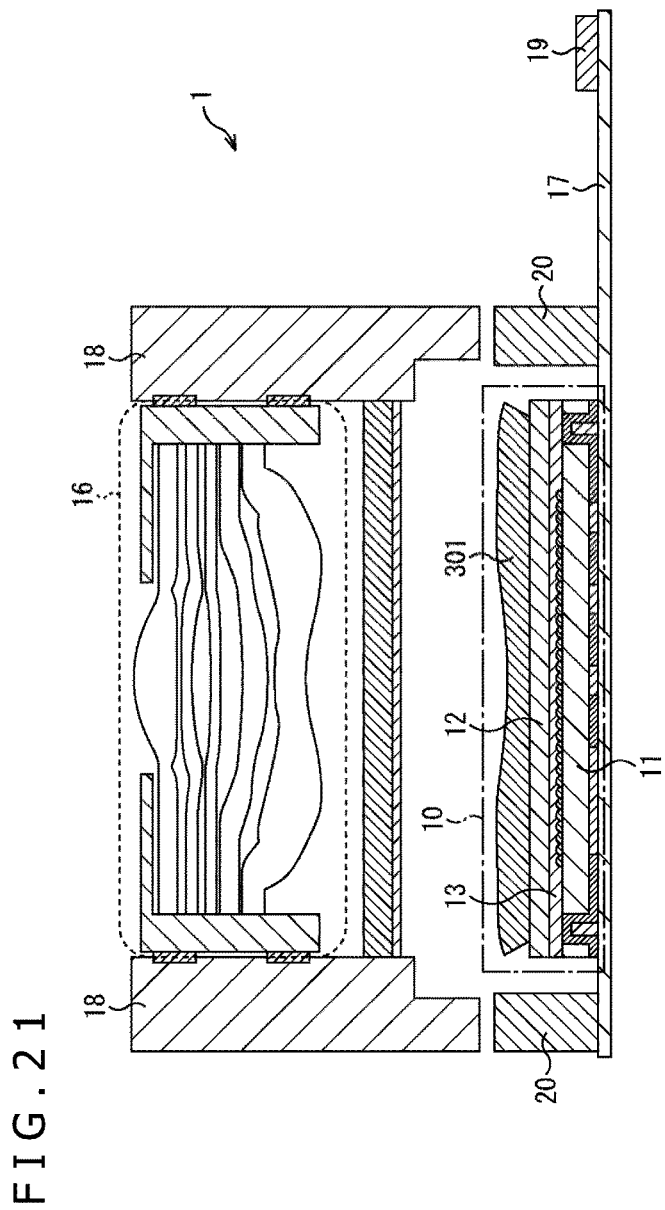
FIG. 21 is a figure for explaining a configuration example of a thirteenth embodiment of the imaging apparatus according to the present disclosure.

FIG. 21 depicts a configuration example of the imaging apparatus 1 in which an infrared cut lens having an infrared cut function and a function similar to the function of the lowermost-layer lens in the lens group 16 is provided instead of the IRCF 14 and the lowermost-layer lens 131 in the lens group 16 in the imaging apparatus 1 in FIG. 9.

That is, the imaging apparatus 1 in FIG. 21 is different from the imaging apparatus 1 in FIG. 9 in that an infrared cut lens 301 provided with an infrared cut function is provided instead of the IRCF 14 and the lowermost-layer lens 131 in the lens group 16.

In such a configuration also, it becomes possible to reduce occurrence of flares and ghosts similarly to the imaging apparatus 1 in FIG. 9.

In addition, because the infrared cut lens 301 is a configuration having combined functions including the infrared cut function and the function as the lowermost-layer lens 131 in the lens group 16, it is not necessary to separately provide the IRCF 14 and the lens 131, and so it becomes possible to further reduce the size and height of the apparatus configuration of the imaging apparatus 1. In addition, an infrared cut lens having combined functions including an infrared cut function and the function as the lens group 171 including a plurality of lenses in the lowermost-layers in the lens group 16 may replace the lens group 171 and the IRCF 14 in the imaging apparatus 1 in FIG. 12 according to the fourth embodiment.

14. Fourteenth Embodiment

It is known that stray light easily gets in from the side rim section of the light reception surface of the solid-state imaging element 11. In view of this, occurrence of flares and ghosts may be reduced by providing a black mask at the side rim section of the light reception surface of the solid-state imaging element 11, and reducing entrance of stray light.

Figure 22:
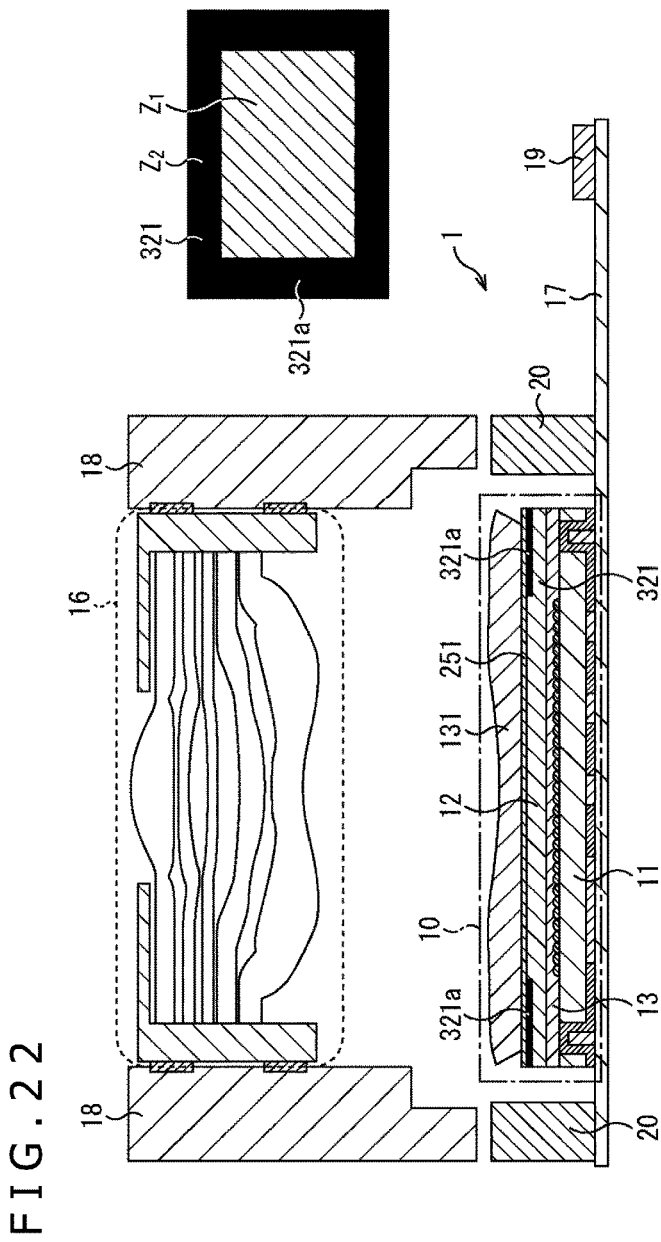
FIG. 22 is a figure for explaining a configuration example of a fourteenth embodiment of the imaging apparatus according to the present disclosure.

The left portion in FIG. 22 depicts a configuration example of the imaging apparatus 1 in which a glass substrate 321 provided with a black mask 321a that blocks light at the side rim section of the light reception surface of the solid-state imaging element 11 is provided instead of the glass substrate 12 in the imaging apparatus 1 in FIG. 18.

That is, the imaging apparatus 1 in the left portion in FIG. 22 is different from the imaging apparatus 1 in FIG. 18 in that, instead of the glass substrate 12, the glass substrate 321 provided with the black mask 321a including a light blocking film is provided at a side rim section Z2 as depicted in the right portion in FIG. 22. The black mask 321a is provided to the glass substrate 321 by photolithography or the like. Note that a black mask is not provided to a central section Z1 of the glass substrate 321 in the right portion in FIG. 22.

In such a configuration also, it becomes possible to reduce occurrence of flares and ghosts similarly to the imaging apparatus 1 in FIG. 9.

In addition, because the glass substrate 321 is provided with the black mask 321*a* at the side rim section Z2, it is possible to reduce entrance of stray light from the side rim section, and it becomes possible to reduce occurrence of flares and ghosts resulting from stray light.

Note that the black mask 321*a* may be provided not only to the glass substrate 321, but to another configuration as long as it is possible to prevent entrance of stray light to the solid-state imaging element 11. For example, the black mask 321*a* may be provided to the lens 131 or the coating agent 251 of the organic multilayer film having the infrared cut function or may be provided to the IRCF 14, the IRCF glass substrate 14', the glass substrate 231, the lens group 171, the lens 271 or 291, the infrared cut resin 211, the infrared cut lens 301, or the like. Note that in a case where, at this time, the flatness of the surface is low, and it is not possible to provide a black mask by photolithography, for example, a black mask may be provided to the surface having low flatness by inkjet.

As mentioned above, according to the present disclosure, it becomes possible to reduce flares and ghosts resulting from internal diffused reflection of light from the solid-state imaging element that accompanies a size reduction, and also it becomes possible to realize a larger pixel count, a higher image quality, and a size reduction without deteriorating the performance of the imaging apparatus.

15. Fifteenth Embodiment

In the examples explained thus far, the lens 131, 271, or 291, the lens group 171, or the infrared cut lens 301 is joined on the rectangular solid-state imaging element 11 by adhesion, pasting, or the like.

However, if any of the rectangular lenses 131, 271, and 291, the lens group 171, and the infrared cut lens 301 is adhered or pasted onto the solid-state imaging element 11 having substantially the same size, portions near angled sections peel off more easily, incident light does not enter the solid-state imaging element 11 appropriately due to peeling of the angled sections of the lens 131, and there is a fear that flares and ghosts occur.

In view of this, in a case where any of the rectangular lenses 131, 271, and 291, the lens group 171, and the infrared cut lens 301 is adhered or pasted onto the solid-state imaging element 11, the outline dimension may be set smaller than the outline dimension of the solid-state imaging element 11, furthermore an effective region may be set near the center of the lens, and also a non-effective region may be set at the outer circumferential section. Thereby, the likelihood that the rectangular lens 131, 271 or 291, the lens group 171, or the infrared cut lens 301 peels off may be reduced or it may be made possible to condense incident light effectively even if the end section peels off slightly.

Figure 23:
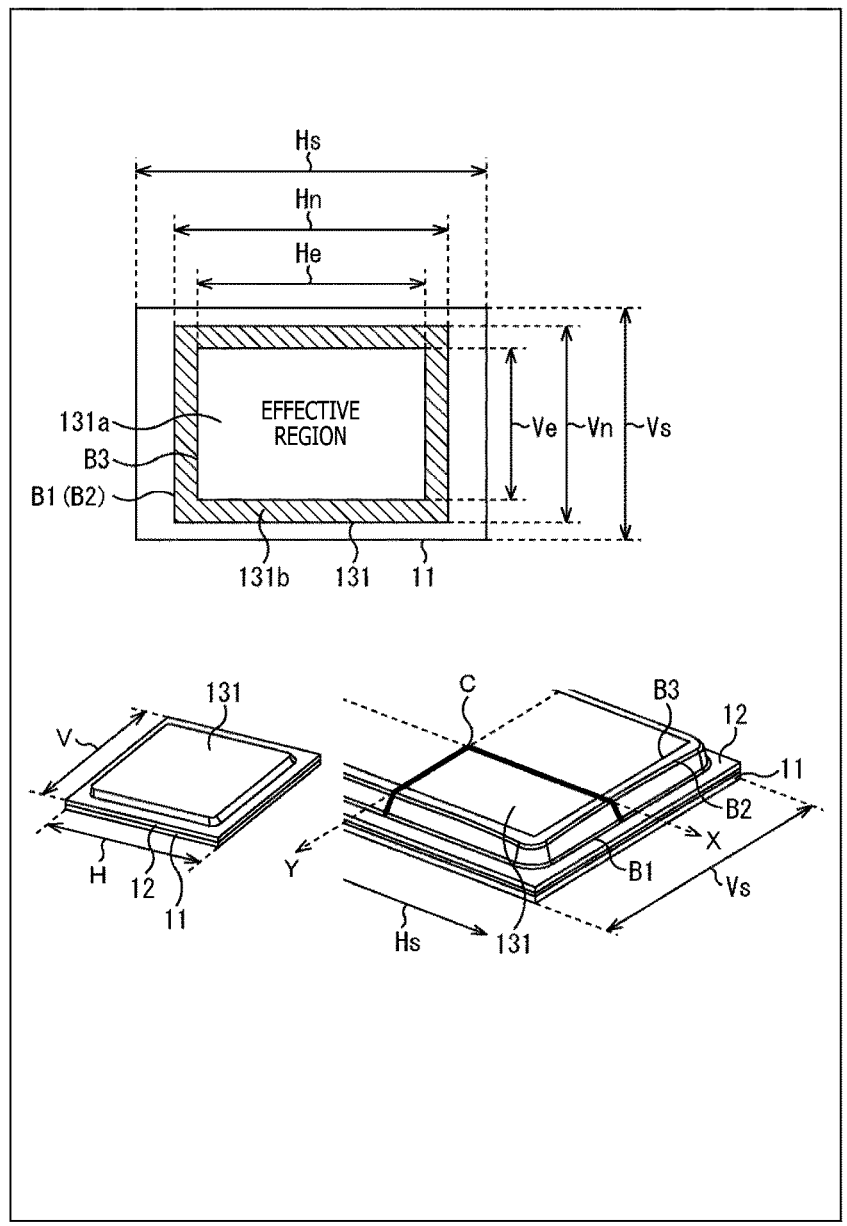
FIG. 23 is a figure for explaining a configuration example of a fifteenth embodiment of the imaging apparatus according to the present disclosure.

That is, in a case where the lens 131 is adhered or pasted onto the glass substrate 12 provided on the solid-state imaging element 11, for example, as depicted in FIG. 23, the outline dimension of the lens 131 is made smaller than the glass substrate 12 on the solid-state imaging element 11, additionally a non-effective region 131*b* is set at the outer circumferential section of the lens 131, and an effective region 131*a* is set inside the non-effective region 131*b*. Note that, instead of the glass substrate 12, the glass substrate 231 may be provided on the solid-state imaging element 11.

In addition, whereas the configuration in FIG. 23 is a configuration in which the IRCF 14 and the adhesive 15 in the integrated configuration section 10 of the imaging apparatus 1 in FIG. 9 are omitted, the IRCF 14 and the adhesive 15 are omitted only for convenience of the explanation, and certainly may be provided between the lens 131 and the glass substrate 12.

Furthermore, here, the effective region 131*a* is a region that is in a region of the lens 131 where incident light enters, has an aspherical shape, and effectively functions to condense the incident light onto a region of the solid-state imaging element 11 where photoelectric conversion is possible. Stated differently, the effective region 131*a* is a region that has a concentric structure in which an aspherical lens structure is formed, and is inscribed in the lens outer circumferential section. The effective region is a region that condenses incident light onto the imaging surface of the solid-state imaging element 11 where photoelectric conversion is possible.

On the other hand, the non-effective region 131*b* is a region that does not necessarily function as a lens that condenses incident light entering the lens 131 onto the region in the solid-state imaging element 11 where photoelectric conversion is performed.

It should be noted that it is desirable if the boundary of the non-effective region 131*b* that faces the effective region 131*a* has a structure which is an extension of a structure that functions as a lens having a partially aspherical shape. By providing, in the non-effective region 131*b*, the structure that functions as a lens, and is an extension near the boundary that faces the effective region 131*a* in such a manner, it becomes possible to condense incident light appropriately onto the imaging surface of the solid-state imaging element 11 even if a positional misalignment occurs when the lens 131 is adhered or pasted onto the glass substrate 12 on the solid-state imaging element 11.

Note that, in FIG. 23, the size of the glass substrate 12 on the solid-state imaging element 11 has a height Vs in the vertical direction (Y direction) and a width Hs in the horizontal direction (X direction), and the lens 131 having the size with a height Vn in the vertical direction and a width Hn in the horizontal direction which is smaller than the size of the solid-state imaging element 11 (glass substrate 12) is adhered or pasted onto the central portion on the inner side of the glass substrate 12 on the solid-state imaging element 11. Furthermore, the non-effective region 131*b* that does not function as a lens is set at the outer circumferential section of the lens 131, and the effective region 131*a* having the size with a height Ve in the vertical direction and a width He in the horizontal direction is set inside the non-effective region 131*b*.

Stated differently, there is a relation in terms of both horizontal widths and vertical heights that the width and length of the effective region 131*a* of the lens 131 are smaller than the width and length of the non-effective region 131*b* which are smaller than the width and length of the outline size of (the glass substrate 12 on) the solid-state imaging element 11, and the central positions of the lens 131, the effective region 131*a*, and the non-effective region 131*b* are substantially identical.

In addition, in FIG. 23, a top view as seen from the side of the direction of incidence of light when the lens 131 is adhered or pasted onto the glass substrate 12 on the solid-state imaging element 11 is depicted in the upper portion in the figure, and an external appearance perspective view as seen when the lens 131 is adhered or pasted onto the glass substrate 12 on the solid-state imaging element 11 is depicted in the lower left portion in the figure.

Furthermore, the lower right portion in the figure of FIG. 23 depicts, about the end section in the external appearance perspective view as seen when the lens 131 is adhered or pasted onto the glass substrate 12 on the solid-state imaging element 11, a boundary B1 between the glass substrate 12 and the side-surface section of the lens 131, a boundary B2 on the outer side of the non-effective region 131*b*, and a boundary B3 between the outer side of the effective region 131*a* and the inner side of the non-effective region 131*b*.

Here, the side-surface end section of the lens 131 is vertical to the glass substrate 12 on the solid-state imaging element 11 in the example depicted in FIG. 23. Because of this, in the top view of FIG. 23, the outer boundary B2 of the non-effective region 131*b* is formed at the top surface section of the lens 131, and the boundary B1 between the effective region 131*a* and the non-effective region 131*b* is formed at the lower surface section of the lens 131. Accordingly, the outer boundary B2 and the boundary B1 have identical sizes. Thereby, in the upper portion in FIG. 23, the outer circumferential section (boundary B1) of the lens 131 and the outer circumferential section (boundary B2) of the non-effective region 131*b* are expressed as having identical outlines.

Because, according to such a configuration, a space is formed between the side surface as the outer circumferential section of the lens 131 and the outer circumferential section of the glass substrate 12 on the solid-state imaging element 11, it becomes possible to reduce interference between the side-surface section of the lens 131 and another object, and it becomes possible to adopt a configuration that reduces the likelihood that the lens 131 peels off from the glass substrate 12 on the solid-state imaging element 11.

In addition, by setting the effective region 131*a* of the lens 131 in the non-effective region 131*b*, it becomes possible to condense incident light appropriately onto the imaging surface of the solid-state imaging element 11 even if the peripheral section peels off a little. In addition, because if peeling of the lens 131 occurs, interfacial reflection increases, and flares and ghosts worsen, it becomes possible to reduce occurrence of flares and ghosts as a result of a reduction of peeling.

Note that whereas the lens 131 is adhered or pasted onto the glass substrate 12 on the solid-state imaging element 11 in the example explained with reference to FIG. 23, certainly, the lens 131 may be replaced with any of the lenses 271 and 291, the lens group 171, and the infrared cut lens 301.

<Modification Examples of Outline Shape of Lens>

In the examples explained thus far, the effective region 131*a* is set at the central section of the lens 131, the non-effective region 131*b* is set at the outer circumferential section of the effective region 131*a*, furthermore the effective region 131*a* has a size smaller than the outer circumferential size of (the glass substrate 12 on) the solid-state imaging element 11, and all of the four corners of the outline shape of the lens 131 include shapes having acute angles.

However, as long as the size of the lens 131 is set smaller than the size of (the glass substrate 12 on) the solid-state imaging element 11, the effective region 131*a* is set at the central section of the lens 131, and the non-effective region 131*b* is set at the outer circumferential section of the effective region 131*a*, the outline shape may be another shape.

Figure 24:
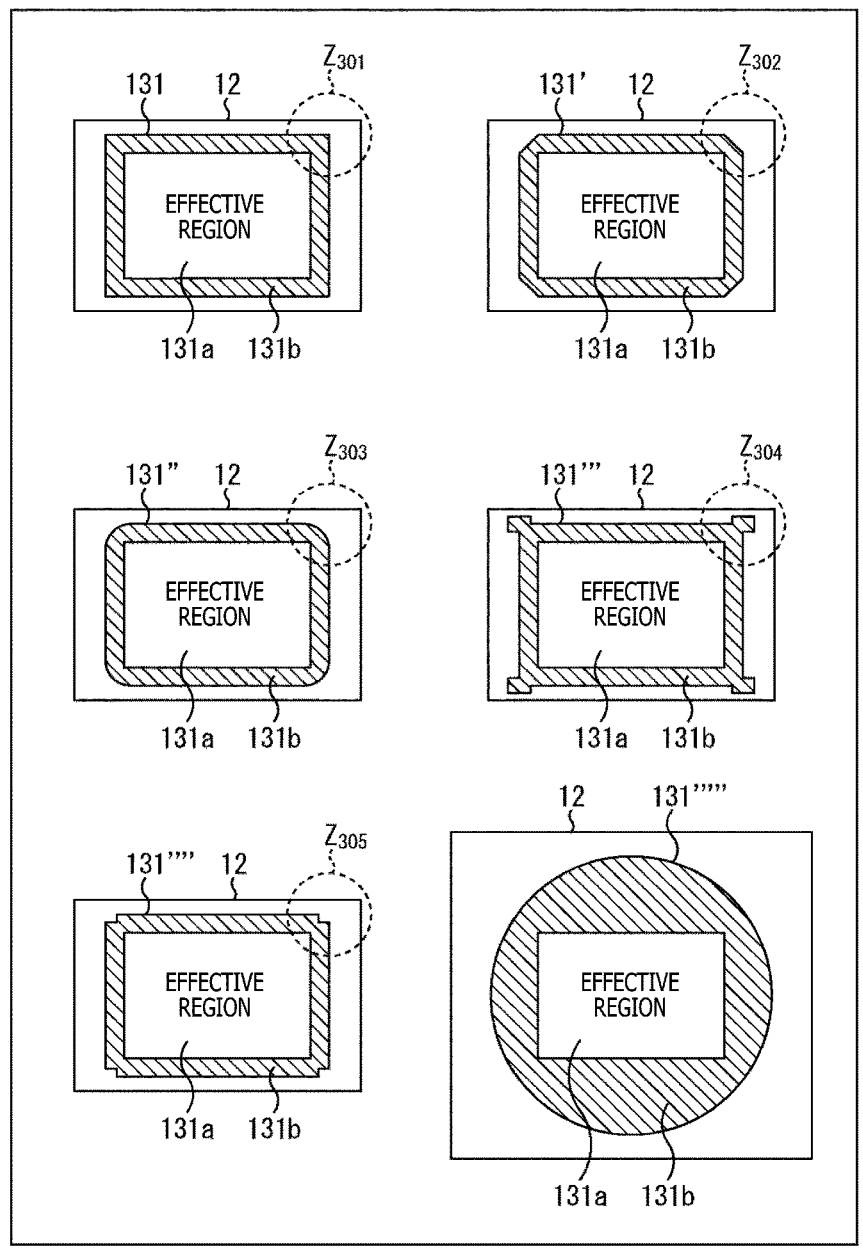
FIG. 24 is a figure for explaining modification examples of an outline shape of a lens in FIG. 23.

That is, as depicted in the upper left portion in FIG. 24 (corresponding to FIG. 23), a region 2301 at each of the four corners of the outline shape of the lens 131 may include a shape having an acute angle. In addition, as represented by a lens 131' in the upper right portion in FIG. 24, a region 2302 of each of the four corners may be a polygonal shape including obtuse angles.

In addition, as represented by a lens 131" in the central left portion in FIG. 24, a region 2303 of each of the four corners of the outline shape may be a circular shape.

Furthermore, as represented by a lens 131''' in the central right portion in FIG. 24, a region 2304 of each of the four corners of the outline shape may be a shape having a small rectangular section protruding from the corner. In addition, the protruding shape may be a shape other than a rectangle, and, for example, may be a shape such as a circle, an oval, or a polygon.

In addition, as represented by a lens 131'''' in the lower left portion in FIG. 24, a region 2305 of each of the four corners of the outline shape may be a rectangularly concave shape.

Furthermore, as represented by a lens 131''''' in the lower right portion in FIG. 24, the effective region 131*a* may be given a rectangular shape, and the outer circumferential section of the non-effective region 131*b* may be given a circular shape.

That is, the likelihood that angled sections of the lens 131 peel off from the glass substrate 12 increases as the angles of the angle sections decrease, and there is a fear that the peeling has optically negative influence. In view of this, by giving the angled sections shapes including polygons which have obtuse angles larger than 90 degrees, rounded shapes, shapes provided with concavities or convexities, or the like as represented by the lenses 131' to 131''''' in FIG. 24, it becomes possible to give the lens 131 a configuration that reduces the likelihood that the lens 131 peels off from the glass substrate 12, and to reduce the risk of optically negative influence.

<Modification Examples of Structure of Lens End Section>

In the examples explained thus far, the end section of the lens 131 is formed vertically to the imaging surface of the solid-state imaging element 11. However, as long as the size of the lens 131 is set smaller than the size of the solid-state imaging element 11, the effective region 131*a* is set at the central section of the lens 131, and the non-effective region 131*b* is set at the outer circumferential section of the effective region 131*a*, the end section may be formed in another shape.

Figure 25:
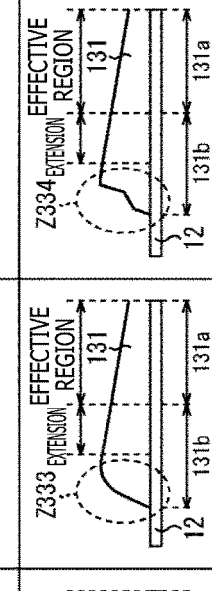
FIG. 25 is a figure for explaining modification examples of the structure of a lens end section in FIG. 23.

That is, as depicted in the upper left portion in FIG. 25, a configuration similar to the effective region 131*a* as a lens having an aspherical surface may be formed as an extension at the boundary of the non-effective region 131*b* that faces the effective region 131*a*, and, as represented by an end section Z331 of the non-effective region 131*b*, the end section may be formed vertically (corresponding to the configuration in FIG. 23).

In addition, as depicted in the second example from left in the upper portion in FIG. 25, a configuration similar to the effective region 131*a* as a lens having an aspherical surface may be formed as an extension at the boundary of the non-effective region 131*b* that faces the effective region 131*a*, and, as represented by an end section 2332 of the non-effective region 131*b*, the end section may be formed in a tapered shape.

Furthermore, as depicted in the third example from left in the upper portion in FIG. 25, a configuration similar to the effective region 131*a* as a lens having an aspherical surface may be formed as an extension at the boundary of the non-effective region 131*b* that faces the effective region 131*a*, and, as represented by an end section 2333 of the non-effective region 131*b*, the end section may be formed in a rounded shape.

In addition, as depicted in the upper right portion in FIG. 25, a configuration similar to the effective region 131*a* as a lens having an aspherical surface may be formed as an extension at the boundary of the non-effective region 131*b* that faces the effective region 131*a*, and, as represented by an end section 2334 of the non-effective region 131*b*, the end section may be formed as a multi-step structure side surface.

Furthermore, as depicted in the lower left portion in FIG. 25, a configuration similar to the effective region 131*a* as a lens having an aspherical surface may be formed as an extension at the boundary of the non-effective region 131*b* that faces the effective region 131*a*. As represented by an end section 2335 of the non-effective region 131*b*, a bank-like protrusion including a horizontally planar section at the end section, and protruding relative to the effective region 131*a* in a direction opposite to the direction of incidence of incident light may be formed, and the side surface of the protrusion may be formed vertically.

In addition, as depicted in the second example from left in the lower portion in FIG. 25, a configuration similar to the effective region 131*a* as a lens having an aspherical surface may be formed as an extension at the boundary of the non-effective region 131*b* that faces the effective region 131*a*. As represented by an end section 2336 of the non-effective region 131*b*, a bank-like protrusion including a horizontally planar section at the end section, and protruding relative to the effective region 131*a* in a direction opposite to the direction of incidence of incident light may be formed, and the side surface of the protrusion may be formed in a tapered shape.

Furthermore, as depicted in the third example from left in the lower portion in FIG. 25, a configuration similar to the effective region 131*a* as a lens having an aspherical surface may be formed as an extension at the boundary of the non-effective region 131*b* that faces the effective region 131*a*. As represented by an end section 2337 of the non-effective region 131*b*, a bank-like protrusion including a horizontally planar section at the end section, and protruding relative to the effective region 131*a* in a direction opposite to the direction of incidence of incident light may be formed, and the side surface of the protrusion may be formed in a rounded shape.

In addition, as depicted in the lower right portion in FIG. 25, a configuration similar to the effective region 131*a* as a lens having an aspherical surface may be formed as an extension at the boundary of the non-effective region 131*b* that faces the effective region 131*a*. As represented by an end section 2338 of the non-effective region 131*b*, a bank-like protrusion including a horizontally planar section at the end section, and protruding relative to the effective region 131*a* in a direction opposite to the direction of incidence of incident light may be formed, and the side surface of the protrusion may be formed to have a multi-step structure.

Note that the upper row in FIG. 25 depicts structure examples in which the end section of the lens 131 is not provided with a bank-like protrusion including a horizontally planar section, and protruding relative to the effective region 131*a* in the direction opposite to the direction of incidence of incident light, and the lower row depicts structure examples in which the end section of the lens 131 is not provided with a protrusion including a horizontally planar section. In addition, both the upper row and lower row in FIG. 25 depict, in the following order from left, examples in which the end section of the lens 131 is configured vertically to the glass substrate 12, examples in which the end section includes a tapered shape, examples in which the end section includes a rounded shape and examples in which the end section is configured to have a multi-step structure having a plurality of side surfaces.

Figure 26:
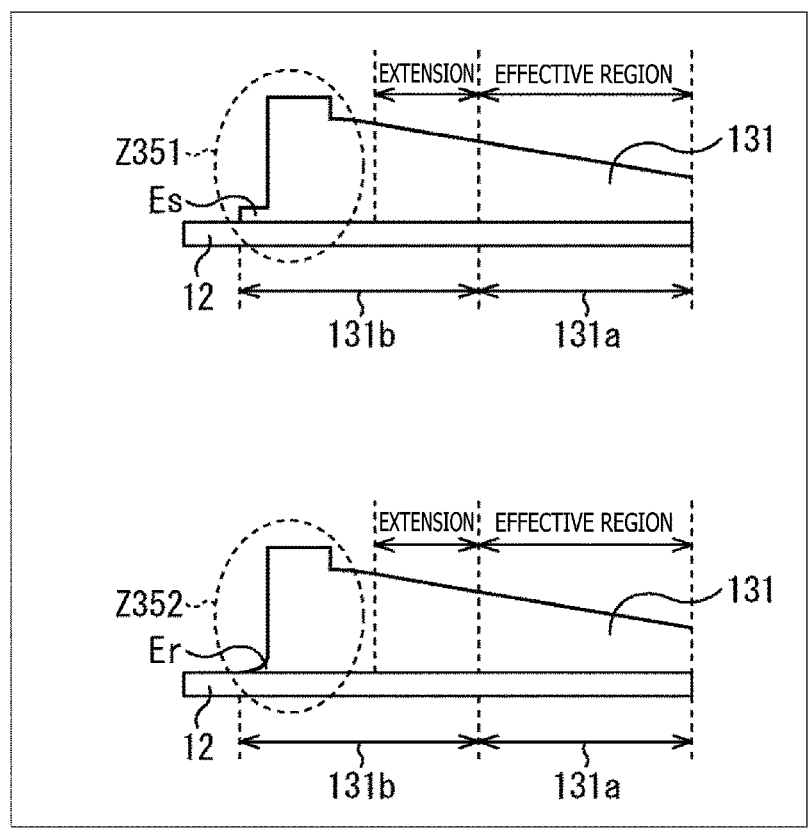
FIG. 26 is a figure for explaining modification examples of the structure of the lens end section in FIG. 23.

In addition, as depicted in the upper portion in FIG. 26, a configuration similar to the effective region 131*a* as a lens having an aspherical surface may be formed as an extension at the boundary of the non-effective region 131*b* that faces the effective region 131*a*. As represented by an end section 2351 of the non-effective region 131*b*, a protrusion may be formed vertically to the glass substrate 12, and furthermore a rectangular boundary structure Es may be configured being left at the boundary of the non-effective region 131*b* that faces the glass substrate 12 on the solid-state imaging element 11.

Furthermore, as depicted in the lower portion in FIG. 26, a configuration similar to the effective region 131*a* as a lens having an aspherical surface may be formed as an extension at the boundary of the non-effective region 131*b* that faces the effective region 131*a*. As represented by an end section 2352 of the non-effective region 131*b*, a protrusion may be formed vertically to the glass substrate 12, and furthermore a rounded boundary structure Er may be configured being left at the boundary of the non-effective region 131*b* that faces the glass substrate 12 on the solid-state imaging element 11.

Both the rectangular boundary structure Es and the rounded boundary structure Er increase the area size of contact between the lens 131 and the glass substrate 12, and thereby it becomes possible to join the lens 131 and the glass substrate 12 together by stronger adhesion. As a result, it becomes possible to reduce peeling of the lens 131 off from the glass substrate 12.

Note that the rectangular boundary structure Es and the rounded boundary structure Er may be used in any of the cases that the end section is formed in a tapered shape, the cases that the end section is formed in a rounded shape and the cases that the end section is formed to have a multi-step structure.

Figure 27:
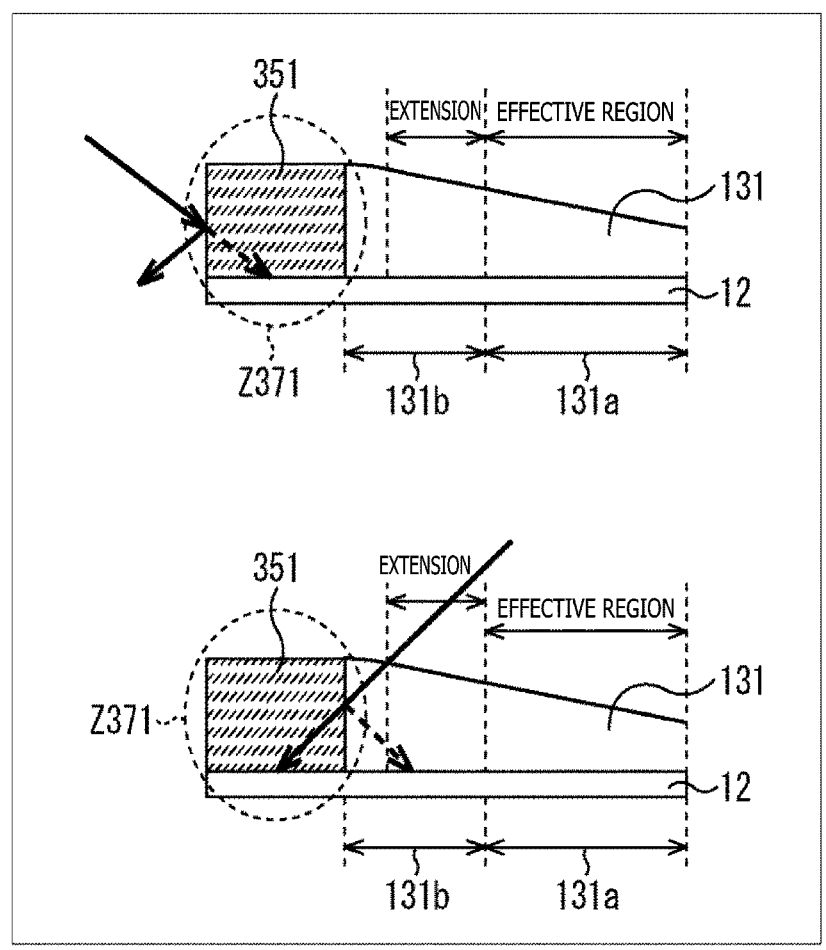
FIG. 27 is a figure for explaining modification examples of the structure of the lens end section in FIG. 23.

In addition, as depicted in FIG. 27, a configuration similar to the effective region 131*a* as a lens having an aspherical surface may be formed as an extension at the boundary of the non-effective region 131*b* that faces the effective region 131*a*. As represented by an end section 2371 of the non-effective region 131*b*, the side surface of the lens 131 may be formed vertically to the glass substrate 12, and furthermore a refractive film 351 having a predetermined refractive index and a height which is substantially identical to the height of the lens 131 may be configured on the glass substrate 12 at the outer circumferential section of the lens 131.

Thereby, for example, in a case where the refractive film 351 has a refractive index higher than a predetermined refractive index, the refractive film 351 reflects, to the outer side of the lens 131, incident light advancing toward the outer circumferential section of the lens 131 as represented by a solid line arrow in the upper portion in FIG. 27 in a case where there is such incident light, and also reduces incident light that enters the side-surface section of the lens 131 as represented by a dotted arrow. As a result, entrance of stray light into the lens 131 is reduced, and so occurrence of flares and ghosts is reduced.

In addition, in a case where the refractive film 351 has a refractive index lower than a predetermined refractive index, the refractive film 351 transmits light that does not enter the incidence surface of the solid-state imaging element 11, and advancing to be transmitted to the outside of the lens 131 from the side surface of the lens 131 as represented by a solid line arrow in the lower portion in FIG. 27, and also reduces reflection light from the side surface of the lens 131 as represented by a dotted arrow. As a result, entrance of stray light to the lens 131 is reduced, and so it becomes possible to reduce occurrence of flares and ghosts.

Furthermore, whereas the refractive film 351 is formed to have a height which is identical to the height of the lens 131 on the glass substrate 12, and additionally have an end section that is formed vertically in the example explained with reference to FIG. 27, the refractive film 351 may have another shape.

Figure 28:
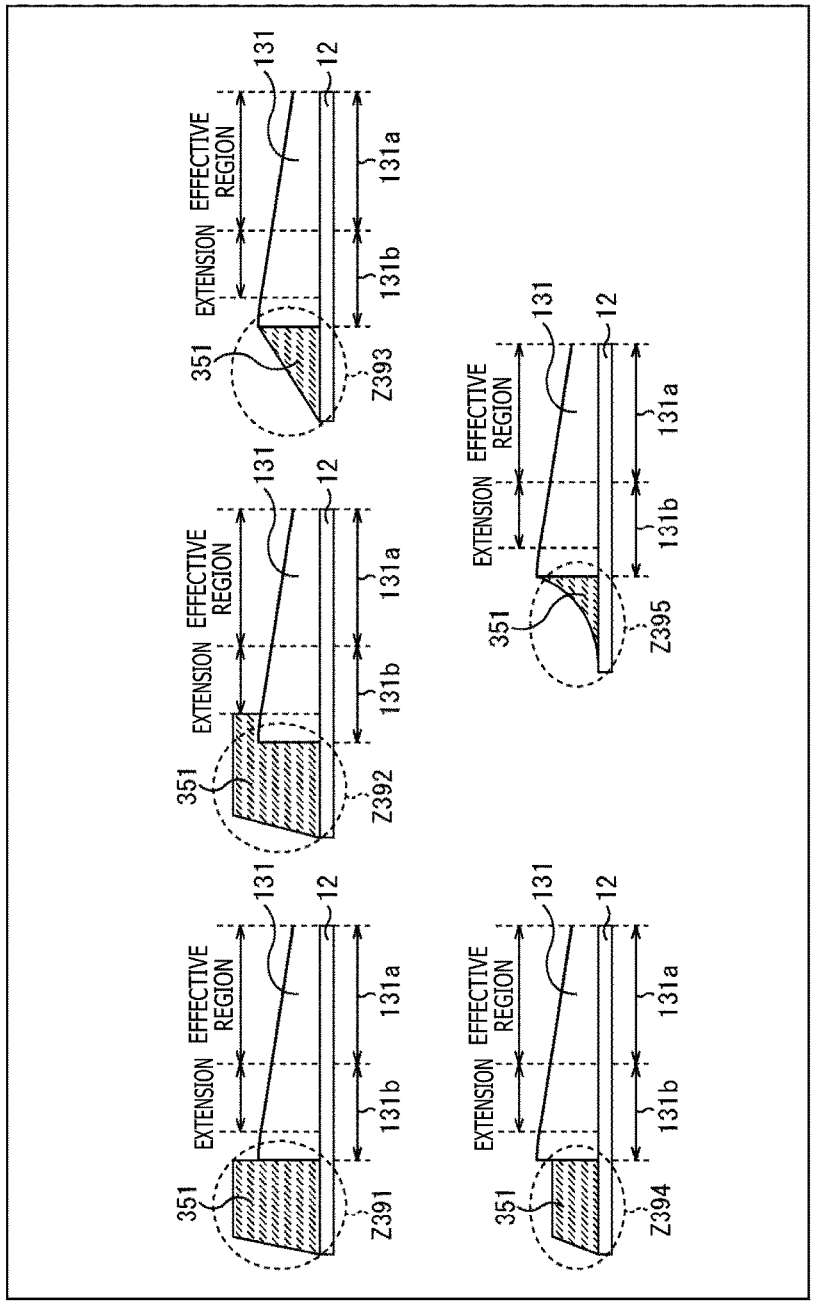
FIG. 28 is a figure for explaining modification examples of the structure of the lens end section in FIG. 23.

For example, as represented by a region 2391 in the upper left portion in FIG. 28, the refractive film 351 may be formed to include a tapered shape at the end section on the glass substrate 12, and may additionally have a configuration having a thickness larger than the height of the end section of the lens 131.

In addition, for example, as represented by a region 2392 in the central upper portion in FIG. 28, the refractive film 351 may be formed to include a tapered shape at the end section, may additionally have a configuration having a thickness larger than the height of the end section of the lens 131, and furthermore may have a configuration partially covering the non-effective region 131b of the lens 131.

Furthermore, for example, as represented by a region 2393 in the upper right portion in FIG. 28, the refractive film 351 may have a configuration in which a tapered shape includes the height of the end section of the lens 131 to the end section of the glass substrate 12.

In addition, for example, as represented by a region 2394 in the lower left portion in FIG. 28, the refractive film 351 may have a configuration formed in a tapered shape at the end section of the glass substrate 12, and additionally having a thickness smaller than the height of the end section of the lens 131.

Furthermore, for example, as represented by a region 2395 in the lower right portion in FIG. 28, the refractive film 351 may have a configuration which is concave toward the glass substrate 12 relative to the height of the end section of the lens 131, and additionally is formed in a rounded shape.

In any of the configurations in FIG. 27 and FIG. 28, entrance of stray light to the lens 131 is reduced, and so it becomes possible to reduce occurrence of flares and ghosts.

16. Sixteenth Embodiment

Whereas flares and ghosts are reduced by adopting a configuration in which the likelihood that the lens 131 peels off from the glass substrate 12 is reduced, a configuration in which entrance of stray light is reduced, and so on in the examples explained thus far, flares and ghosts may be reduced by adopting a configuration that reduces burrs of an adhesive that are generated at the time of processing.

Figure 29:
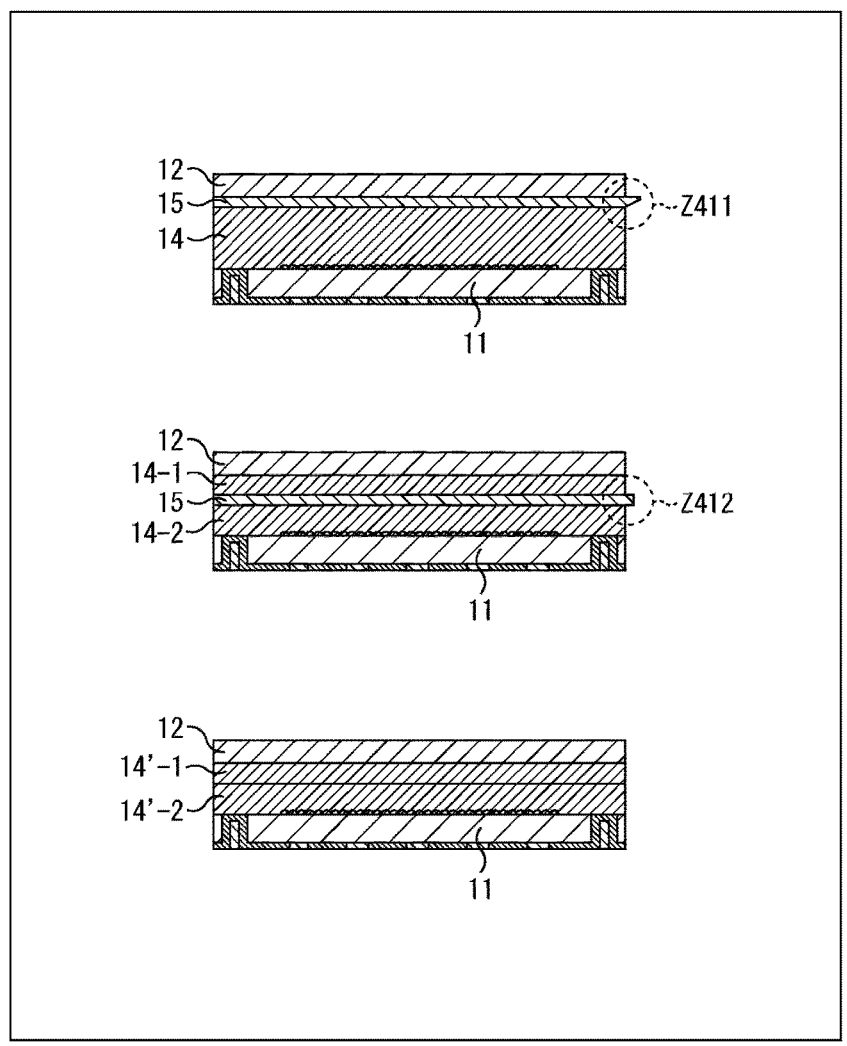
FIG. 29 is a figure for explaining configuration examples of a sixteenth embodiment of the imaging apparatus according to the present disclosure.

That is, in the case of configurations to be considered next, as depicted on the upper row in FIG. 29, the IRCF 14 is formed on the solid-state imaging element 11, and the glass substrate 12 is adhered onto the IRCF 14 by using the adhesive 15 (e.g. the case of the configuration according to the seventh embodiment in FIG. 15). Note that configurations in FIG. 29 correspond to configurations other than the lens in the integrated configuration section 10 in the imaging apparatus 1 in FIG. 15.

In this case, the IRCF 14 needs to have a film thickness which is large to some extent, but typically it is difficult to increase the viscosity of the material of the IRCF 14, and a desired film thickness cannot be formed at once. However, if recoating is performed, micro voids are generated or inclusion of bubbles occurs, and there is a fear that the optical characteristics deteriorate.

In addition, the glass substrate 12 is adhered by using the adhesive 15 after the IRCF 14 is formed on the solid-state imaging element 11, but because a warp occurs due to curing contraction of the IRCF 14, there is a fear that a failure of the joint between the glass substrate 12 and the IRCF 14 occurs. Furthermore, a warp of the IRCF 14 cannot be forcibly corrected only by the glass substrate 12, and there is a fear that a warp of the device as a whole occurs, and the optical characteristics deteriorate.

Furthermore, in particular, in a case where the glass substrate 12 and the IRCF 14 are joined together via the adhesive 15, a resin burr resulting from the adhesive 15 occurs as represented by an area 2411 in the upper portion in FIG. 29 at the time of dicing, and there is a fear that the working accuracy is lowered at the time of implementation such as pickup.

In view of this, as depicted in the central portion in FIG. 29, the IRCF 14 is divided into two layers, IRCFs 14-1 and 14-2, and the IRCFs 14-1 and 14-2 are adhered to each other by using the adhesive 15.

According to such a configuration, when the IRCFs 14-1 and 14-2 are formed, it becomes possible to form the IRCFs 14-1 and 14-2 thin separately, and so formation of a thick film for obtaining desired spectral characteristics becomes easy (separate formation).

In addition, the glass substrate 12 can be joined with the solid-state imaging element 11 while steps (sensor steps such as PAD) on the solid-state imaging element 11 are flattened by using the IRCF 14-2. Accordingly, it becomes possible to reduce the film thickness of the adhesive 15. As a result, it becomes possible to reduce the height of the imaging apparatus 1.

Furthermore, a warp is cancelled out by the IRCFs 14-1 and 14-2 that are formed on the glass substrate 12 and the solid-state imaging element 11, respectively, and it becomes possible to reduce warps of the device chip.

In addition, the elastic modulus of glass is higher than the elastic modulus of the IRCFs 14-1 and 14-2. By making the elastic modulus of the IRCFs 14-1 and 14-2 higher than the elastic modulus of the adhesive 15, it becomes possible to reduce occurrence of resin burrs at the time of dicing (Expand) as represented by an area 2412 in the upper portion in FIG. 29 because the top and bottom of the adhesive 15 having low elasticity is covered with the IRCFs 14-1 and 14-2 having an elastic modulus higher than the elastic modulus of the adhesive 15 at the time of dicing.

Furthermore, as depicted in the lower portion in FIG. 29, IRCFs 14'-1 and 14'-2 having functions as adhesives may be formed, and directly pasted together such that the IRCFs 14'-1 and 14'-2 face each other. By doing so, occurrence of resin burrs of the adhesive 15 that occur at the time of dicing can be reduced.

<Manufacturing Method>

Figure 30:
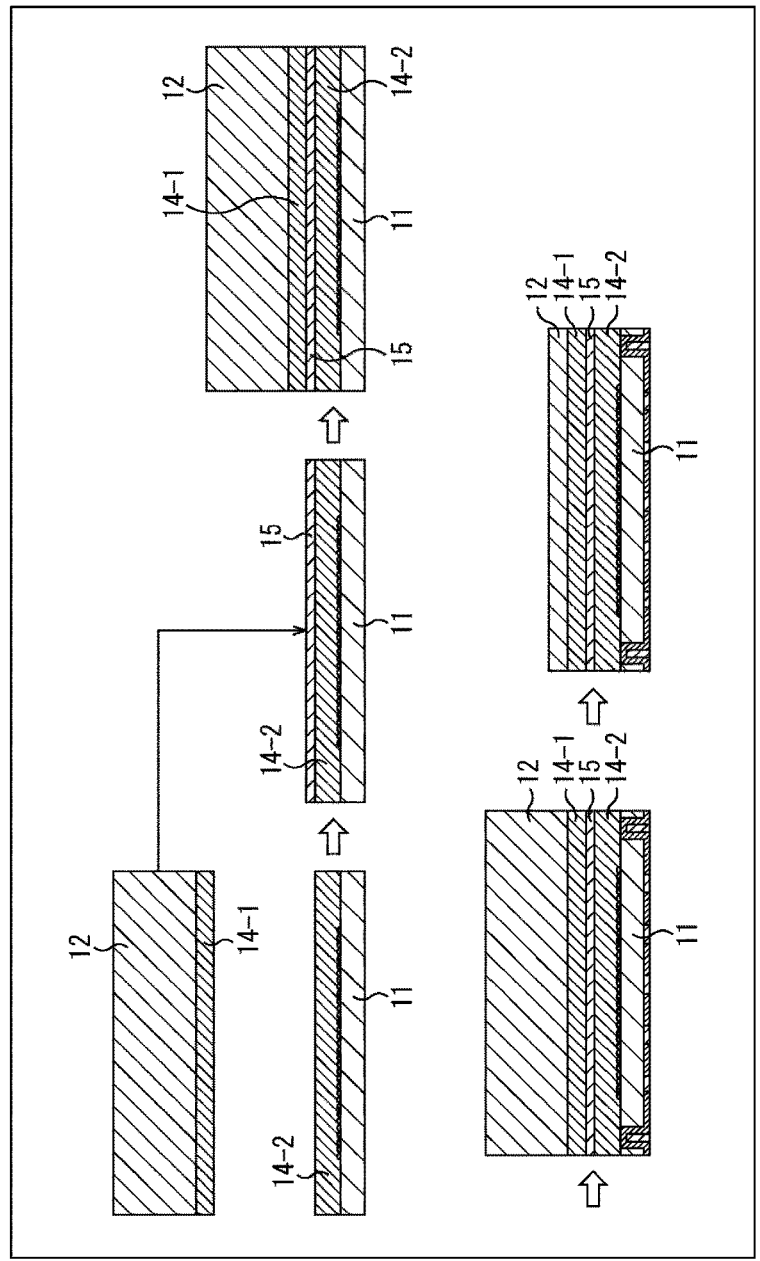
FIG. 30 is a figure for explaining a method of manufacturing the imaging apparatus in FIG. 29.

Next, with reference to FIG. 30, a manufacturing method in which the adhesive 15 is sandwiched by the IRCFs 14-1 and 14-2 to join the glass substrate 12 with the solid-state imaging element 11 depicted in the central portion in FIG. 29 is explained.

At a first step, as depicted in the upper left portion in FIG. 30, the IRCF 14-1 is formed on the glass substrate 12 by coating. In addition, the IRCF 14-2 is formed on the solid-state imaging element 11 by coating. Note that the upper left portion in FIG. 30 depicts a vertically reversed state of the glass substrate 12 after the IRCF 14-2 is formed by coating.

At a second step, as depicted in the central upper portion in FIG. 30, the adhesive 15 is applied onto the IRCF 14-2 by coating.

At a third step, as depicted in the upper right portion in FIG. 30, the IRCF 14-1 on the glass substrate 12 is pasted together onto the adhesive 15 depicted in the central upper portion in FIG. 30 such that the IRCF 14-1 faces the surface onto which the adhesive 15 has been applied by coating.

At a fourth step, as depicted in the lower left portion in FIG. 30, electrodes are formed on the backside of the solid-state imaging element 11.

At a fifth step, as depicted in the central lower portion in FIG. 30, the glass substrate 12 is formed into a thin film by polishing.

Then, dicing is performed by cutting the end section by a blade or the like after the fifth step, and the solid-state imaging element 11 in which the IRCFs 14-1 and 14-2 are stacked on the imaging surface, and furthermore the glass substrate 12 is formed on the IRCFs 14-1 and 14-2 is completed.

As a result of the steps above, the adhesive 15 is sandwiched by the IRCFs 14-1 and 14-2, and so it becomes possible to reduce occurrence of burrs accompanying the dicing.

In addition, because it becomes possible to form the IRCFs 14-1 and 14-2 each of which forms a half of a required film thickness, and the thickness that needs to be obtained by recoating can be reduced or recoating becomes unnecessary, it becomes possible to reduce generation of micro voids or occurrence of inclusion of bubbles, and to reduce deterioration of the optical characteristics.

Furthermore, because the film thickness of each of the IRCFs 14-1 and 14-2 is small, it becomes possible to reduce warps due to curing contraction, it becomes possible to reduce occurrence of a failure of the joint between the glass substrate 12 and the IRCF 14, and it becomes possible to reduce deterioration of the optical characteristics resulting from warps.

Note that because, in a case where the IRCFs 14'-1 and 14'-2 having functions of adhesives are used as depicted in the lower portion in FIG. 29, the step of applying the adhesive 15 by coating is simply omitted, an explanation about such a case is omitted.

<Modification Examples of Side Surface Shape after Dicing>

When the solid-state imaging element 11 on which the IRCFs 14-1 and 14-2 are formed, and furthermore the glass substrate 12 is formed according to the manufacturing method mentioned above is to be diced, as a premise, the end section is cut by a blade or the like such that the side-surface cross-section becomes vertical to the imaging surface.

However, the influence of dropped garbage resulting from the glass substrate 12, the IRCFs 14-1 and 14-2 and the adhesive 15 may be reduced further by adjusting the shape of the side-surface cross-section of the IRCFs 14-1 and 14-2, and the glass substrate 12 formed on the solid-state imaging element 11.

Figure 31:
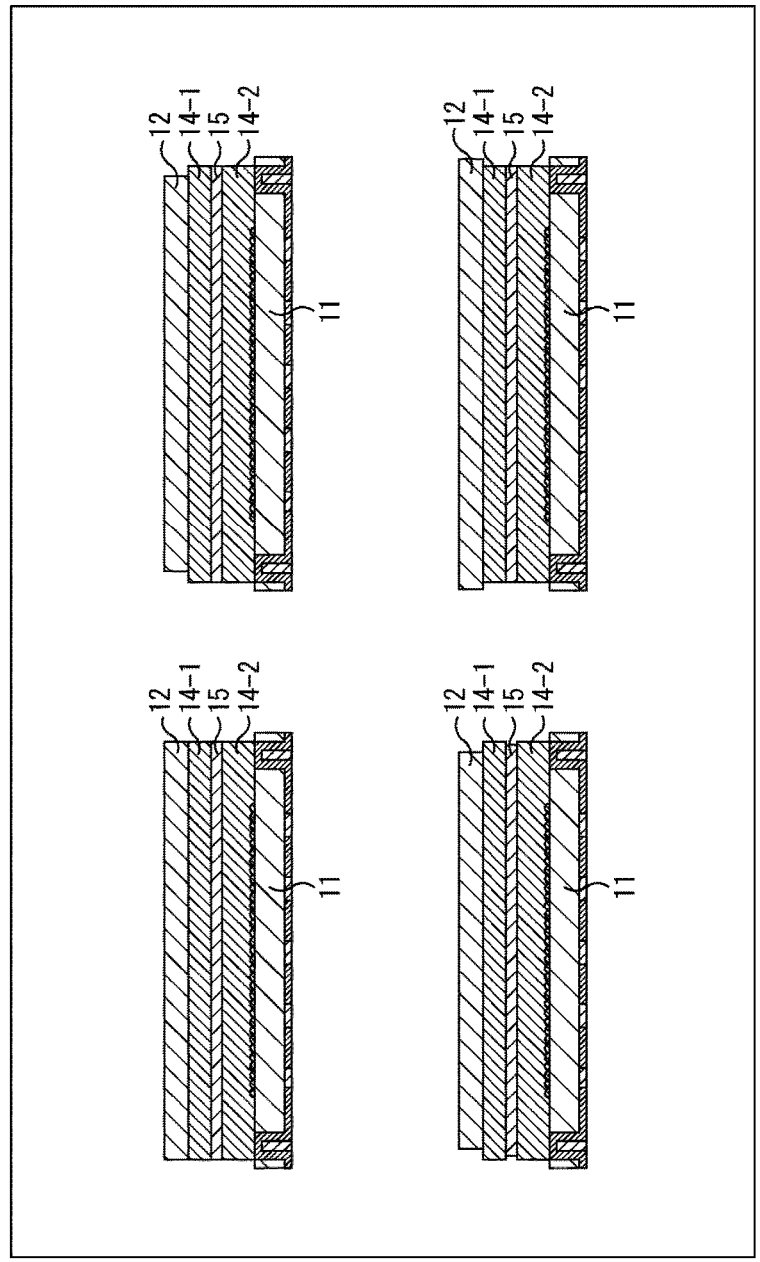
FIG. 31 is a figure for explaining modification examples of a dicing cross-section of the configuration example in FIG. 29.

For example, as depicted in the upper left portion in FIG. 31, the side-surface cross-section may be formed such that the horizontal outline shape of the solid-state imaging element 11 is the largest, and the outline shapes of all of the glass substrate 12, the IRCFs 14-1 and 14-2, and the adhesive 15 are the same and additionally are smaller than the horizontal outline shape of the solid-state imaging element 11.

Furthermore, as depicted in the upper right portion in FIG. 31, the side-surface cross-section may be formed such that the horizontal outline shape of the solid-state imaging element 11 is the largest, the outline shapes of the IRCFs 14-1 and 14-2 and the adhesive 15 are the same and additionally are the largest next to the solid-state imaging element 11, and the outline shape of the glass substrate 12 is the smallest.

In addition, as depicted in the lower left portion in FIG. 31, the side-surface cross-section may be formed such that the descending order in terms of the sizes of the horizontal outline shapes is the solid-state imaging element 11, the IRCFs 14-1 and 14-2, the adhesive 15, and the glass substrate 12.

In addition, as depicted in the lower right portion in FIG. 31, the side-surface cross-section may be formed such that the horizontal outline shape of the solid-state imaging element 11 is the largest, the outline shape of the glass substrate 12 is the second largest, and the outline shapes of the IRCFs 14-1 and 14-2 and the adhesive 15 are the same and additionally are the smallest.

<Dicing Method for Upper Left Portion in FIG. 31>

Next, a dicing method for the upper left portion in FIG. 31 is explained with reference to FIG. 32.

Figure 32:
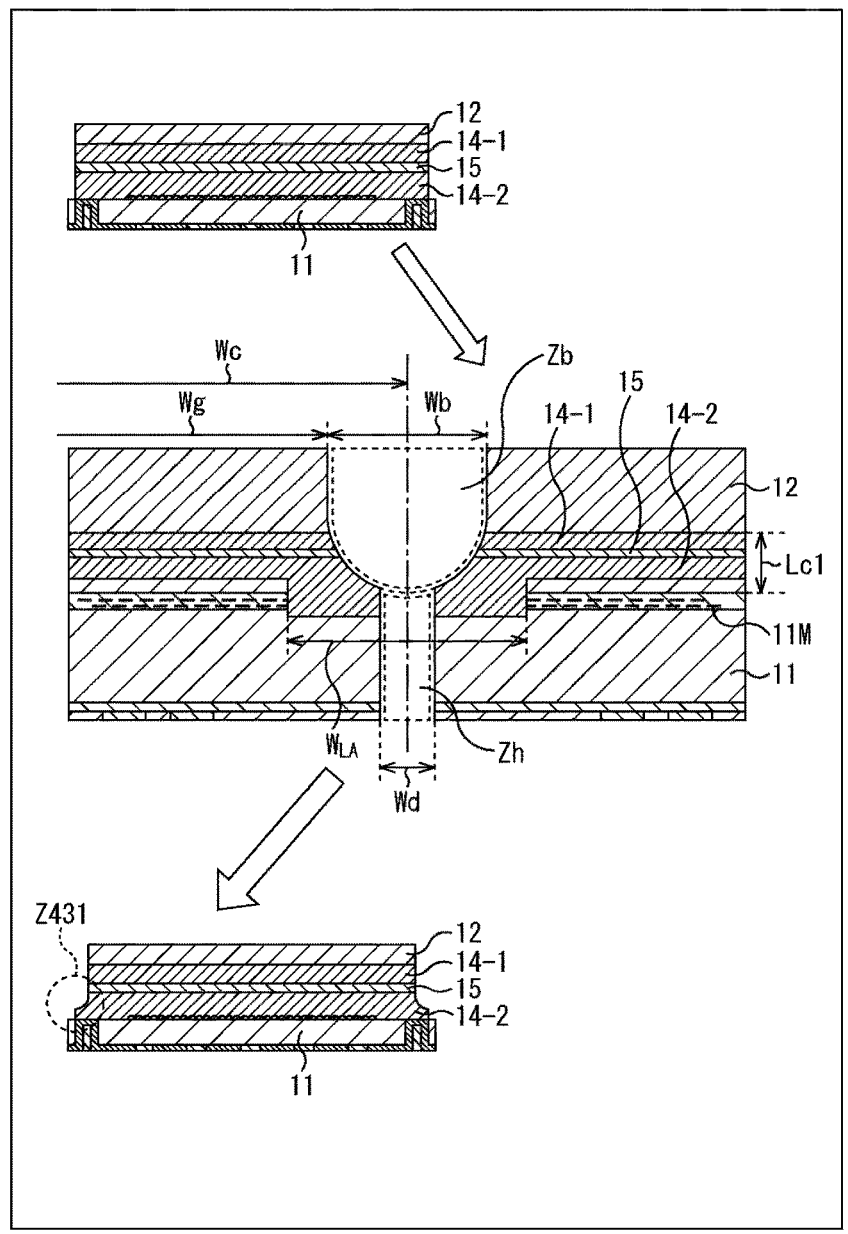
FIG. 32 is a figure for explaining a method of manufacturing the imaging apparatus related to an upper left portion in FIG. 31.

The upper row in FIG. 32 depicts a figure for explaining the side-surface cross-section depicted in the upper left portion in FIG. 31. That is, the upper row in FIG. 32 depicts the side-surface cross-section in which the horizontal outline shape of the solid-state imaging element 11 is the largest, the outline shapes of all of the glass substrate 12, the IRCFs 14-1 and 14-2, and the adhesive 15 are the same, are the second largest and smaller than the horizontal outline shape of the solid-state imaging element 11.

Here, a method of forming the side-surface cross-section depicted in the upper left portion in FIG. 31 is explained with reference to the central row in FIG. 32. Note that the central row in FIG. 32 is an enlarged view of the boundary between adjacent solid-state imaging elements 11 to be cut by dicing as seen from the side surface.

At a first step, an area Zb which is at the boundary between the adjacent solid-state imaging elements 11, and includes the glass substrate 12, the IRCFs 14-1 and 14-2, and the adhesive 15 is cut to a depth Lc1 from the surface layer of the IRCF 14-1 by using a blade having a predetermined width Wb (e.g. approximately 100 μm).

Here, whereas, in the central portion in FIG. 32, the position at a depth Lc from the surface layer of the IRCF 14-1 is in the surface layer of the solid-state imaging element 11, and is a position that reaches a wiring layer 11M formed by a CuCu junction or the like, it is sufficient if the position at the depth Lc reaches the surface layer of the solid-state imaging element 11. Accordingly, the depth Lc1 may be such a depth that a portion extending to the surface layer of the semiconductor substrate 81 in FIG. 6 is cut.

In addition, as depicted in the central portion in FIG. 32, the blade cuts the boundary in a state that the center of the blade is aligned with the central position of the adjacent solid-state imaging elements 11 represented by a dash-dotted line. In addition, in the figure, a width WLA is a width over which a wiring layer formed at the end sections of the two adjacent solid-state imaging elements 11 is formed. Furthermore, a width of one of the chips of the solid-state imaging elements 11 extending to the center of a scribe line is a width Wc, and a width of one of the chips of the solid-state imaging elements 11 extending to the end section of the glass substrate 12 is a width Wg.

Furthermore, the area Zb corresponds to the shape of the blade, the upper portion has the blade width Wb, and the lower portion is expressed by a semi-spherical shape. These correspond to the blade shape.

At a second step, for example, an area Zh which is in the Si substrate (the semiconductor substrate 81 in FIG. 6) of the solid-state imaging element 11, and has a predetermined width Wd (e.g. approximately 35 μm) smaller than the width of the blade used for cutting the glass substrate 12 is cut by dry etching, laser dicing, or a blade, and thereby the solid-state imaging elements 11 are diced. It should be noted that the width Wd becomes approximately zero in the case of laser dicing. In addition, the cutting shape can be adjusted to a desired shape by dry etching, laser dicing, or a blade.

As a result, as depicted on the lower row in FIG. 32, the side-surface cross-section is formed such that the horizontal outline shape of the solid-state imaging element 11 is the largest, and the outline shapes of all of the glass substrate 12, the IRCFs 14-1 and 14-2, and the adhesive 15 are the same and additionally are smaller than the horizontal outline shape of the solid-state imaging element 11.

Note that, as represented by an area 2431, the lower row in FIG. 32 depicts portions around the boundary of the IRCF 14-2 that faces the solid-state imaging element 11 as having part, in the horizontal direction, having a width which is larger than the horizontal width of the IRCF 14-1, and the shape of the side-surface cross-section is different from the shape of the side-surface cross-section of the glass substrate 12, the IRCFs 14-1 and 14-2, and the adhesive 15 on the upper row in FIG. 32.

However, this is a result of depicting the cutting shape formed by the blade in a deformed manner, and the configuration on the lower row in FIG. 32 and the configuration on the upper row in the FIG. 32 can be made substantially identical by adjusting the cutting shape by dry etching, laser dicing, or a blade.

In addition, the process of cutting the area Zh in the Si substrate (the semiconductor substrate 81 in FIG. 6) included in the solid-state imaging element 11 may be executed before the work of cutting the area Zb, and, at this time, the work may be executed in a vertically reversed state relative to the state depicted in the central row in FIG. 32.

Furthermore, because the wiring layer is prone to cracks or film peeling at the time of blade dicing, the area Zh may be cut by ablation processing using a short pulse laser.

<Dicing Method for Upper Right Portion in FIG. 31>

Next, a dicing method for the upper right portion in FIG. 31 is explained with reference to FIG. 33.

Figure 33:
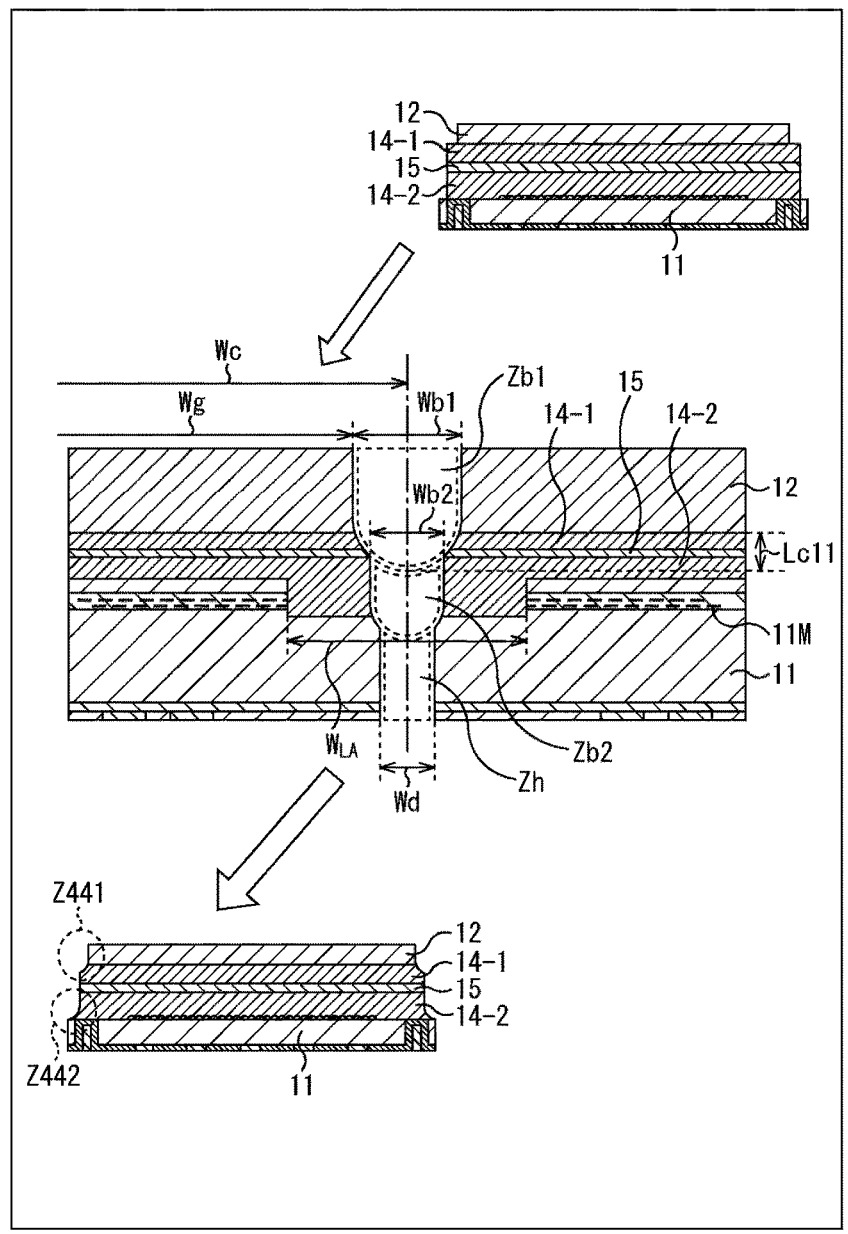
FIG. 33 is a figure for explaining a method of manufacturing the imaging apparatus related to a lower left portion in FIG. 31.

The upper row in FIG. 33 depicts a figure for explaining the side-surface cross-section depicted in the upper right portion in FIG. 31. That is, the upper row in FIG. 33 depicts the side-surface cross-section formed such that the horizontal outline shape of the solid-state imaging element 11 is the largest, the outline shapes of the IRCFs 14-1 and 14-2 and the adhesive 15 are the same and additionally are the largest next to the outline shape of the solid-state imaging element 11, and the outline shape of the glass substrate 12 is the smallest.

Here, a method of forming the side-surface cross-section depicted in the upper right portion in FIG. 31 is explained with reference to the central row in FIG. 33. Note that the central row in FIG. 33 is an enlarged view of the boundary between adjacent solid-state imaging elements 11 to be cut by dicing as seen from the side surface.

At a first step, an area Zb1 including the glass substrate 12, the IRCFs 14-1 and 14-2, and the adhesive 15 is cut to a depth Lc11 from the surface layer of the IRCF 14-1 by using a blade having a predetermined width Wb1 (e.g. approximately 100 μm).

At a second step, an area Zb2 having a depth larger than the depth of the wiring layer 11M is cut by using a blade having a predetermined width Wb2 (<width Wb1).

At a third step, for example, an area Zh which is in the Si substrate (the semiconductor substrate 81 in FIG. 6), and has the predetermined width Wd (e.g. approximately 35 μm) smaller than the width Wb2 is cut by dry etching, laser dicing, or a blade, and thereby the solid-state imaging elements 11 are diced. It should be noted that the width Wd becomes approximately zero in the case of laser dicing. In addition, the cutting shape can be adjusted to a desired shape by dry etching, laser dicing, or a blade.

As a result, as depicted on the lower row in FIG. 33, the side-surface cross-section is formed such that the horizontal outline shape of the solid-state imaging element 11 is the largest, the outline shapes of the IRCFs 14-1 and 14-2 and the adhesive 15 are the same and additionally are the largest next to the outline shape of the solid-state imaging element 11, and the outline shape of the glass substrate 12 is the smallest.

Note that, as represented by an area 2441, the lower row in FIG. 33 depicts part, in the horizontal direction, of the IRCF 14-1 as having a horizontal width identical to the horizontal width of the glass substrate 12. In addition, as represented by an area 2442, part, in the horizontal direction, of the IRCF 14-2 is depicted as having a horizontal width larger than the horizontal width of the IRCF 14-1.

Accordingly, the shape of the side-surface cross-section of the glass substrate 12, the IRCFs 14-1 and 14-2, and the adhesive 15 on the lower row in FIG. 33 is different from the shape on the upper row in FIG. 33.

However, this is a result of depicting the cutting shape formed by the blade in a deformed manner, and the configuration on the lower row in FIG. 32 and the configuration on the upper row in the FIG. 32 can be made substantially identical by adjusting the cutting shape by dry etching, laser dicing, or a blade.

In addition, the process of cutting the area Zh in the Si substrate (the semiconductor substrate 81 in FIG. 6) included in the solid-state imaging element 11 may be executed before the work of cutting the areas Zb1 and Zb2, and, at this time, the work may be executed in a vertically reversed state relative to the state depicted in the central row in FIG. 33.

Furthermore, because the wiring layer is prone to cracks or film peeling at the time of blade dicing, the area Zh may be cut by ablation processing using a short pulse laser.

<Dicing Method for Lower Left Portion in FIG. 31>

Next, a dicing method for the lower left portion in FIG. 31 is explained with reference to FIG. 34.

Figure 34:
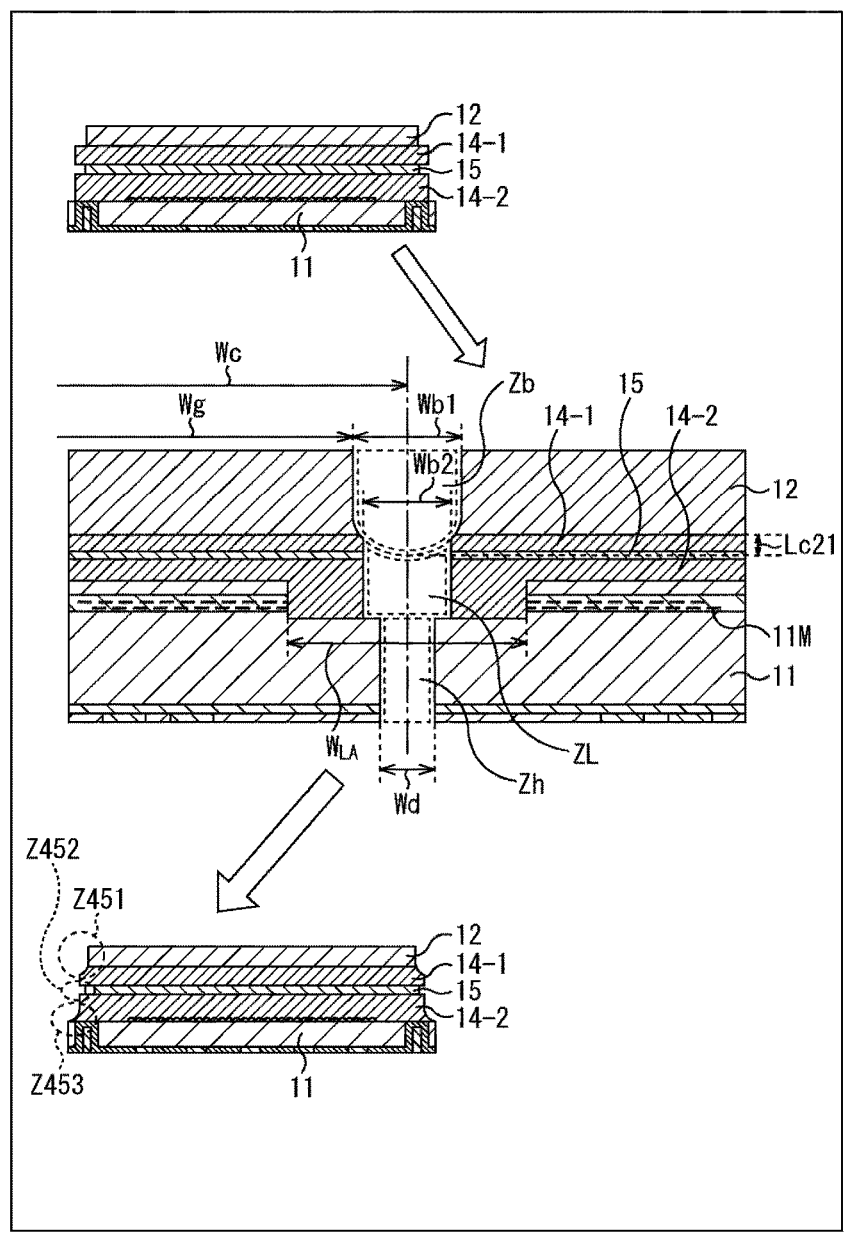
FIG. 34 is a figure for explaining a method of manufacturing the imaging apparatus related to an upper right portion in FIG. 31.

The upper row in FIG. 34 depicts a figure for explaining the side-surface cross-section depicted in the lower left portion in FIG. 31. That is, the upper row in FIG. 34 depicts the side-surface cross-section in which the descending order in terms of the sizes of the horizontal outline shapes is the solid-state imaging element 11, the IRCFs 14-1 and 14-2, the adhesive 15, and the glass substrate 12.

Here, a method of forming the side-surface cross-section depicted in the upper right portion in FIG. 31 is explained with reference to the central row in FIG. 34. Note that the central row in FIG. 34 is an enlarged view of the boundary between adjacent solid-state imaging elements 11 to be cut by dicing as seen from the side surface.

At a first step, the area Zb including the glass substrate 12, the IRCFs 14-1 and 14-2, and the adhesive 15 is cut to a depth Lc21 from the surface layer of the IRCF 14-2 by using a blade having a predetermined width Wb1 (e.g. approximately 100 μm).

At a second step, ablation processing using a laser is performed with the predetermined width Wb2 (<width Wb1), and an area ZL is cut to a depth larger than the depth of the wiring layer 11M.

At this step, the IRCFs 14-1 and 14-2 and the adhesive 15 experience thermal contraction due to absorption of laser light near the processed surfaces, and thereby the adhesive 15 recedes relative to the cut surfaces of the IRCFs 14-1 and 14-2 due to the wavelength dependence, and forms a concave shape.

At a third step, for example, an area Zh which is in the Si substrate (the semiconductor substrate 81 in FIG. 6), and has the predetermined width Wd (e.g. approximately 35 μm) smaller than the width Wb2 is cut by dry etching, laser dicing, or a blade, and thereby the solid-state imaging elements 11 are diced. It should be noted that the width Wd becomes approximately zero in the case of laser dicing. In addition, the cutting shape can be adjusted to a desired shape by dry etching, laser dicing, or a blade.

As a result, as depicted on the lower row in FIG. 34, the side-surface cross-section is formed such that the horizontal outline shape of the solid-state imaging element 11 is the largest, the outline shapes of the IRCFs 14-1 and 14-2 are the second largest, furthermore the outline shape of the adhesive 15 is the third largest, and the outline shape of the glass substrate 12 is the smallest. That is, as represented by an area Z452 on the lower row in FIG. 34, the outline shape of the adhesive 15 is smaller than the outline shapes of the IRCFs 14-1 and 14-2.

Note that, as represented by an area 2453, the lower row in FIG. 34 depicts part, in the horizontal direction, of the IRCF 14-2 as having a horizontal width larger than the horizontal width of the IRCF 14-1. In addition, as represented by an area 2451, part, in the horizontal direction, of the IRCF 14-1 is depicted as having a horizontal width identical to the horizontal width of the glass substrate 12.

Accordingly, the shape of the side-surface cross-section of the glass substrate 12, the IRCFs 14-1 and 14-2, and the adhesive 15 on the lower row in FIG. 34 is different from the shape on the upper row in FIG. 34.

However, this is a result of depicting the cutting shape formed by the blade in a deformed manner, and the configuration on the lower row in FIG. 32 and the configuration on the upper row in the FIG. 32 can be made substantially identical by adjusting the cutting shape by dry etching, laser dicing, or a blade.

In addition, the process of cutting the area Zh in the Si substrate (the semiconductor substrate 81 in FIG. 6) included in the solid-state imaging element 11 may be executed before the work of cutting the areas Zb and ZL, and, at this time, the work may be executed in a vertically reversed state relative to the state depicted in the central row in FIG. 34.

Furthermore, because the wiring layer is prone to cracks or film peeling at the time of blade dicing, the area Zh may be cut by ablation processing using a short pulse laser.

<Dicing Method for Lower Right Portion in FIG. 31>

Next, a dicing method for the lower right portion in FIG. 31 is explained with reference to FIG. 35.

Figure 35:
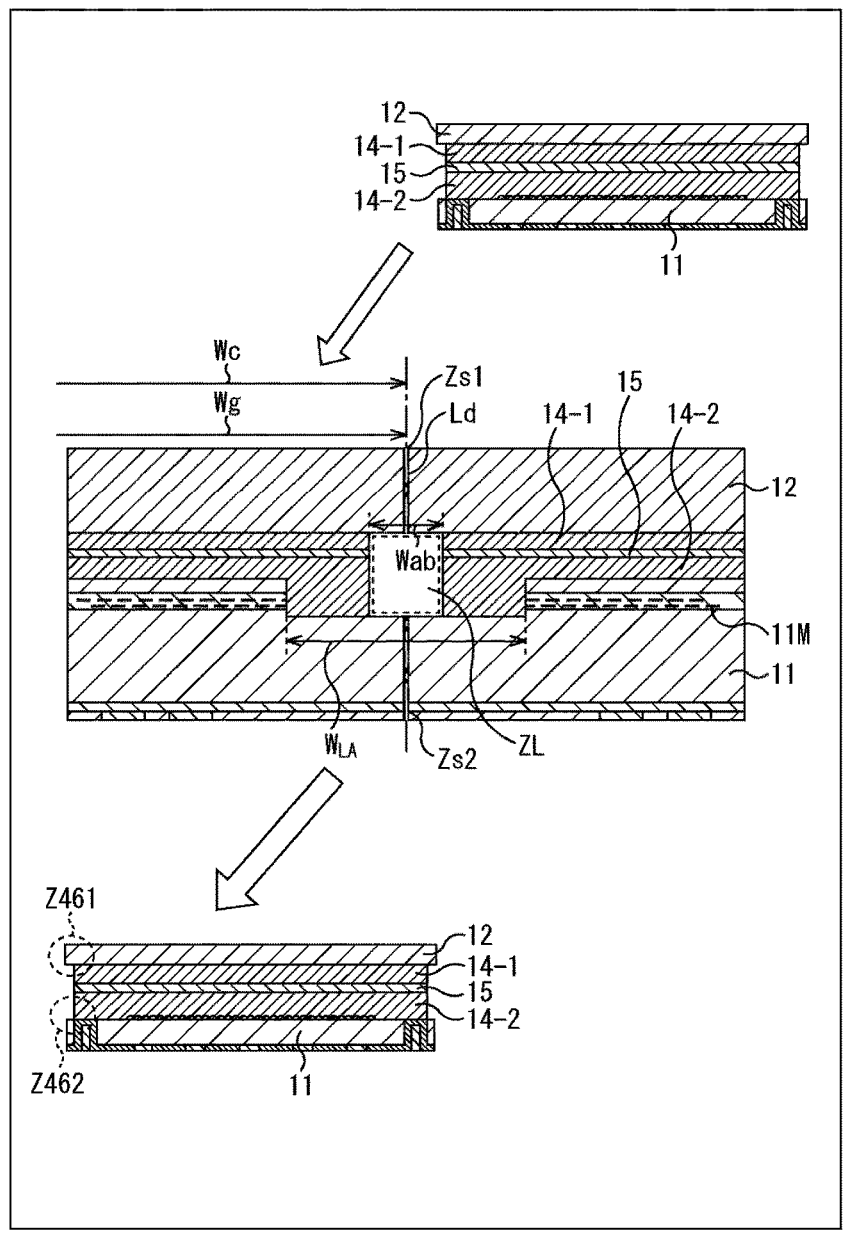
FIG. 35 is a figure for explaining a method of manufacturing the imaging apparatus related to a lower right portion in FIG. 31.

The upper row in FIG. 35 depicts a figure for explaining the side-surface cross-section depicted in the lower right portion in FIG. 31. That is, the upper row in FIG. 35 depicts the side-surface cross-section in which the horizontal outline shape of the solid-state imaging element 11 is the largest, the outline shape of the glass substrate 12 is the second largest, and the outline shapes of the IRCFs 14-1 and 14-2 and the adhesive 15 are the same and additionally are the smallest.

Here, a method of forming the side-surface cross-section depicted in the lower right portion in FIG. 31 is explained with reference to the central row in FIG. 35. Note that the central row in FIG. 35 is an enlarged view of the boundary between adjacent solid-state imaging elements 11 to be cut by dicing as seen from the side surface.

At a first step, an area Zs1 which is in the glass substrate 12, and has a width Ld which is substantially almost zero is cut by generally-called stealth (laser) dicing processing using a laser.

At a second step, ablation processing using a laser is performed with a predetermined width Wab, and the area ZL which is in the IRCFs 14-1 and 14-2 and the solid-state imaging element 11, and has a depth larger than the depth of the wiring layer 11M is cut.

At this step, the IRCFs 14-1 and 14-2 and the adhesive 15 are processed such that the cut surfaces thereof become identical by adjusting the ablation processing using the laser.

At a third step, an area Zs2 having a width which is approximately zero is cut by generally-called stealth (laser) dicing processing using a laser, and the solid-state imaging elements 11 are diced. At this time, organic objects generated by the ablation are discharged to the outside via grooves formed by the stealth dicing processing.

As a result, as represented by areas 2461 and 2462 on the lower row in FIG. 35, the side-surface cross-section is formed such that the horizontal outline shape of the solid-state imaging element 11 is the largest, the outline shape of the glass substrate 12 is the second largest, and the outline shapes of the IRCFs 14-1 and 14-2 and the adhesive 15 are the same and additionally are the smallest.

In addition, the order of the stealth dicing processing on the glass substrate 12 and the stealth dicing processing on the solid-state imaging element 11 may be reversed, and, at this time, the work may be performed in a vertically reversed state relative to the state depicted in the central row in FIG. 35.

<Addition of Anti-Reflection Film>

Figure 36:
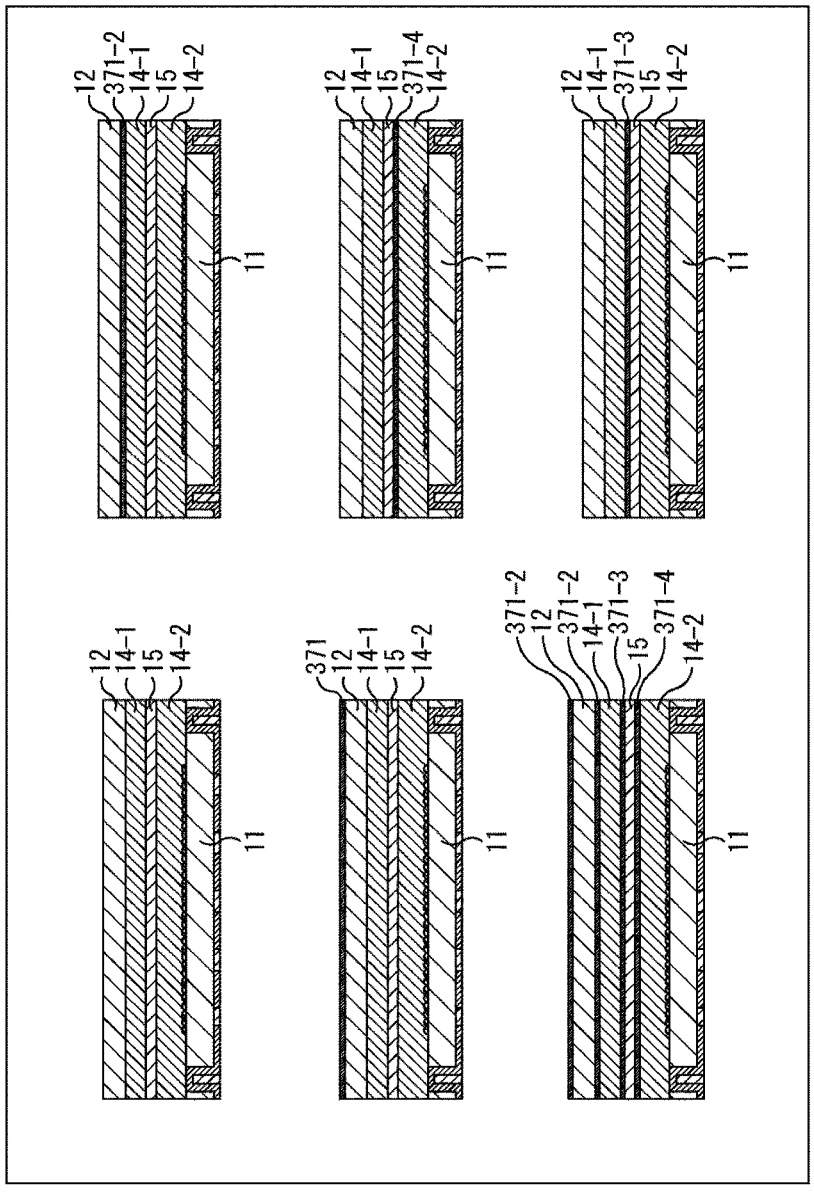
FIG. 36 is a figure for explaining modification examples in which an anti-reflection film is added to the configuration in FIG. 29.

Whereas, as depicted in the upper left portion in FIG. 36, the IRCFs 14-1 and 14-2 are formed on the solid-state imaging element 11 by adhesion by using the adhesive 15, and furthermore the glass substrate 12 is formed on the IRCF 14-1 to reduce occurrence of burrs and also to reduce deterioration of the optical characteristics in the example explained thus far, furthermore, an additional film having an anti-reflection function may be formed.

That is, for example, as depicted in the central left portion in FIG. 36, an additional film 371 having an anti-reflection function may be formed on the glass substrate 12.

In addition, for example, as depicted in the lower left portion in FIG. 36, additional films 371-1 to 371-4 having anti-reflection functions may be formed on the glass substrate 12, at the boundary between the glass substrate 12 and the IRCF 14-1, at the boundary between the IRCF 14-1 and the adhesive 15, and at the boundary between the adhesive 15 and the IRCF 14-2, respectively.

In addition, as depicted in each of the upper right portion, central right portion, and lower right portion in FIG. 36, any one of the additional films 371-2, 371-4, and 371-3 having anti-reflection functions may be formed, and a combination of these may be formed.

Note that the additional films 371 and 371-1 to 371-4 may be formed to include films having functions corresponding to, for example, the AR coat 271*a* or anti-reflection treatment section (moss eye) 291*a* mentioned above.

These additional films 371 and 371-1 to 371-4 prevent entrance of unnecessary light, and reduce occurrence of ghosts and flares.

<Addition to Side-Surface Section>

Whereas the additional films 371-1 to 371-4 having anti-reflection functions are formed on the glass substrate 12, at the boundary between the glass substrate 12 and the IRCF 14-1, at the boundary between the IRCF 14-1 and the adhesive 15, and at the boundary between the adhesive 15 and the IRCF 14-2, respectively, in the examples explained thus far, an additional film that functions as an anti-reflection film or a light absorption film may be formed at the side-surface section.

Figure 37:
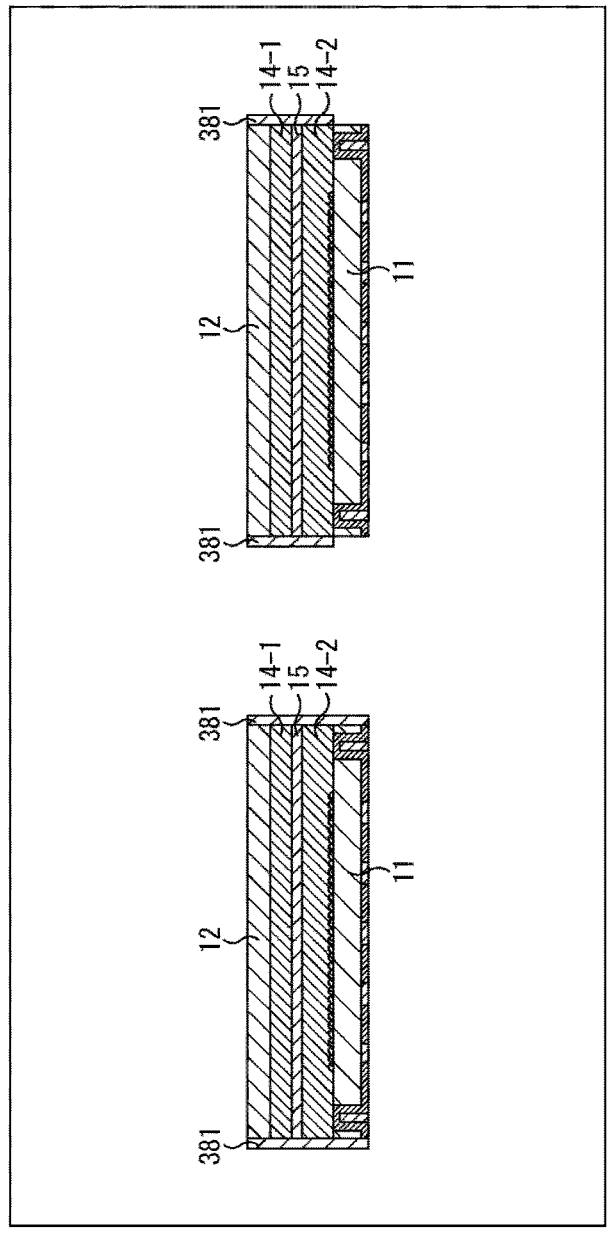
FIG. 37 is a figure for explaining modification examples in which an anti-reflection film is added to the side-surface section in the configuration in FIG. 29.

That is, as depicted in the left portion in FIG. 37, an additional film 381 that functions as an anti-reflection film, a light absorption film, or the like may be formed on the entire side-surface cross-section of the glass substrate 12, the IRCFs 14-1 and 14-2, the adhesive 15, and the solid-state imaging element 11.

In addition, as depicted in the right portion in FIG. 37, the additional film 381 that functions as an anti-reflection film, a light absorption film, or the like may be formed only on the side surface of the glass substrate 12, the IRCFs 14-1 and 14-2, and the adhesive 15, excluding the side surface of the solid-state imaging element 11.

In either case, by providing the additional film 381 at the side-surface section of the solid-state imaging element 11, the glass substrate 12, the IRCFs 14-1 and 14-2, and the adhesive 15, entrance of unnecessary light to the solid-state imaging element 11 is prevented, and occurrence of ghosts and flares is reduced.

17. Seventeenth Embodiment

Whereas dropped garbage is reduced, and also occurrence of flares and ghosts is reduced by adjusting the relation of the horizontal sizes of the solid-state imaging element 11, IRCF 14-1, adhesive 15, IRCF 14-2, and glass substrate 12 that are stacked on one another in the examples explained thus far, a lens which is small-sized and lightweight, and additionally capable of high-resolution imaging may be realized by defining the shape of the lens.

For example, in the case to be considered next, the glass substrate 12 is formed on the solid-state imaging element 11, and a lens corresponding to the lens 271 having the AR coat 271*a* formed thereon is joined on the glass substrate 12 (e.g. the integrated configuration section 10 in the imaging apparatus 1 in FIG. 19). Note that the configuration of the imaging apparatus 1 may be different from the configuration in FIG. 19, and, for example, the same is true also if the lens 131 in the integrated configuration section 10 in the imaging apparatus 1 in FIG. 9 is replaced with the lens 271.

Figure 38:
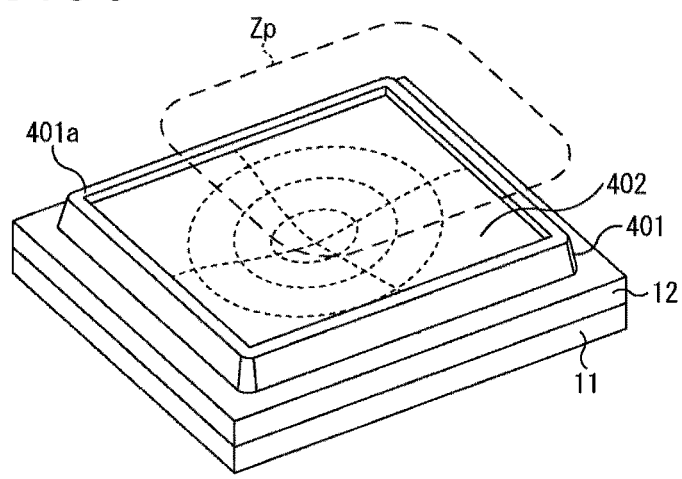
FIG. 38 is a figure for explaining a configuration example of a seventeenth embodiment of the imaging apparatus according to the present disclosure.

That is, it is supposed, as depicted in FIG. 38, that a concave lens 401 (corresponding to the lens 271 in FIG. 19) having an aspherical surface concentrically about the position of the center of gravity seen from above is formed on the glass substrate 12 on the solid-state imaging element 11. In addition, it is supposed that an AR coat 402 (a film having a function corresponding to the AR coat 271*a* or anti-reflection treatment section 291*a* mentioned above) is formed on the light incidence surface of the lens 401, and a protrusion 401*a* is formed on the outer circumferential section. Note that FIG. 38 and FIG. 39 depict a configuration including only the solid-state imaging element 11, the glass substrate 12, and the lens 271 which are selected from the integrated configuration section 10 in the imaging apparatus 1 in FIG. 19.

Figure 39:
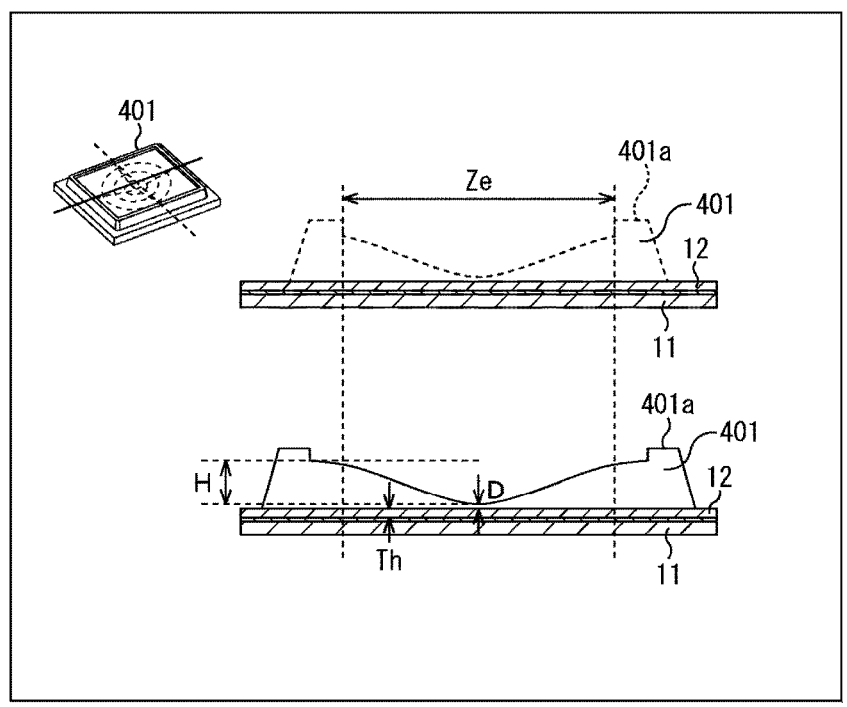
FIG. 39 is a figure for explaining conditions about a thickness of a lens that is small-sized and lightweight, and capable of capturing a high-resolution image.

Here, the lens 401 is given a mortar shape having a concave shape which has an aspherical surface having its center at the position of the center of gravity as seen from above as depicted in FIG. 39. Note that, in FIG. 39, the upper right portion in the figure depicts a cross-sectional shape of the lens 401 taken in a direction represented by a dotted line in the upper left portion in the figure, and the lower right portion in the figure depicts a cross-sectional shape of the lens 401 taken in a direction represented by a solid line in the upper left portion in the figure.

In FIG. 39, an area Ze of the lens 401 has a structure having an aspherical curved surface common to the upper right portion and the lower right portion in FIG. 39, and such a shape is included in an effective region that condenses incident light from above in the figure onto the imaging surface of the solid-state imaging element 11.

In addition, because the lens 401 includes the aspherical curved surface, the thickness changes according to distances from the central position in a direction vertical to the direction of incidence of light. More specifically, the lens thickness is the smallest thickness D at the central position, and the lens thickness at a position which is in the area Ze, and farthest from the center is the largest thickness H. In addition, in a case where the thickness of the glass substrate 12 is a thickness Th, the largest thickness H of the lens 401 is larger than the thickness Th of the glass substrate 12, and the smallest thickness D of the lens 401 is smaller than the thickness Th of the glass substrate 12.

That is, summarizing these relations, by using the lens 401 and the glass substrate 12 that satisfy the relation between the thicknesses D, H, and Th of (thickness H)>(thickness Th)>(thickness D), it becomes possible to realize (the integrated configuration section 10 of) the imaging apparatus 1 that is small-sized and lightweight, and additionally capable of high-resolution imaging.

In addition, by making a volume VG of the glass substrate 12 smaller than a volume VL of the lens 401, it becomes possible to form the volume of the lens most efficiently, and so it becomes possible to realize the imaging apparatus 1 that is small-sized and lightweight, and additionally capable of high-resolution imaging.

<Distributions of Stresses Generated at Time of Heating of AR Coat>

In addition, according to the configuration like the one above, stresses due to expansion or contraction of the AR coat 402 at the time of implementation reflow heat load or at the time of a reliability test can be reduced.

Figure 40:
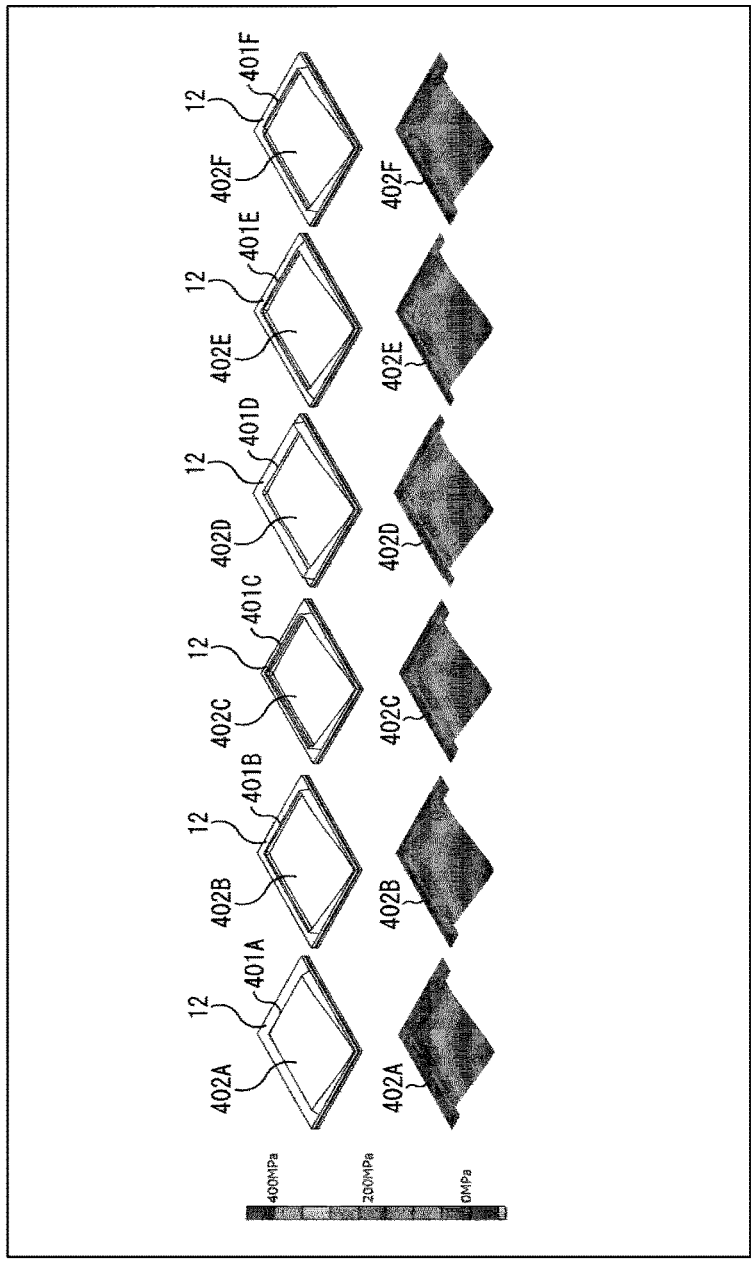
FIG. 40 is a figure for explaining the distributions of stresses applied to an AR coat of the lens at the time of implementation reflow heat load according to shapes of the lens.

FIG. 40 depicts distributions of stresses due to expansion or contraction of the AR coat 402 at the time of implementation reflow heat load about different outline shapes of the lens 401 in FIG. 39. Note that the stress distributions in FIG. 40 are distributions in an area which is ½ in both the horizontal direction and the vertical direction relative to the central position of the lens 401 depicted in an area Zp depicted in FIG. 38, and are distributions in an area which is ¼ of the whole.

The leftmost example in FIG. 40 depicts the distribution of stresses generated, at the time of implementation reflow heat load, to an AR coat 402A in a lens 401A not provided with the protrusion 401*a*.

The second example from left in FIG. 40 depicts the distribution of stresses generated, at the time of implementation reflow heat load, to an AR coat 402B in a lens 401B provided with the protrusion 401a depicted in FIG. 39.

The third example from left in FIG. 40 depicts the distribution of stresses generated, at the time of implementation reflow heat load, to an AR coat 402C in a lens 401C having the protrusion 401a that is depicted in FIG. 39, and has a height which is taller than in the case depicted in FIG. 39.

The fourth example from left in FIG. 40 depicts the distribution of stresses generated, at the time of implementation reflow heat load, to an AR coat 402D in a lens 401D having the protrusion 401a that is depicted in FIG. 39, and has a width which is larger than in the case depicted in FIG. 39.

The fifth example from left in FIG. 40 depicts the distribution of stresses generated, at the time of implementation reflow heat load, to an AR coat 402E in a lens 401E having the protrusion 401a that is depicted in FIG. 39, and includes a tapered shape provided on the outer circumferential section and more inclined than in the case depicted in FIG. 39.

The rightmost portion in FIG. 40 depicts the distribution of stresses generated, at the time of implementation reflow heat load, to an AR coat 402F in a lens 401F provided with the protrusion 401a depicted in FIG. 39 only at the four sides included in the outer circumferential section of the lens 401F.

As depicted in FIG. 40, in the distribution of stresses generated to the AR coat 402A of the lens 401A without the protrusion 401a depicted in the leftmost portion, larger stresses appear on the outer circumferential side of the effective region, but in the distribution of stresses generated to the AR coats 402B to 402F of the lenses 401B to 401F having the protrusion 401a formed thereon, there are no large stresses like those observed in the case of the AR coat 402A.

That is, by providing the protrusion 401a on the lens 401, it becomes possible to reduce occurrence of cracks of the AR coat 402 due to expansion or contraction of the lens 401 at the time of implementation reflow heat load.

<Modification Examples of Lens Shape>

In the example explained thus far, the concave lens 401 including the protrusion 401a provided with a tapered shape at the outer circumferential section as depicted in FIG. 39 is included in the imaging apparatus 1 that is small-sized and lightweight, and additionally capable of high-resolution imaging. However, as long as the lens 401 and the glass substrate 12 satisfy the relation between the thicknesses D, H, and Th of (thickness H)>(thickness Th)>(thickness D), the shape of the lens 401 may be another shape. In addition, it is more preferable if the volumes VG and VL satisfy the relation of (volume VG)<(volume VL).

Figure 41:
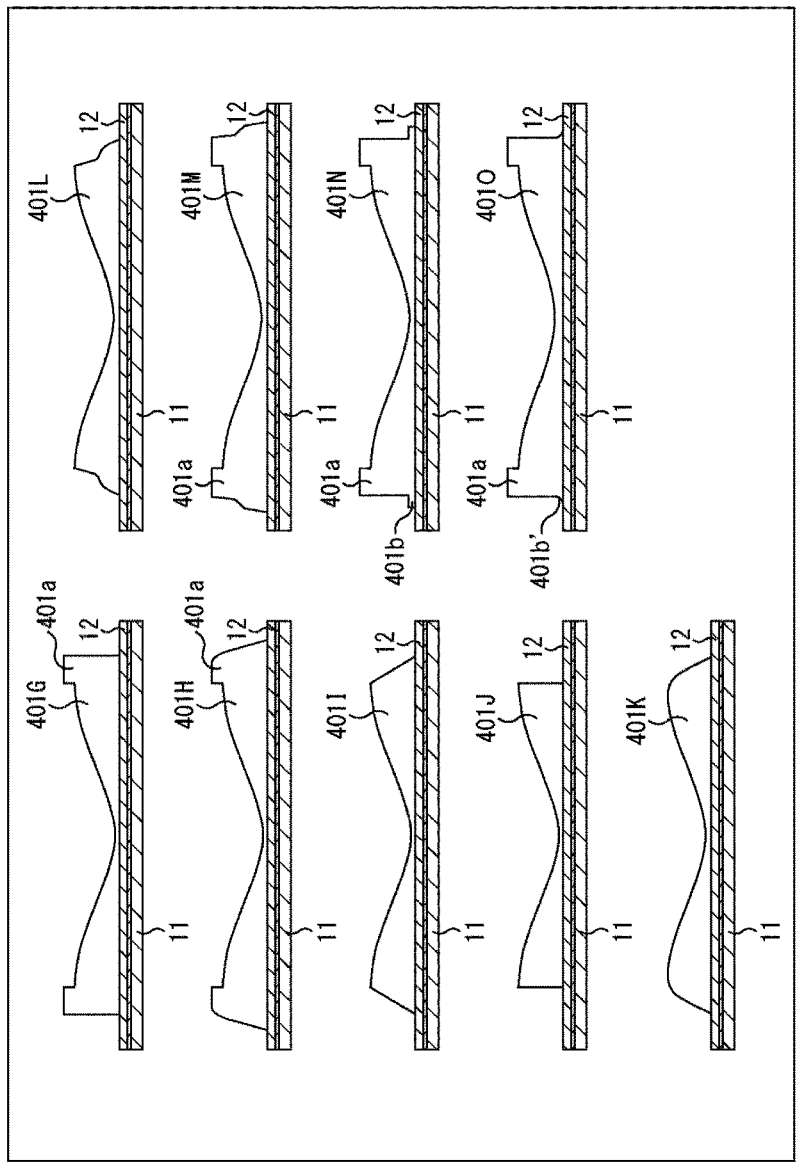
FIG. 41 is a figure for explaining modification examples of the lens shape in FIG. 39.

For example, as represented by a lens 401G in FIG. 41, as a configuration in which the side surface on the outer circumferential side relative to the protrusion 401a is at a right angle to the glass substrate 12, a configuration not including a tapered shape may be adopted.

In addition, as represented by a lens 401H in FIG. 41, the side surface on the outer circumferential side relative to the protrusion 401a may have a configuration including a rounded tapered shape.

Furthermore, as represented by a lens 401I in FIG. 41, a configuration not including the protrusion 401a itself, but having a side surface including a linear tapered shape that forms a predetermined angle with the glass substrate 12 may be adopted.

In addition, as represented by a lens 401J in FIG. 41, as a configuration not including the protrusion 401a itself, but having a side surface that forms a right angle with the glass substrate 12, a configuration not including a tapered shape may be adopted.

Furthermore, as represented by a lens 401K in FIG. 41, a configuration not including the protrusion 401a itself, but having a side surface including a rounded tapered shape relative to the glass substrate 12 may be adopted.

In addition, as represented by a lens 401L in FIG. 41, a two-step configuration not including the protrusion 401a itself, but having a lens side surface having two inflection points may be adopted. Note that the specific configuration of the lens 401L is mentioned later with reference to FIG. 42. In addition, because the side surface of the lens 401L has a two-step configuration having two inflection points, the lens 401L is referred to also as a two-step side-surface lens in explanations below.

Furthermore, as represented by a lens 401M in FIG. 41, a two-step configuration having a side surface including the protrusion 401a, and additionally having an outline side surface including two inflection points may be adopted.

In addition, as represented by a lens 401N in FIG. 41, a configuration including the protrusion 401a and having a side surface which is at a right angle to the glass substrate 12 may further have a rectangular skirt section 401b additionally near the boundary that faces the glass substrate 12.

Furthermore, as represented by a lens 401N in FIG. 41, a configuration including the protrusion 401a and forming a right angle with the glass substrate 12 may further have a rounded skirt section 401b' additionally near the boundary that faces the glass substrate 12.

<Specific Configuration of Two-Step Side-Surface Lens>

Here, the specific configuration of the two-step side-surface lens 401L in FIG. 41 is explained with reference to FIG. 42.

Figure 42:
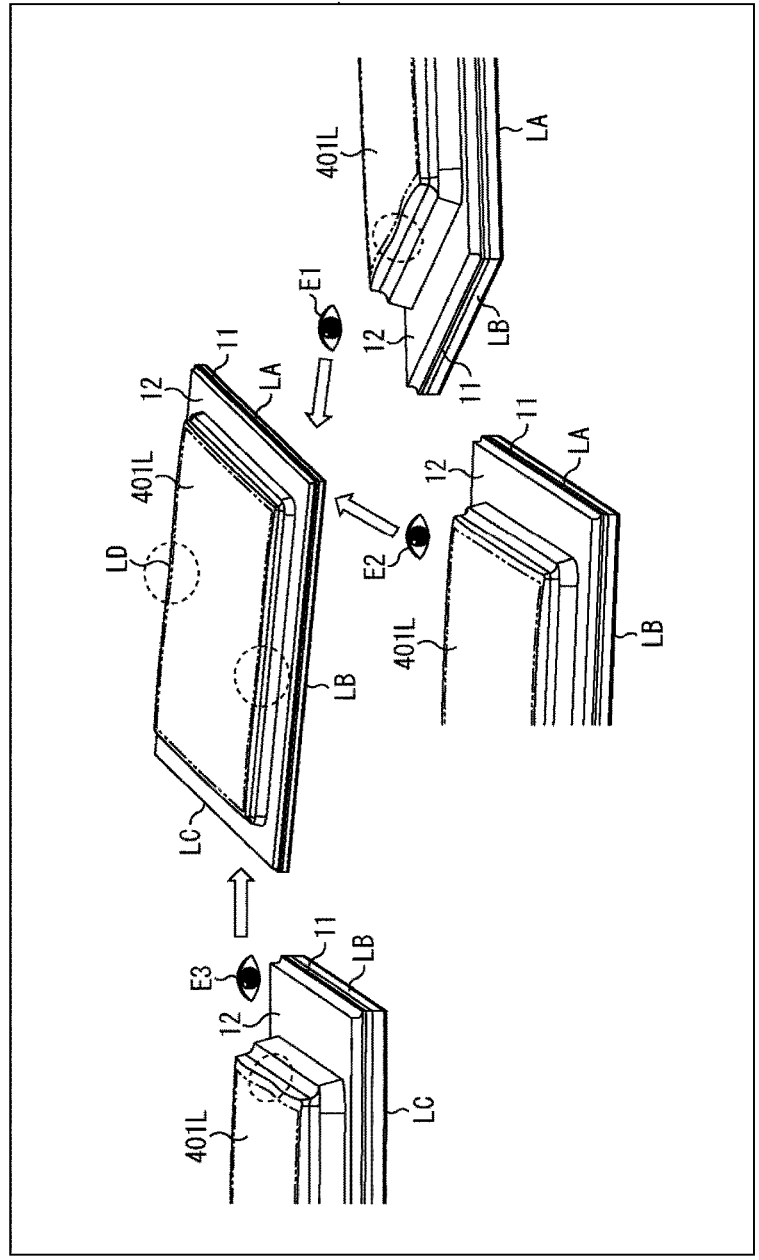
FIG. 42 is a figure for explaining the shape of a two-step side-surface lens in FIG. 41.

FIG. 42 depicts external appearance perspective views as seen from various directions when the glass substrate 12 is formed on the solid-state imaging element 11, and the two-step side-surface lens 401L is provided on the glass substrate 12. Here, in the central upper portion in FIG. 42, sides LA, LB, LC, and LD are set clockwise starting from the right side of the solid-state imaging element 11 in the figure.

Then, the right portion in the FIG. 42 depicts a perspective view of portions around angled sections of the sides LA and LB of the solid-state imaging element 11 when the solid-state imaging element 11 and the lens 401L are seen in the direction of a line of sight E1 in the central upper portion in FIG. 42. In addition, the central lower portion in the FIG. 42 depicts a perspective view of portions around angled sections of the sides LA and LB of the solid-state imaging element 11 when the solid-state imaging element 11 and the lens 401L are seen in the direction of a line of sight E2 in the central upper portion in FIG. 42. Furthermore, the left portion in the FIG. 42 depicts a perspective view of portions around angled sections of the sides LB and LC of the solid-state imaging element 11 when the solid-state imaging element 11 and the lens 401L are seen in the direction of a line of sight E3 in the central portion in FIG. 42.

That is, because, when the two-step side-surface lens 401L as a concave lens is seen from above, the central sections of the sides LB and LD (not depicted), which are longer sides of the two-step side-surface lens 401L, are at positions close to the position of the center of gravity of a circular shape that functions as a lens having the smallest lens thickness, the lens thickness is small at those positions, and the central sections of the sides LB and LD have ridge lines having gently curved shapes as represented by dotted lines surrounding the central sections.

In contrast to this, the central sections of the sides LA and LC, which are shorter sides, are at positions far from the position of the center of gravity, so the lens thickness is large at those positions, and thereby the central sections of the sides LA and LC have ridge lines having linear shapes.

<Two Inflection Points and Two-Step Side Surface>

Figure 43:
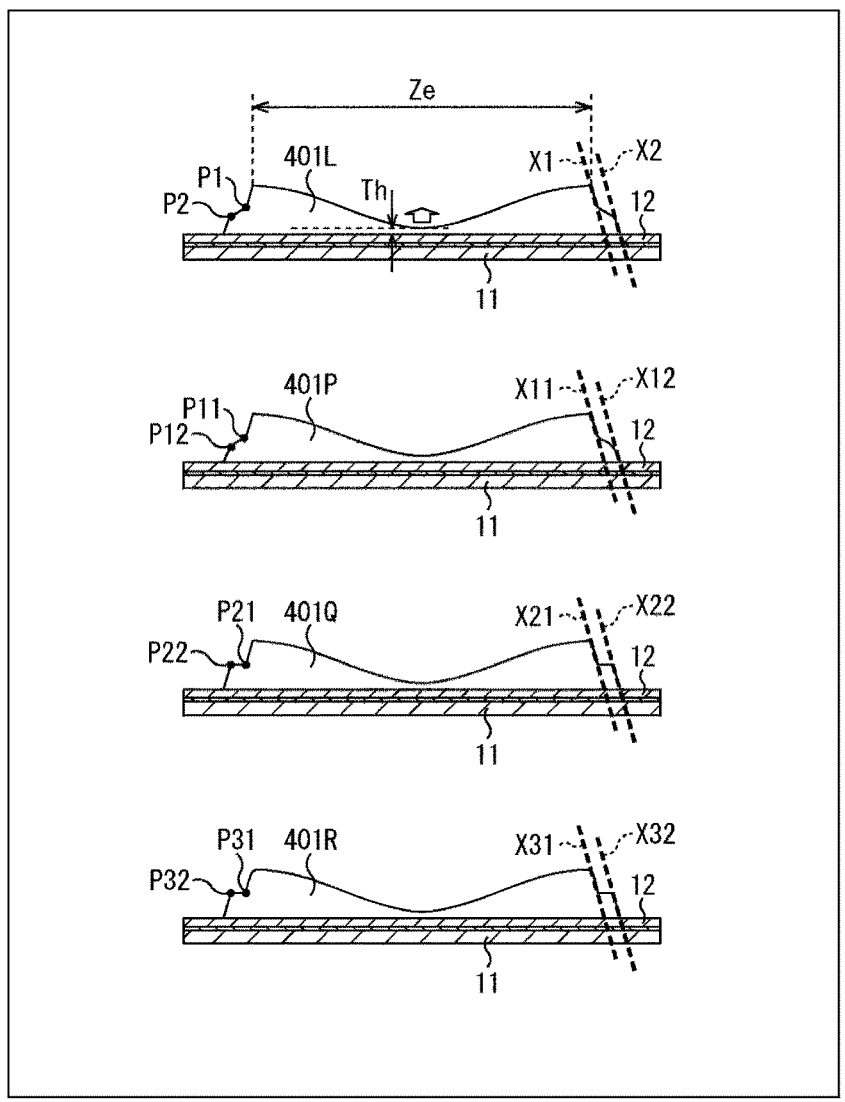
FIG. 43 is a figure for explaining modification examples of the shape of the two-step side-surface lens in FIG. 41.

In addition, as depicted in FIG. 43, the two-step side-surface lens 401L has a cross-sectional shape in which the side surface of the non-effective region provided on the outer side of an effective region Ze has a two-step configuration, average surfaces X1 and X2 of the side surface are formed to be not flush with each other, and inflection points P1 and P2 in the cross-sectional shape are formed at positions where steps are formed on the two-step side surface.

The inflection points P1 and P2 appear as a concave corner and a convex corner in this order starting from the position closer to the solid-state imaging element 11.

In addition, the heights of both the inflection points P1 and P2 from the glass substrate 12 are larger than the smallest thickness Th of the two-step side-surface lens 401L.

Furthermore, it is desirable if the difference between the average surfaces X1 and X2 of the two-step side surface (the distance between the average surfaces X1 and X2) is larger than the thickness of the solid-state imaging element 11 (the thickness of the silicon substrate 81 of the solid-state imaging element 11 in FIG. 6).

In addition, it is desirable if the distance difference between the average surfaces X1 and X2 of the two-step side surface is equal to or larger than 1% of a region width (e.g. the horizontal width He or the vertical height Ve in FIG. 23) of the effective region of the lens 401L vertical to the direction of incidence of light.

Accordingly, as long as a two-step side surface and two inflection points that satisfy the conditions mentioned above are formed, a shape other than the shape of the two-step side-surface lens 401L may be adopted. For example, as depicted on the second row from top in FIG. 43, a two-step side-surface lens 401P provided with a two-step side surface including average surfaces X11 and X12, and having inflection points P11 and P12 that are formed at positions higher than the position of the smallest thickness Th of the lens from the glass substrate 12, and have curvatures different from the curvatures of the inflection points P1 and P2 may be adopted.

In addition, for example, as depicted on the third row from top in FIG. 43, a two-step side-surface lens 401Q provided with a two-step side surface including average surfaces X21 and X22, and having inflection points P21 and P22 that are formed at positions higher than the position of the smallest thickness Th of the lens from the glass substrate 12, and have curvatures different from the curvatures of the inflection points P1 and P2, and P11 and P22 may be adopted.

Furthermore, for example, as depicted on the fourth row from top in FIG. 43, a two-step side-surface lens 401R provided with a two-step side surface including average surfaces X31 and X32, having inflection points P31 and P32 formed at positions higher than the position of the smallest thickness Th of the lens from the glass substrate 12, and having rounded shapes at the end section of the lens 401 at positions where the lens 401 has the largest thickness may be adopted.

<Distributions of Stresses Generated at Time of Heating of AR Coat in Lens Including Two Inflection Points and Two-Step Configuration Side Surface>

As mentioned above, in the case of the two-step side-surface lens 401L including two inflection points and a two-step configuration side surface, stresses applied to the AR coat 402 due to expansion or contraction of the lens 401L at the time of implementation reflow heat load or at the time of a reliability test can be reduced.

Figure 44:
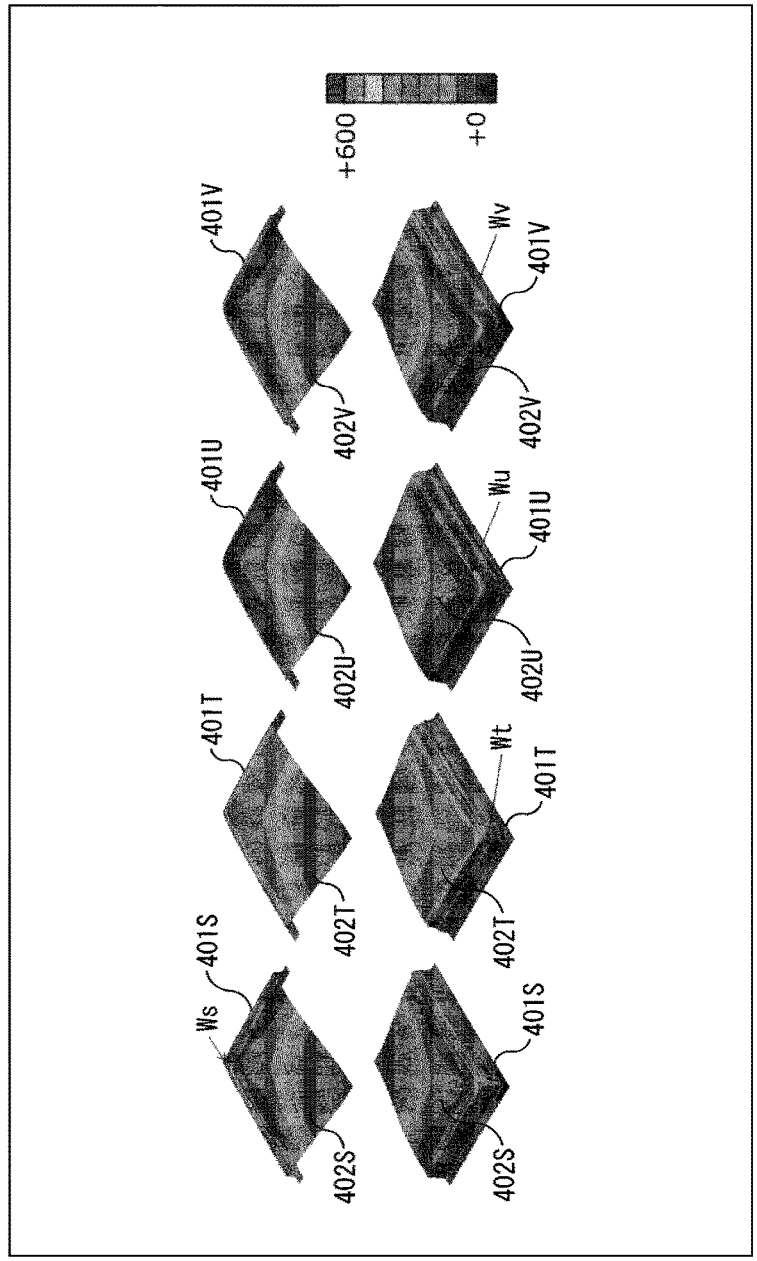
FIG. 44 is a figure for explaining the distributions of stresses applied onto the AR coat on the two-step side-surface lens in FIG. 41 at the time of implementation reflow heat load of the lens.

FIG. 44 depicts distributions of stresses due to expansion or contraction of the AR coat 402 at the time of implementation reflow heat load about different outline shapes of the lens 401 in FIG. 39. In FIG. 44, the upper row depicts stress distributions of the AR coat 402 on the farther side as seen in a diagonal direction of the lens 401, and the lower row depicts stress distributions of the AR coat 402 on the nearer side as seen in the diagonal direction of the lens 401.

The leftmost example in FIG. 44 depicts the distribution of stresses generated, at the time of implementation reflow heat load, to an AR coat 402S in a lens 401S (corresponding to the lens 401A) which is not provided with the protrusion 401a, and is not a two-step side-surface lens.

The second example from left in FIG. 44 depicts the distribution of stresses generated, at the time of implementation reflow heat load, to an AR coat 402T in a lens 401T corresponding to the two-step side-surface lens 401L depicted in FIG. 43.

The third example from left in FIG. 44 depicts the distribution of stresses generated, at the time of implementation reflow heat load, to an AR coat 402U in a lens 401U not provided with the protrusion 401a, but provided with a tapered shape, and additionally having angled sections at the sides of the lens that are shaped in rounded shapes.

The fourth example from left in FIG. 44 depicts the distribution of stresses generated, at the time of implementation reflow heat load, to an AR coat 402V in a lens 401V provided with neither the protrusion 401a nor a tapered shape, but having a side surface vertical to the glass substrate 12, and additionally having angled sections of the sides of the lens that are shaped in rounded shapes.

Figure 45:
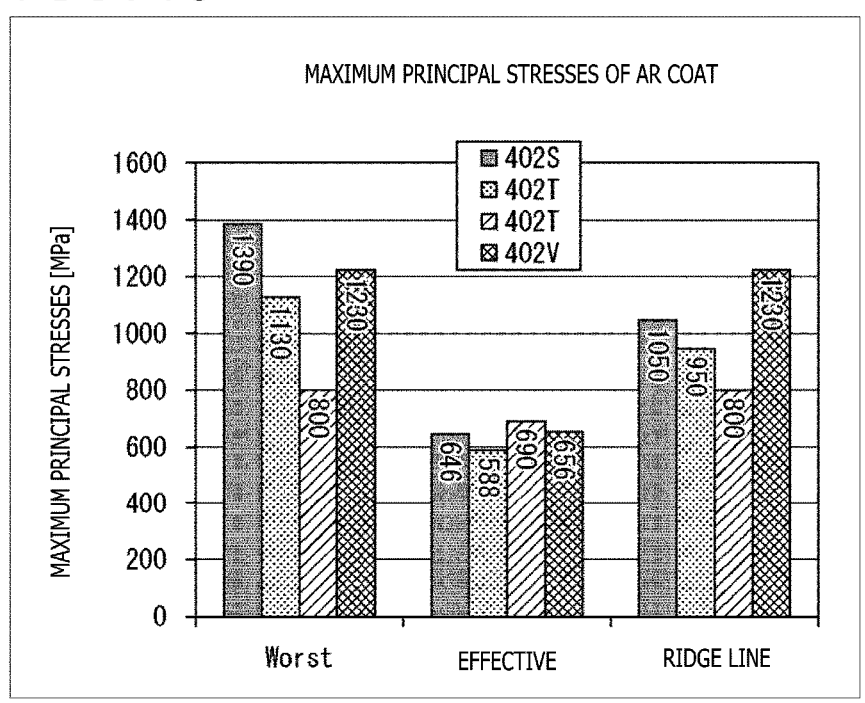
FIG. 45 is a figure for explaining the maximum values in the distributions of stresses applied onto the AR coat on the lens at the time of implementation reflow heat load in FIG. 44.

In addition, FIG. 45 depicts graphs of the overall maximum value (Worst), the maximum value in the effective region of the lens (Effective), and the maximum value at the ridge line (Ridge line) in the distributions of stresses generated to the AR coat about each lens shape in FIG. 44, in this order from left. In addition, the graphs of the maximum values in FIG. 45 represent the maximum values of the stress distributions of the AR coats 402S to 402V, in this order from left.

As depicted in FIG. 45, the overall maximum stresses of the lenses are 1390 MPa at an angled section Ws (FIG. 44) on the top surface in the case of the AR coat 402S of the lens 401S, 1130 MPa at an angled section Wt (FIG. 44) on the ridge line in the case of the AR coat 402T of the lens 401T, 800 MPa at Wu (FIG. 44) on the ridge line in the case of the AR coat 402U of the lens 401U, and 1230 MPa at Wv (FIG. 44) on the ridge line in the case of the AR coat 402V of the lens 401V.

In addition, as depicted in FIG. 45, the maximum stresses of the effective regions of the lenses are 646 MPa in the case of the AR coat 402S of the lens 401S, 588 MPa in the case of the AR coat 402T of the lens 401T, 690 MPa in the case of the AR coat 402U of the lens 401U, and 656 MPa in the case of the AR coat 402V of the lens 401V.

Furthermore, the maximum stresses of the ridge lines of the lenses are 1050 MPa in the case of the AR coat 402S of the lens 401S, 950 MPa in the case of the AR coat 402T of the lens 401T, 800 MPa in the case of the AR coat 402U of the lens 401U, and 1230 MPa in the case of the AR coat 402U of the lens 401V.

According to FIG. 45, in any of the graphs, the maximum stresses become the smallest in the case of the AR coat 402S of the lens 401S. However, according to FIG. 44, stresses which are present in a large amount in areas close to the outer circumferential section of the AR coat 402U of the lens 401U, the stress being around 600 MPa, are not distributed in the overall stress distribution of the effective region of the AR coat 402T of the lens 401T, and it can be known that, as a whole, stresses generated to the AR coat 402T of the AR coat 402T (identical to an AR coat 402L) become small in an outline shape including the AR coat 402T of the lens 401T (identical to the lens 401L).

That is, it can be known that, according to FIG. 44 and FIG. 45, at the time of implementation reflow heat load, expansion or contraction generated to the AR coat 402T (402L) of the lens 401T (401L) including two inflection points and two-step configuration side surface are reduced, and stresses generated resulting from expansion or contraction are reduced.

As mentioned above, by adopting the two-step side-surface lens 401L including two inflection points and two-step configuration side surface as the lens 401, it becomes possible to reduce expansion or contraction due to heat at the time of implementation reflow heat load, a reliability test, or the like.

As a result, it becomes possible to reduce stresses generated to the AR coat 402L, and it becomes possible to reduce generation of cracks and generation of peeling of the lens or the like. In addition, because it becomes possible to reduce expansion or contraction of the lens itself, it becomes possible to reduce occurrence of distortions, to reduce image quality deterioration due to an increase of double refraction resulting from distortions, and to reduce occurrence of flares due to an increase of interfacial reflection generated by local changes of the refractive index.

18. Eighteenth Embodiment

Whereas a lens which is small-sized and lightweight, and additionally capable of high-resolution imaging is realized by defining the shape of the lens in the examples explained thus far, a lens which is more small-sized and lightweight, and additionally capable of capturing high-resolution images may be realized by enhancing the reliability of formation of the lens in the solid-state imaging element 11.

Figure 46:
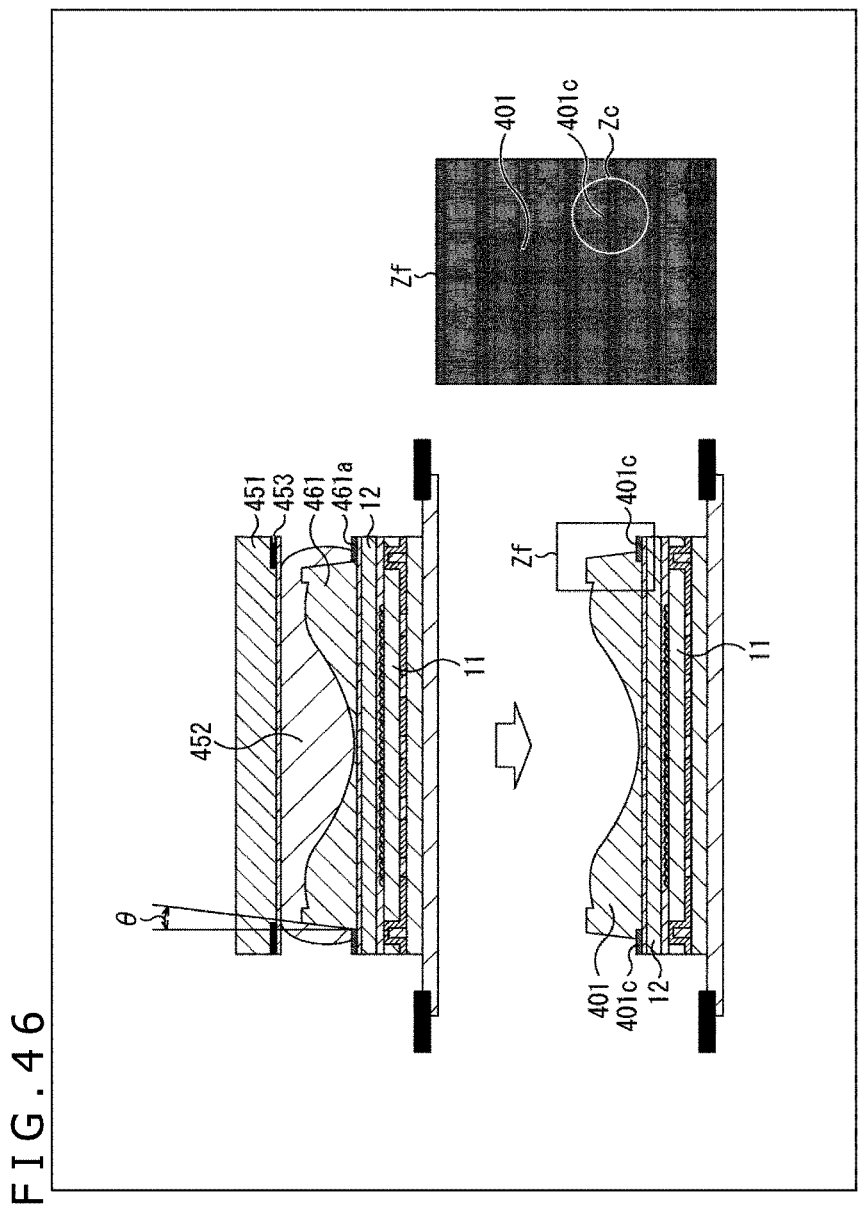
FIG. 46 is a figure for explaining a manufacturing method in an eighteenth embodiment of the imaging apparatus according to the present disclosure.

As depicted in the upper portion in FIG. 46, in a state that a shaping mold 452 on a substrate 451 is pressed against the glass substrate 12 on the solid-state imaging element 11, the space between the shaping mold 452 and the glass substrate 12 is filled with an ultraviolet light curing resin 461 which is to be the material of the lens 401, and the ultraviolet light curing resin 461 is exposed to ultraviolet light from the upper portion in the figure for predetermined time.

Both the substrate 451 and the shaping mold 452 include materials that transmit ultraviolet light.

The shaping mold 452 has a convex structure which has an aspherical surface corresponding to the shape of the concave lens 401, the outer circumferential section of the shaping mold 452 has a light blocking film 453 formed thereon, and a tapered shape can be formed on the side surface of the lens 401 having an angle θ as depicted in FIG. 46, for example, according to the angle of incidence of ultraviolet light.

By being exposed to ultraviolet light for predetermined time, the ultraviolet light curing resin 461 to be the material of the lens 401 is cured, and, as depicted in the lower portion in FIG. 46, formed as a concave lens having an aspherical surface, and also pasted onto the glass substrate 12.

After an elapse of the predetermined time in a state that the ultraviolet light curing resin 461 is irradiated with the ultraviolet light, the ultraviolet light curing resin 461 is cured to thereby form the lens 401, and after the formation of the lens 401, the shaping mold 452 is removed from the formed lens 401 (mold release).

At the boundary between the outer circumferential section of the lens 401 and the glass substrate 12, part of the ultraviolet light curing resin 461 effuses from the shaping mold 452, and an effusion section 461a is generated. However, because ultraviolet light advancing toward the effusion section 461a is blocked by the light blocking film 453, part of the effusion section 461a of the ultraviolet light curing resin 461 is left uncured as represented by an area Zc in an enlarged view Zf, and after the mold is released, the part of the effusion section 461a is cured by ultraviolet light included in natural light, and so is left as a skirt section 401d.

Thereby, the lens 401 is formed as a concave lens by the shaping mold 452, and also a tapered shape is formed on the side surface at the angle θ defined by the light blocking film 453. In addition, because the skirt section 401d is formed at the boundary of the outer circumferential section of the lens 401 that faces the glass substrate 12, it becomes possible to more rigidly adhere the lens 401 to the glass substrate 12.

As a result, it becomes possible to form, highly reliably, a lens which is small-sized and lightweight, and additionally capable of capturing high-resolution images.

Figure 47:
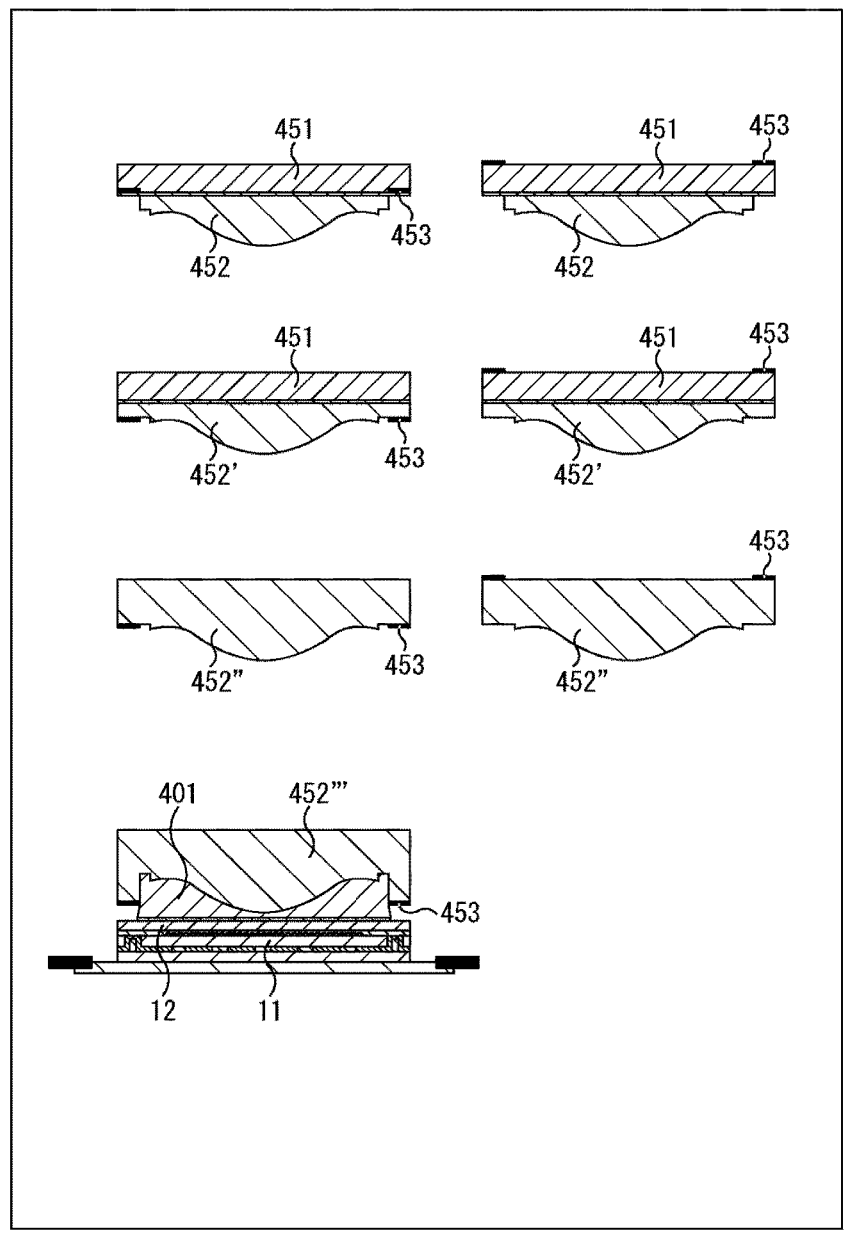
FIG. 47 is a figure for explaining modification examples of the manufacturing method in FIG. 46.

Note that, in the example explained thus far, as depicted in the upper left portion in FIG. 47, the light blocking film 453 is provided at the outer circumferential section of the lens 401 on the backside (the lower side in the figure) of the substrate 451 in terms of the direction of incidence of ultraviolet light. However, as depicted in the upper right portion in FIG. 47, the light blocking film 453 may be provided at the outer circumferential section of the lens 401 on the front side (the upper side in the figure) of the substrate 451 in terms of the direction of incidence of ultraviolet light.

In addition, as depicted in the second example from top in the left column in FIG. 47, instead of the substrate 451, a shaping mold 452' which is larger in the horizontal direction than the shaping mold 452 may be formed, and the light blocking film 453 may be provided at the outer circumferential section of the lens 401 on the backside (the lower side in the figure) in terms of the direction of incidence of ultraviolet light.

Furthermore, as depicted in the second example from top in the right column in FIG. 47, the light blocking film 453 may be provided at the outer circumferential section of the lens 401 on the front side (the upper side in the figure) of the substrate 451 of the shaping mold 452' in terms of the direction of incidence of ultraviolet light.

In addition, as depicted in the third example from top in the left column in FIG. 47, a shaping mold 452" may be formed by integrating the substrate 451 and the shaping mold 452, and the light blocking film 453 may be provided at the outer circumferential section of the lens 401 on the backside (the lower side in the figure) in terms of the direction of incidence of ultraviolet light.

Furthermore, as depicted in the third example from top in the right column in FIG. 47, the shaping mold 452" may be formed by integrating the substrate 451 and the shaping mold 452, and the light blocking film 453 may be provided at the outer circumferential section of the lens 401 on the front side (the upper side in the figure) in terms of the direction of incidence of ultraviolet light.

In addition, as depicted in the lower left portion in FIG. 47, a shaping mold 452''' provided with a configuration to define part of the side-surface section may be formed in addition to the substrate 451 and the shaping mold 452, and the light blocking film 453 may be formed at the outer circumferential section of the shaping mold 452''', and on the backside in terms of the direction of incidence of ultraviolet light.

Note that whereas the configurations in FIG. 46 and FIG. 47 are configurations in which the IRCF 14 and the adhesive 15 in the integrated configuration section 10 of the imaging apparatus 1 in FIG. 9 are omitted, the IRCF 14 and the adhesive 15 are omitted only for convenience of the explanation, and certainly may be provided between the lens 401 (131) and the glass substrate 12. In addition, in explanations below also, configurations that are different from the configuration of the imaging apparatus 1 in FIG. 9 in that the IRCF 14 and the adhesive 15 are omitted are explained as examples, but in any of the configurations, the IRCF 14 and the adhesive 15 may be provided between the lens 401 (131) and the glass substrate 12, for example.

<Method of Forming Two-Step Side-Surface Lens>

Next, a method of manufacturing a two-step side-surface lens is explained.

The manufacturing method is basically similar to the method of manufacturing the lens mentioned above which is not a two-step side-surface type lens.

Figure 48:
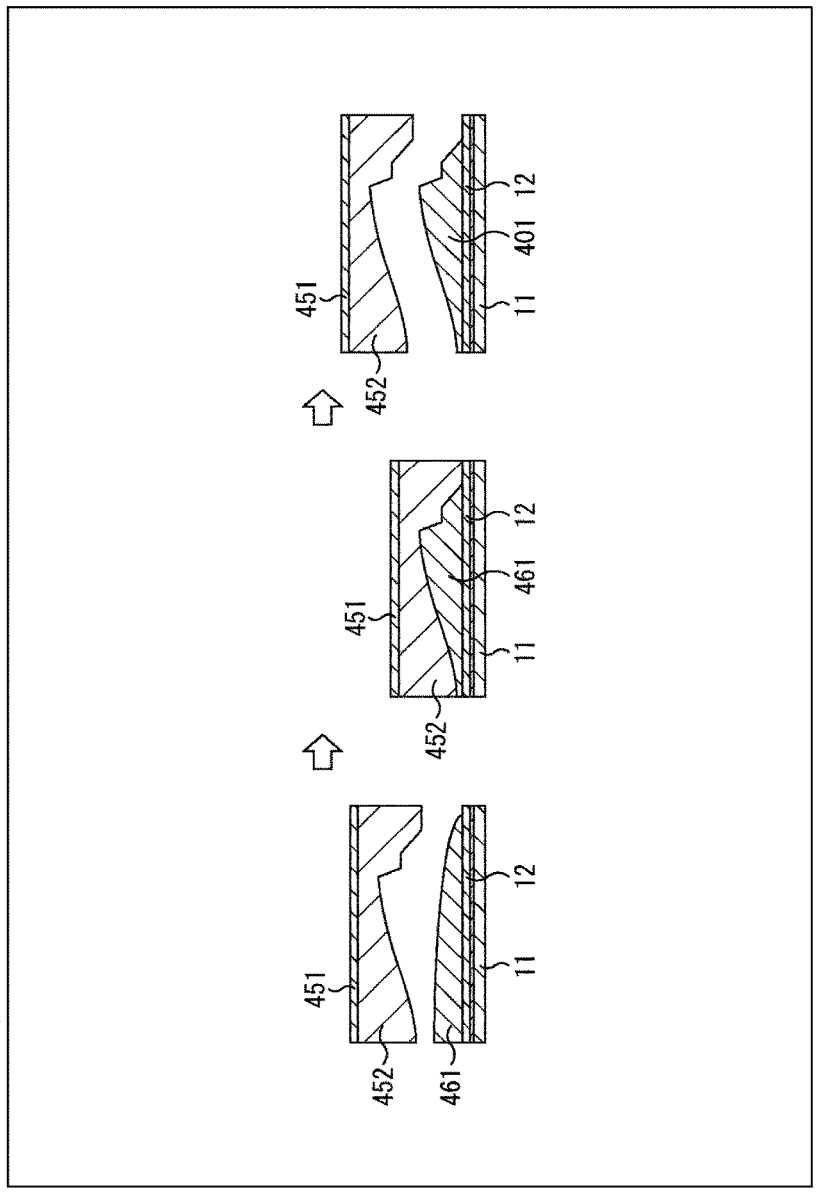
FIG. 48 is a figure for explaining a method of manufacturing the two-step side-surface lens.

That is, as depicted in the left portion in FIG. 48, the shaping mold 452 corresponding to the side surface shape of the two-step side-surface lens 401L is prepared on the substrate 451, and the ultraviolet light curing resin 461 is placed on the glass substrate 12 on the solid-state imaging element 11. Note that the configuration of only the right half of the side-surface cross-section of the shaping mold 452 is depicted in FIG. 48.

Next, as depicted in the central portion in FIG. 48, by fixing the ultraviolet light curing resin 461 on which the shaping mold 452 is placed to the glass substrate 12 by pressing the ultraviolet light curing resin 461 against the glass substrate 12, the concavity of the shaping mold 452 is filled with the ultraviolet light curing resin 461, and the ultraviolet light curing resin 461 is irradiated with ultraviolet light for predetermined time from above in the figure.

By being exposed to the ultraviolet light, the ultraviolet light curing resin 461 is cured, and the concave two-step side-surface lens 401 corresponding to the shaping mold 452 is formed.

After the lens 401 is formed due to the exposure to the ultraviolet light for the predetermined time, as depicted in the right portion in FIG. 48, the shaping mold 452 is released, and then the lens 401 including the two-step side-surface lens is completed.

Figure 49:
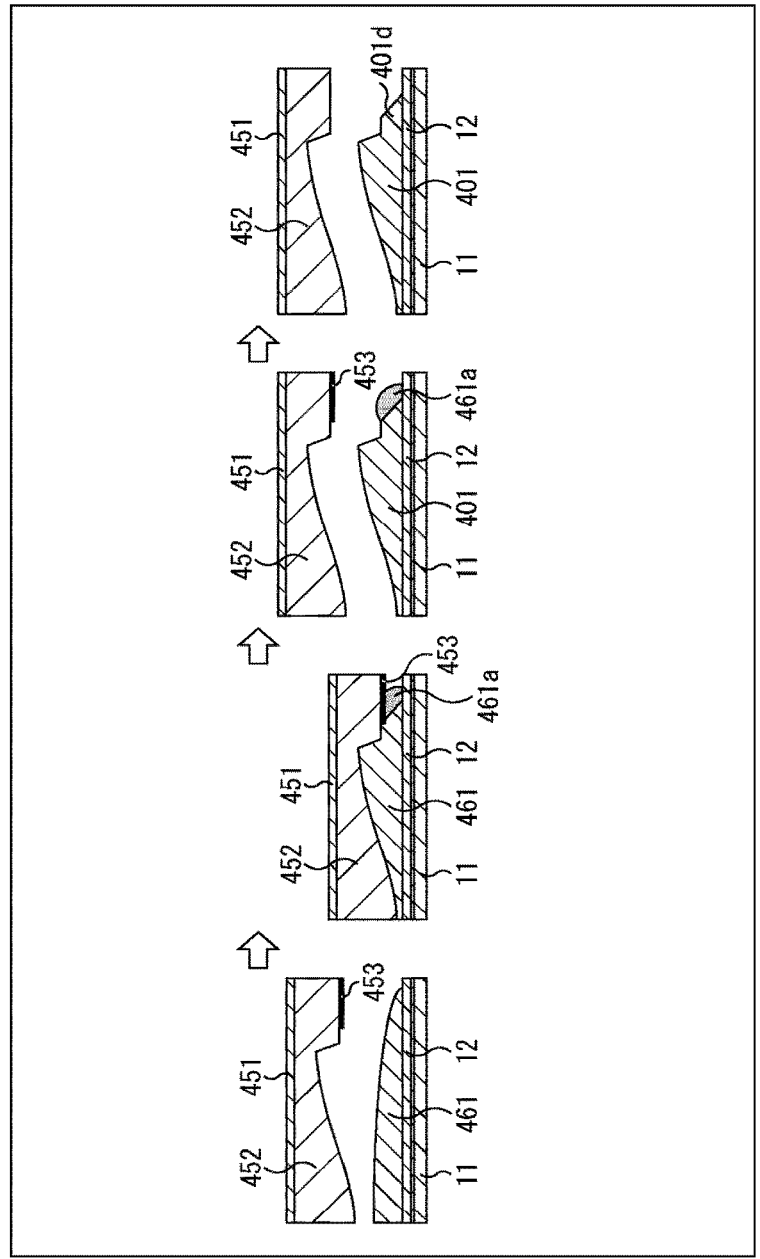
FIG. 49 is a figure for explaining a modification example of the method of manufacturing the two-step side-surface lens.

In addition, as depicted in the left portion in FIG. 49, part that is at the outer circumferential section of the shaping mold 452, is to abut on the glass substrate 12, and, for example, is lower than the height of an inflection point which is one of two inflection points in the cross-sectional shape of the side surface, and is at a position closer to the glass substrate 12 may be cut, and the light blocking film 453 may be provided at the cut surface.

In this case, as depicted in the second example from left in FIG. 49, when the ultraviolet light curing resin 461 is irradiated with ultraviolet light for predetermined time from above in the figure in a state that the concavity of the shaping mold 452 is filled with the ultraviolet light curing resin 461, the ultraviolet light is blocked on a lower section of the light blocking film 453, thereby the curing does not proceed, and the lens 401 remains incomplete. However, the curing of the ultraviolet light curing resin 461 around the effective region in the figure exposed to the ultraviolet light proceeds, and the ultraviolet light curing resin 461 is formed as the lens 401.

When the shaping mold 452 is released in this state, as depicted in the third example from left in FIG. 49, the side surface of a portion which is on the two-step configuration side surface at the outermost circumference of the lens 401 formed as the two-step side-surface lens, and is close to the glass substrate 12 is left as the effusion section 461a of the ultraviolet light curing resin 461 which is uncured.

In view of this, as depicted in the right portion in FIG. 49, for the side surface that is still the effusion section 461a of the ultraviolet light curing resin 461 which is uncured, the angle and the surface roughness of the side surface are controlled, and the surface is irradiated with ultraviolet light separately such that the ultraviolet light curing resin 461 which is uncured is cured.

Figure 50:
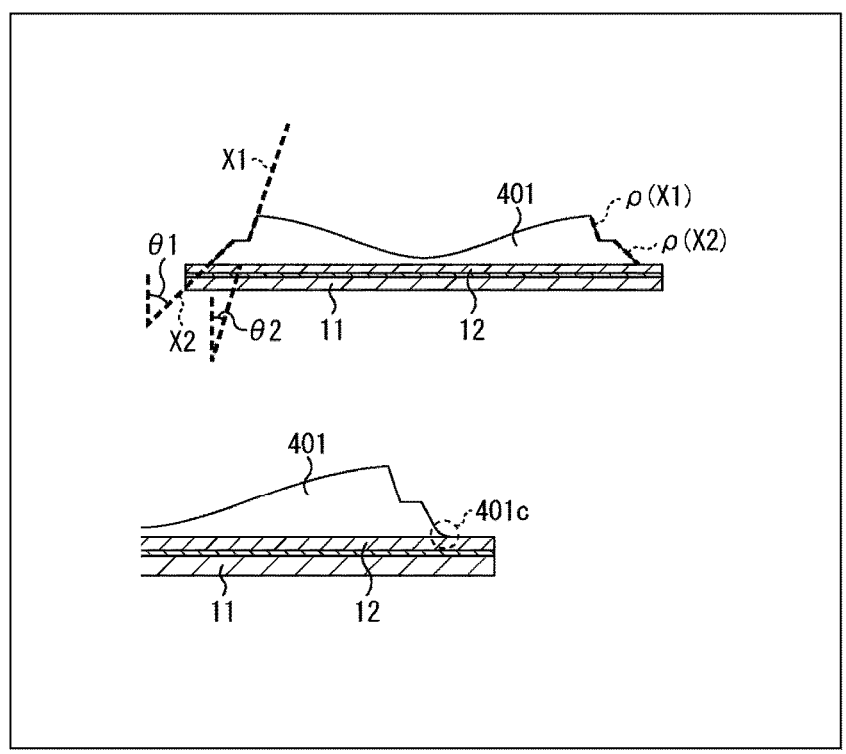
FIG. 50 is a figure for explaining adjustments of angles formed by the average surfaces of side surfaces, adjustments of surface roughness, and provision of a skirt section in the method of manufacturing the two-step side-surface lens in FIG. 49.

By doing so, as depicted on the upper row in FIG. 50, it becomes possible to set the angles formed by the average surfaces X1 and X2 of the side surface of the lens 401 to different angles like angles θ1 and θ2, respectively, relative to the direction of incidence of light, for example.

Here, by adopting a configuration in which the angle θ1 is made smaller than the angle θ2 when the angles of the side surfaces X1 and X2 are the angles θ1 and θ2, respectively, it becomes possible to reduce occurrence of side surface flares, and also to reduce occurrence of peeling of the completed lens 401 off from the glass substrate 12 at the time of mold release of the shaping mold 452.

In addition, it becomes possible to adopt a configuration in which the surface roughness ρ(X1) of the side surface X1 and the surface roughness ρ(X2) of the side surface X2 are different from each other.

Here, by setting the surface roughness ρ(X1) of the side surface X1 and the surface roughness ρ(X2) of the side surface X2 such that the surface roughness ρ(X1) is lower than the surface roughness ρ(X2), it becomes possible to reduce occurrence of side surface flares, and also to reduce occurrence of peeling of the completed lens 401 off from the glass substrate 12 at the time of mold release of the shaping mold 452.

In addition, by adjusting the shape of the effusion section 461a of the ultraviolet light curing resin 461, it becomes possible also to form the skirt section 401d as depicted in the lower portion in FIG. 50. Thereby, it becomes possible to fix the lens 401 to the glass substrate 12 more rigidly.

Note that adjustments regarding the angles θ1 and θ2, the surface roughness ρ(X1) and ρ(X2), and the formation of the skirt section 401d can be performed by modifying the shape of the shaping mold 452, even in a case where the light blocking film 453 explained with reference to FIG. 48 is not used. However, in a case where the shaping mold 452 provided with the light blocking film 453 is used as explained with reference to FIG. 49, the effusion section 461a of the ultraviolet light curing resin 461 which is left as an uncured portion in initial irradiation with ultraviolet light can be adjusted afterward, and so it becomes possible to increase the degree of freedom of adjustments of the angles θ1 and θ2, the surface roughness ρ(X1) and ρ(X2), and the skirt section 401d.

In either case, it becomes possible to form the lens 401 on the glass substrate 12 of the solid-state imaging element 11 highly reliably. In addition, because it becomes possible to make adjustments regarding the angles of the side surface X1 and X2, the surface roughness ρ(X1) and ρ(X2), and whether or not there is the skirt section 401d regarding the two-step side-surface lens 401, it becomes possible to reduce occurrence of flares and ghosts, and also to form the lens 401 on the glass substrate 12 more rigidly.

19. Nineteenth Embodiment

Whereas the lens 401 is formed on the glass substrate 12 on the solid-state imaging element 11 more reliably in a shaping method in the examples explained thus far, the lens 401 may be formed on the glass substrate 12 more reliably by forming an alignment mark on the glass substrate 12 for forming the lens 401 at an appropriate position on the glass substrate 12, and performing positioning on the basis of the alignment mark.

Figure 51:
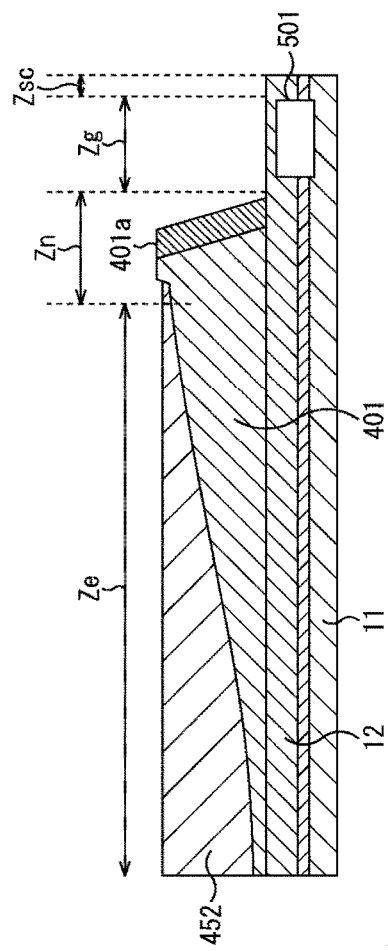
FIG. 51 is a figure for explaining a configuration example of a nineteenth embodiment of the imaging apparatus according to the present disclosure.

That is, as depicted in FIG. 51, the effective region Ze (corresponding to the effective region 131a in FIG. 23) of the lens 401 from the center is provided, the non-effective region Zn (corresponding to the non-effective region 131b in FIG. 23) is provided at the outer circumferential section of the effective region Ze, furthermore a region Zg where the glass substrate 12 is exposed is provided at the outer circumferential section of the non-effective region Zn, and a region Zsc where a scribe line is set is provided at the outermost circumferential section of the solid-state imaging element 11. In FIG. 51, the protrusion 401a is provided in the non-effective region Zn (corresponding to the non-effective region 131b in FIG. 23).

The widths of the regions have a relation of (width of effective region Ze)>(width of non-effective region Zn)> (width of region Zg where glass substrate 12 is exposed)> (width of region Zsc where scribe line is set).

An alignment mark 501 is formed in the region Zg on the glass substrate 12 where the glass substrate 12 is exposed. Accordingly, the size of the alignment mark 501 is a size smaller than the region Zg but needs to be a size that allows recognition of the alignment mark 501 on images that are for alignment.

The alignment mark 501 is formed at positions which are on the glass substrate 12, and, for example, on which angled sections of the lens 401 should abut. Alignment may be performed by making an adjustment such that lens angled sections of the shaping mold 452 are at positions where the alignment mark 501 is provided, on the basis of images captured by an alignment camera.

<Examples of Alignment Mark>

Figure 52:
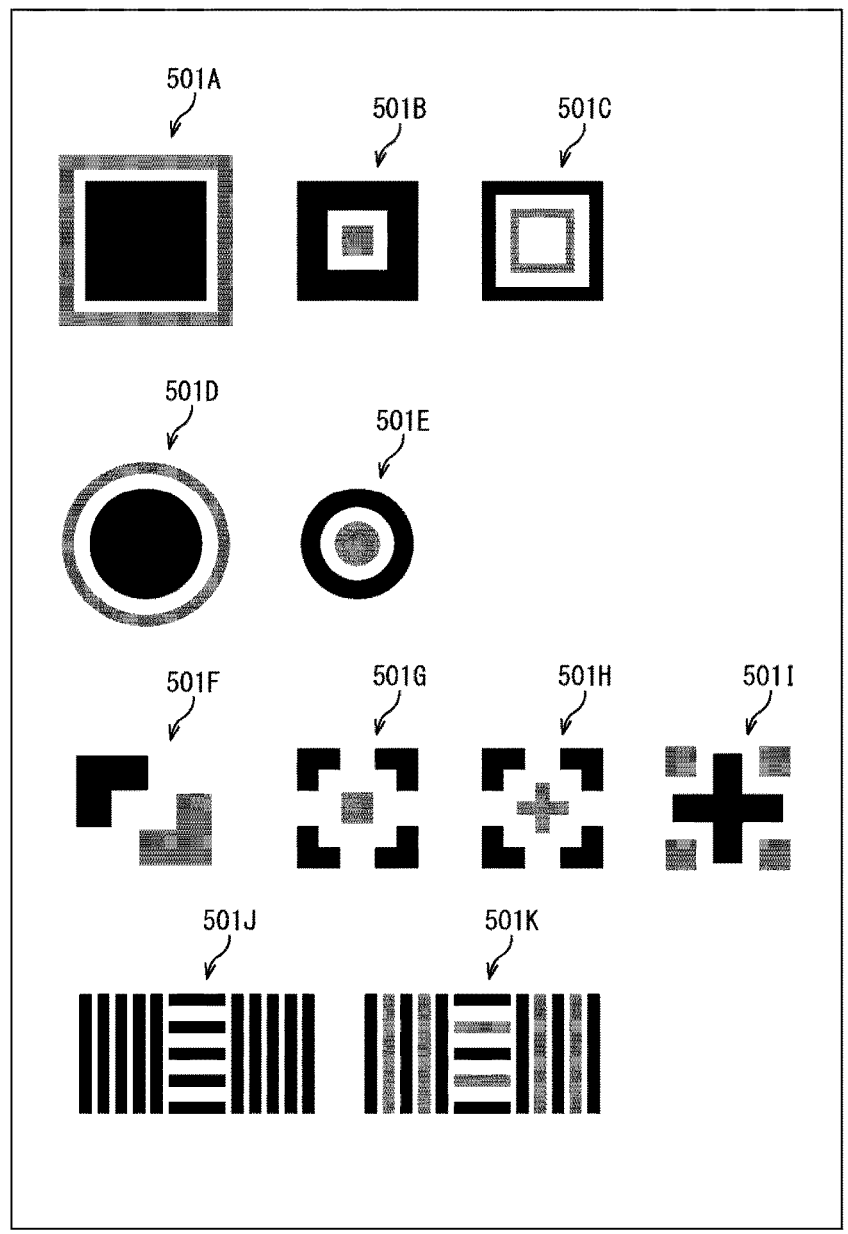
FIG. 52 is a figure for explaining examples of an alignment mark in FIG. 51.

Examples of the alignment mark 501 include alignment marks 501A to 501K or the like as depicted in FIG. 52, for example.

That is, the alignment marks 501A to 501C include rectangles, the alignment marks 501D and 501E include circles, the alignment marks 501F to 501I include polygons, and the alignment marks 501J and 501K include a plurality of linear shapes.

<Examples in which Alignment Marks are Provided on Glass Substrate and to Shaping Mold>

In addition, black portions and gray portions in the alignment marks 501A to 501K may be formed at corresponding positions at the outer circumferential portion of the lens 401 on the shaping mold 452, and the region Zg on the glass substrate 12, respectively, and positional alignment of the lens 401 and the glass substrate 12 may be performed by checking whether the lens 401 and the glass substrate 12 have a mutually corresponding positional relation, on the basis of an image captured by an alignment camera, for example.

That is, in the case of the alignment mark 501A, as depicted in FIG. 52, in order to achieve an appropriate positional relation between the lens 401 and the shaping mold 452, an alignment mark 501' having a gray portion including a rectangular frame is provided on the shaping mold 452, and the alignment mark 501 including a rectangular section which is a black portion is formed.

Figure 53:
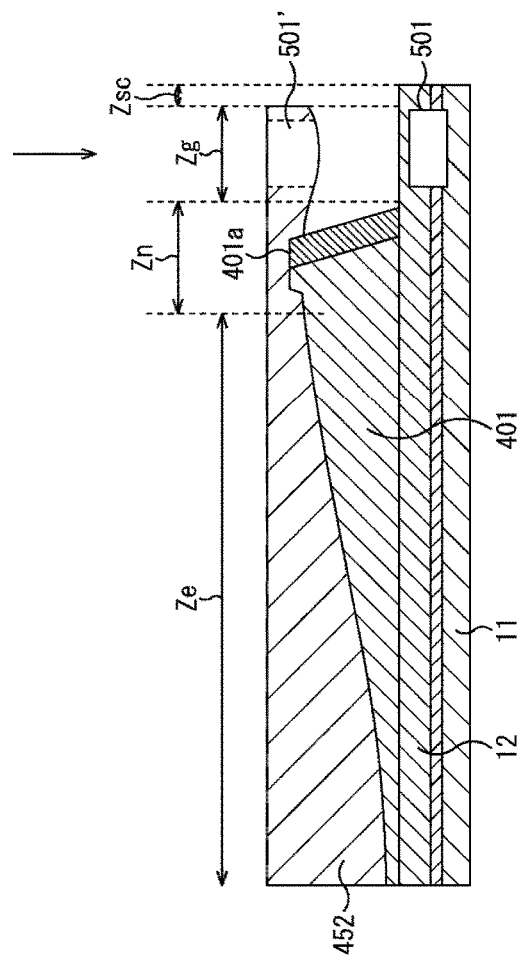
FIG. 53 is a figure for explaining an application example in which the alignment mark in FIG. 51 is used.

Then, alignment may be adjusted by capturing images of the alignment mark 501 on the glass substrate 12 and the alignment mark 501' on the shaping mold 452 by using an alignment camera in the arrow direction in FIG. 53, and adjusting the position of the shaping mold 452 such that, in the captured images, the black rectangular alignment mark 501 overlaps and lies within the alignment mark 501' including the gray rectangular frame.

In this case, whereas it is desirable if the alignment mark 501, which is the black portion, and the alignment mark 501', which is the gray portion, are arranged in the single field of view of a single camera, the positional relation of a plurality of cameras may be calibrated in advance, and alignment may be performed according to a correspondence of the positional relation with the alignment marks 501 and 501' provided at different positions corresponding to the plurality of cameras.

In either case, it becomes possible to position and form the lens 401 on the glass substrate 12 of the solid-state imaging element 11 highly reliably by using the alignment mark 501.

20. Twentieth Embodiment

Whereas the lens 401 and the glass substrate 12 on the solid-state imaging element 11 are positioned and formed highly reliably by using an alignment mark in the examples explained thus far, the sensitivity may be enhanced, and high-resolution imaging may be realized by forming the AR coat 402 on the effective region of the lens 401.

Figure 54:
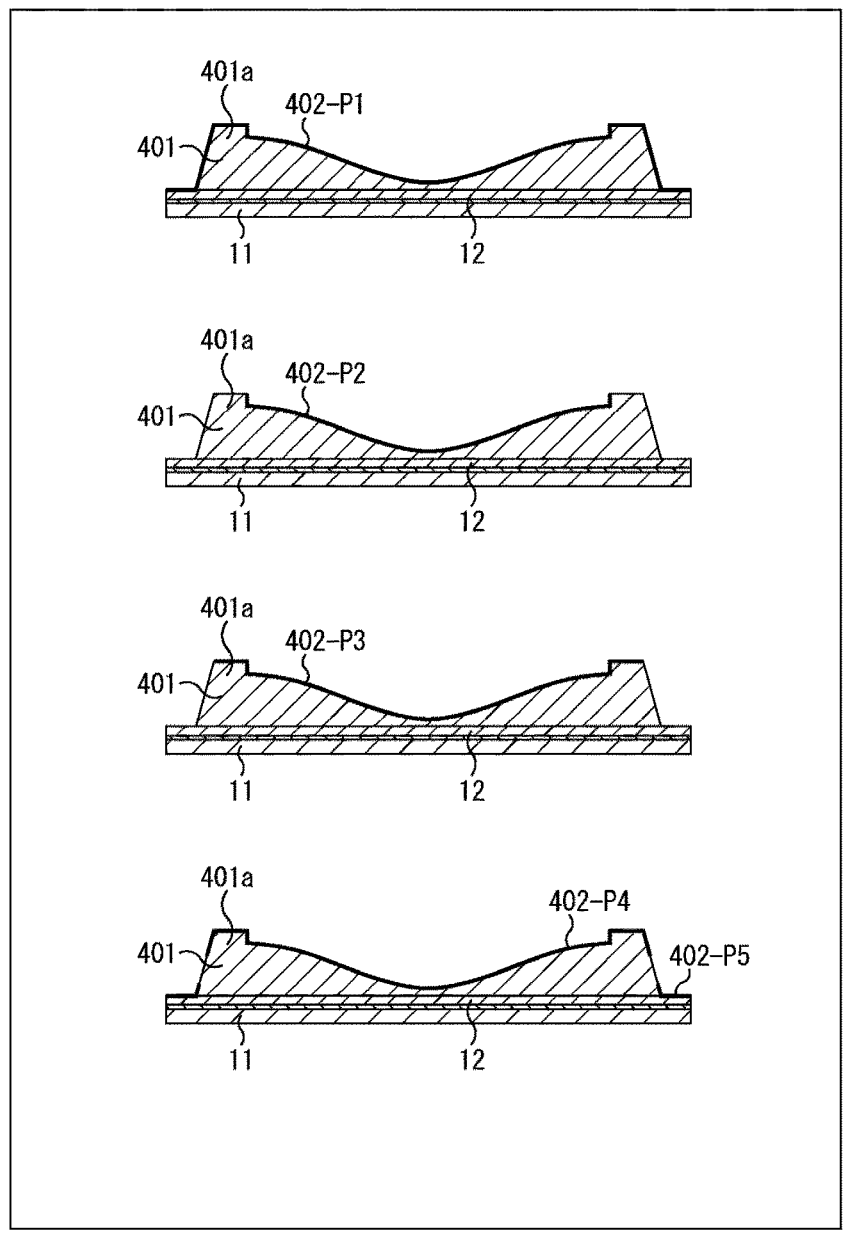
FIG. 54 is a figure for explaining configuration examples of a twentieth embodiment of the imaging apparatus according to the present disclosure.

That is, for example, as represented by a bold line on the uppermost row in FIG. 54, on the glass substrate 12, an AR coat 402-P1 may be formed over the entire region of a non-effective region (corresponding to the non-effective region 131b in FIG. 23) and an effective region (corresponding to the effective region 131a in FIG. 23) including the side surface and planar section of the protrusion 401a.

In addition, for example, as depicted in the second example from top in FIG. 54, an AR coat 402-P2 may be formed only on the effective region in the protrusion 401a on the lens 401. By forming the AR coat 402-P2 only in the region (the effective region (corresponding to the effective region 131a in FIG. 23)) in the protrusion 401a on the lens 401, it becomes possible to reduce stresses caused by expansion or contraction of the lens 401 due to heat at the time of implementation reflow heat load or the like, and occurrence of cracks of the AR coat 402-P2 can be reduced.

Furthermore, for example, as depicted in the third example from top in FIG. 54, an AR coat 402-P3 may be formed in an inner region (the effective region (corresponding to the effective region 131a in FIG. 23)), of the protrusion 401a, including the planar section of the protrusion 401a on the lens 401. By forming the AR coat 402-P3 only in the inner region, of the protrusion 401a, including the protrusion 401a on the lens 401, it becomes possible to reduce stresses generated to the AR coat 402-P3 caused by expansion or contraction of the lens 401 due to heat at the time of implementation reflow heat load or the like, and occurrence of cracks can be reduced.

Furthermore, for example, as depicted in the fourth example from top in FIG. 54, an AR coat 402-P4 is formed in the inner region (the effective region (corresponding to the effective region 131a in FIG. 23)) of the protrusion 401a, in addition to part of the planar section of the protrusion 401a on the lens 401 and the outer circumferential section, and furthermore an AR coat 402-P5 may be formed on the glass substrate 12 and in a region around the boundary of the lens 401 that faces the glass substrate 12. By forming a region where AR coats are not formed in part of the side-surface portion of the lens 401 as in the cases of the AR coats 402-P4 and 402-P5, it becomes possible to reduce stresses generated to the AR coat 402-P2 caused by expansion or contraction of the lens 401 due to heat at the time of implementation reflow heat load or the like, and occurrence of cracks can be reduced.

Figure 55:
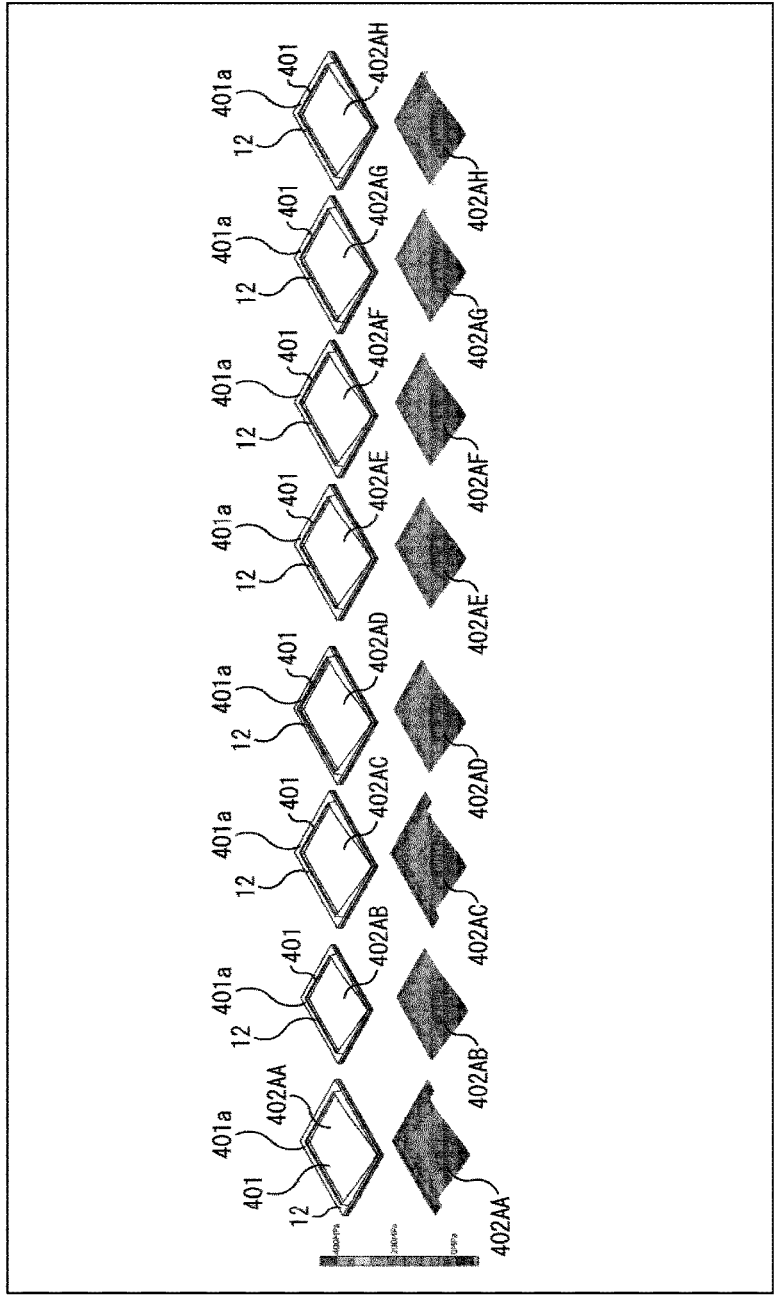
FIG. 55 is a figure for explaining the distributions of stresses applied onto AR coats at the time of implementation reflow heat load in a case where an AR coat is formed over the entire surface and in other cases.

FIG. 55 summarizes the distributions of stresses generated, at the time of implementation reflow heat load, to the AR coat 402 in cases that the AR coat 402 is formed in variously different regions for the lens 401.

In FIG. 55, the upper portion depicts the outline shapes of the lens 401 and the AR coat 402 that are seen when the lens 401 is divided into two in the horizontal direction and the vertical direction, and the lower portion depicts the distributions of stresses generated to the corresponding AR coat 402 at the time of implementation reflow heat load.

The left portion in FIG. 55 depicts a case that an AR coat 402AA is formed on the whole including the surrounding glass substrate 12, the side surface of the lens 401, the protrusion 401a, and the inside of the protrusion 401a.

The second example from left in FIG. 55 depicts the case of a configuration that is different from the configuration in the leftmost example in FIG. 55 in that an AR coat is not formed on the surrounding glass substrate 12 and the side surface of the lens 401, but an AR coat 402AB is formed in other regions.

The third example from left in FIG. 55 depicts the case of a configuration that is different from the configuration in the leftmost example in FIG. 55 in that an AR coat is not formed in the region on the side surface of the lens 401, but an AR coat 402AC is formed on the surrounding glass substrate 12, the protrusion 401a, and the inside of the protrusion 401a.

The fourth example from left in FIG. 55 depicts the case of a configuration that is different from the configuration in the leftmost example in FIG. 55 in that an AR coat is not formed in the region on the side surface of the lens 401, the planar section of the protrusion 401a, and a region which is on the inner side of the protrusion 401a, and extends from the flat section on the top surface of the protrusion 401a to a predetermined width A, and an AR coat 402AD is formed in other regions including the inside of the protrusion 401a and the surrounding glass substrate 12. Here, the width A is 100 μm, for example.

The fifth example from left in FIG. 55 depicts the case of a configuration that is different from the configuration in the leftmost portion in FIG. 55 in that an AR coat 402AE is formed on the inner side of the protrusion 401a, the flat section on the top surface of the protrusion 401a, and a region which is on the outer side surface of the protrusion 401a, and extends from the flat section down to the predetermined width A.

The sixth example from left in FIG. 55 depicts the case of a configuration that is different from the configuration in the leftmost example in FIG. 55 in that an AR coat 402AF is formed on the inner side of the protrusion 401a, the flat section on the top surface of the protrusion 401a, and a region which is on the outer side surface of the protrusion 401a, and extends from the flat section down to a predetermined width 2A.

The seventh example from left in FIG. 55 depicts the case of a configuration that is different from the configuration in the leftmost example in FIG. 55 in that an AR coat 402AG is formed on the inner side of the protrusion 401a, the flat section on the top surface of the protrusion 401a, and a region which is on the outer side surface of the protrusion 401a, and extends from the flat section down to a predetermined width 3A.

The eighth example from left in FIG. 55 depicts the case of a configuration that is different from the configuration in the leftmost example in FIG. 55 in that an AR coat 402AH is formed on the inner side of the protrusion 401a, the flat section on the top surface of the protrusion 401a, and a region which is on the outer side surface of the protrusion 401a, and extends from the flat section down to a predetermined width 4A.

In any of these, in comparison with the leftmost example in FIG. 55 in which the AR coat 402AA is formed to cover the entire surface of the lens 401, it can be observed that stresses generated to the AR coat 402 are reduced by forming the AR coat which is located on the inner side of the protrusion 401a of the lens 401 such that the AR coat is not continuously connected with the AR coat 402 on the glass substrate 12.

As mentioned above, by forming the AR coat 402 on the lens 401, it becomes possible to reduce occurrence of flares and ghosts, and it becomes possible to capture images with higher resolution.

In addition, by forming the AR coat 402 such that, on the entire surface including the effective region and non-effective region of the lens 401 including the protrusion 401a, and the glass substrate 12 at the outer circumferential section of the lens 401, a region where an AR coat is not formed is provided in at least part other than the effective region and the glass substrate 12, it becomes possible to reduce occurrence of cracks resulting from expansion or contraction due to heat at the time of implementation reflow heat load, in a reliability inspection, and so on.

Note that the AR coat 402 has been explained here, another film may be adopted as long as such a film is formed on the surface of the lens 401, and, for example, the same is true of an anti-reflection film such as a moss eye, or the like.

In addition, whereas the lens includes the protrusion 401a in the examples explained thus far, even if the lens does not include the protrusion 401a, it is sufficient if, on the entire surface including the effective region and the non-effective region, and on the glass substrate 12 at the outer circumferential section of the entire surface, a region where an AR coat is not formed is provided in at least part other than the effective region and the glass substrate 12. Stated differently, it is sufficient if the AR coat 402 formed on the lens 401 is not formed to be continuously connected with the AR coat 402 formed on the lens side and the glass substrate 12. Because of this, the lens 401 may be, for example, the two-step side-surface lens 401L, and similar advantages can be attained if the AR coat 402 formed on the lens 401 is formed to be not continuously connected with the AR coat 402 formed on the lens side and the glass substrate 12.

21. Twenty-First Embodiment

In the examples explained thus far, by forming the AR coat 402 formed on the lens 401 such that the AR coat 402 is not continuously connected with the AR coat 402 formed on the glass substrate 12, stresses generated to the AR coat 402 due to expansion or contraction resulting from heat at the time of implementation reflow heat load are reduced.

However, occurrence of side surface flares may be reduced by forming a light blocking film such that the light blocking film covers the protrusion 401a and side surface of the lens 401.

Figure 56:
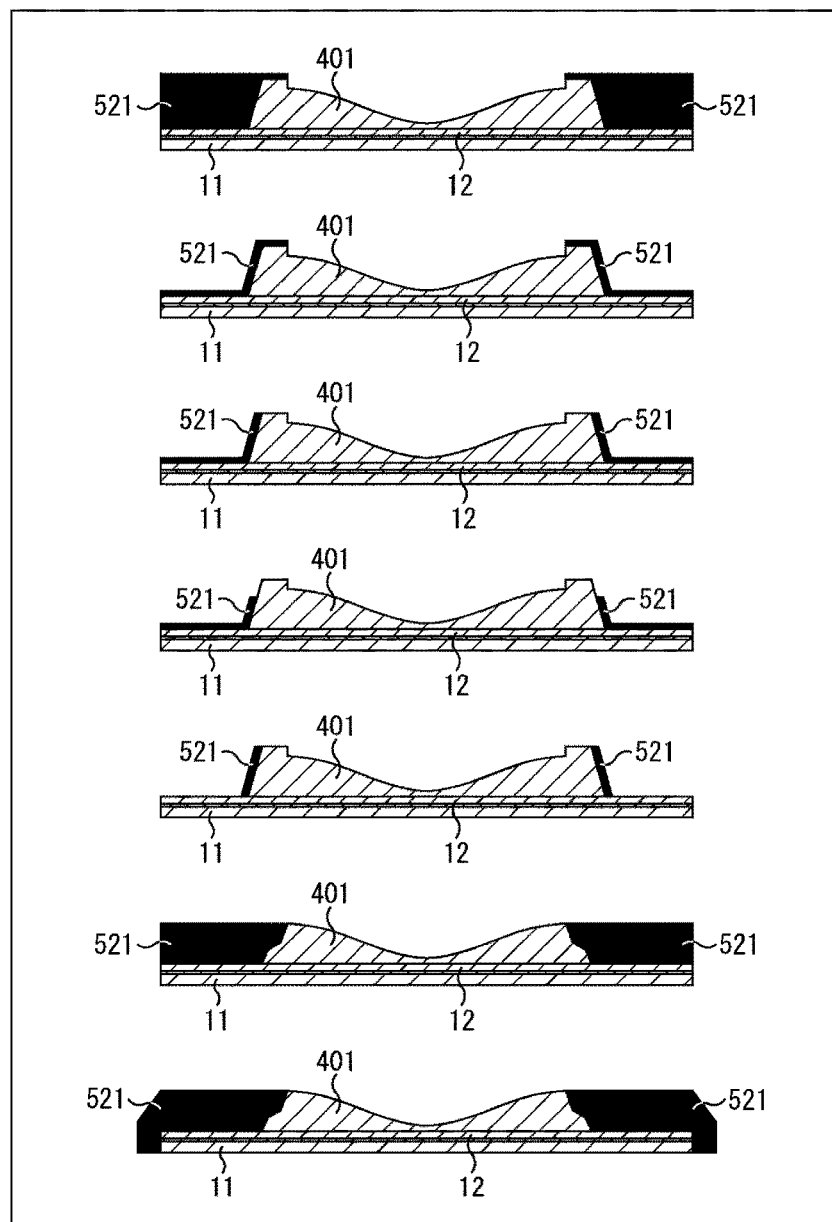
FIG. 56 is a figure for explaining configuration examples of a twenty-first embodiment of the imaging apparatus according to the present disclosure.

That is, as depicted on the uppermost row in FIG. 56, a light blocking film 521 may be formed in the entire area on the glass substrate 12, on the side surface of the lens 401 and to the height of the planar section on the top surface of the protrusion 401a, that is, in the area other than the effective region.

In addition, as depicted in the second example from top in FIG. 56, the light blocking film 521 may be formed on the entire surface on the glass substrate 12, on the side surface of the lens 401 and to the planar section on the top surface of the protrusion 401a, that is, the entire surface portion other than the effective region.

Furthermore, as depicted in the third example from top in FIG. 56, the light blocking film 521 may be formed on the glass substrate 12 and on the side surface of the protrusion 401a of the lens 401.

In addition, as depicted in the fourth example from top in FIG. 56, the light blocking film 521 may be formed in the area on the glass substrate 12 extending to a predetermined height from the glass substrate 12 on the side surface of the protrusion 401a of the lens 401.

Furthermore, as depicted in the fifth example from top in FIG. 56, the light blocking film 521 may be formed only on the side surface of the protrusion 401a of the lens 401.

In addition, as depicted in the sixth example from top in FIG. 56, the light blocking film 521 may be formed in the area on the glass substrate 12 extending to the highest position of the two side surfaces of the two-step side-surface lens 401.

Furthermore, as depicted in the seventh example from top in FIG. 56, the light blocking film 521 may be formed to cover the entire surface extending to the highest position of the two side surfaces of the two-step side-surface lens 401 on the glass substrate 12, and to cover the outer circumferential portion of the solid-state imaging element 11.

In any of these examples, the light blocking film 521 is formed by partial film formation, is formed by performing lithography after film formation, is formed by performing film formation after a resist is formed, and lifting off the resist, or is formed by lithography.

In addition, a bank for forming a light blocking film at the outer circumferential section of the two-step side-surface lens 401 may be formed, and the light blocking film 521 may be formed at the outer circumferential section of the two-step side-surface lens 401 and on the inner side of the bank.

That is, as depicted on the uppermost row in FIG. 57, a bank 531 having a height identical to the lens height may be formed on the glass substrate 12 at the outer circumferential section of the two-step side-surface lens 401, the light blocking film 521 may be formed by lithography or by coating at the outer circumferential section of the two-step side-surface lens 401, and on the inner side of the bank 531, and then the heights of the light blocking film 521, the lens 401, and the bank 531 may be made flush by polishing such as CMP (Chemical Mechanical Polishing).

In addition, as depicted on the second row from top in FIG. 57, the bank 531 having a height identical to the lens height may be formed on the glass substrate 12 at the outer circumferential section of the two-step side-surface lens 401, simply a material of the light blocking film 521 is applied by coating at the outer circumferential section of the two-step side-surface lens 401, and on the inner side of the bank 531, and the heights of the light blocking film 521, the lens 401, and the bank 531 may self-align due to the material of the light blocking film 521.

Furthermore, as depicted on the third row from top in FIG. 57, the bank 531 having a height identical to the lens height may be formed on the glass substrate 12 at the outer circumferential section of the two-step side-surface lens 401, and simply the light blocking film 521 may be formed by lithography at the outer circumferential section of the two-step side-surface lens 401, and on the inner side of the bank 531.

In addition, as depicted on the fourth row from top in FIG. 57, the bank 531 may be formed on the glass substrate 12 at the outer circumferential section of the two-step side-surface lens 401 such that the bank 531 becomes connected with the boundary between the two-step side-surface lens 401 and the glass substrate 12, the light blocking film 521 may be formed by lithography or by coating at the outer circumferential section of the two-step side-surface lens 401, and on the inner side of the bank 531, and then the heights of the light blocking film 521, the lens 401, and the bank 531 may be made flush by polishing such as CMP (Chemical Mechanical Polishing).

In addition, as depicted on the fifth row from top in FIG. 57, the bank 531 may be formed on the glass substrate 12 at the outer circumferential section of the two-step side-surface lens 401 such that the bank 531 becomes connected with the boundary between the two-step side-surface lens 401 and the glass substrate 12, simply a material of the light blocking film 521 is applied by coating at the outer circumferential section of the two-step side-surface lens 401, and on the inner side of the bank 531, and the heights of the light blocking film 521, the lens 401, and the bank 531 may self-align due to the material of the light blocking film 521.

Furthermore, as depicted on the sixth row from top in FIG. 57, the bank 531 may be formed on the glass substrate 12 at the outer circumferential section of the two-step side-surface lens 401 such that the bank 531 becomes connected with the boundary between the two-step side-surface lens 401 and the glass substrate 12, and simply the light blocking film 521 may be formed by lithography at the outer circumferential section of the two-step side-surface lens 401, and on the inner side of the bank 531.

In any of these examples, because the light blocking film is formed to cover the protrusion 401a and side surface of the lens 401, it becomes possible to reduce occurrence of side surface flares.

Note that whereas the light blocking film is formed at the outer circumferential section of the lens 401 in the examples explained thus far, for example, a light absorption film may be formed instead of the light blocking film because it is sufficient if entrance of light through the outer circumferential section of the lens 401 can be prevented.

22. Twenty-Second Embodiment

Whereas the lens 401 has a multi-step side surface in the examples explained thus far, the entire outer circumference of the lens 401 may not have a multi-step configuration, and part of the outer circumference may not have a multi-step configuration.

Figure 58:
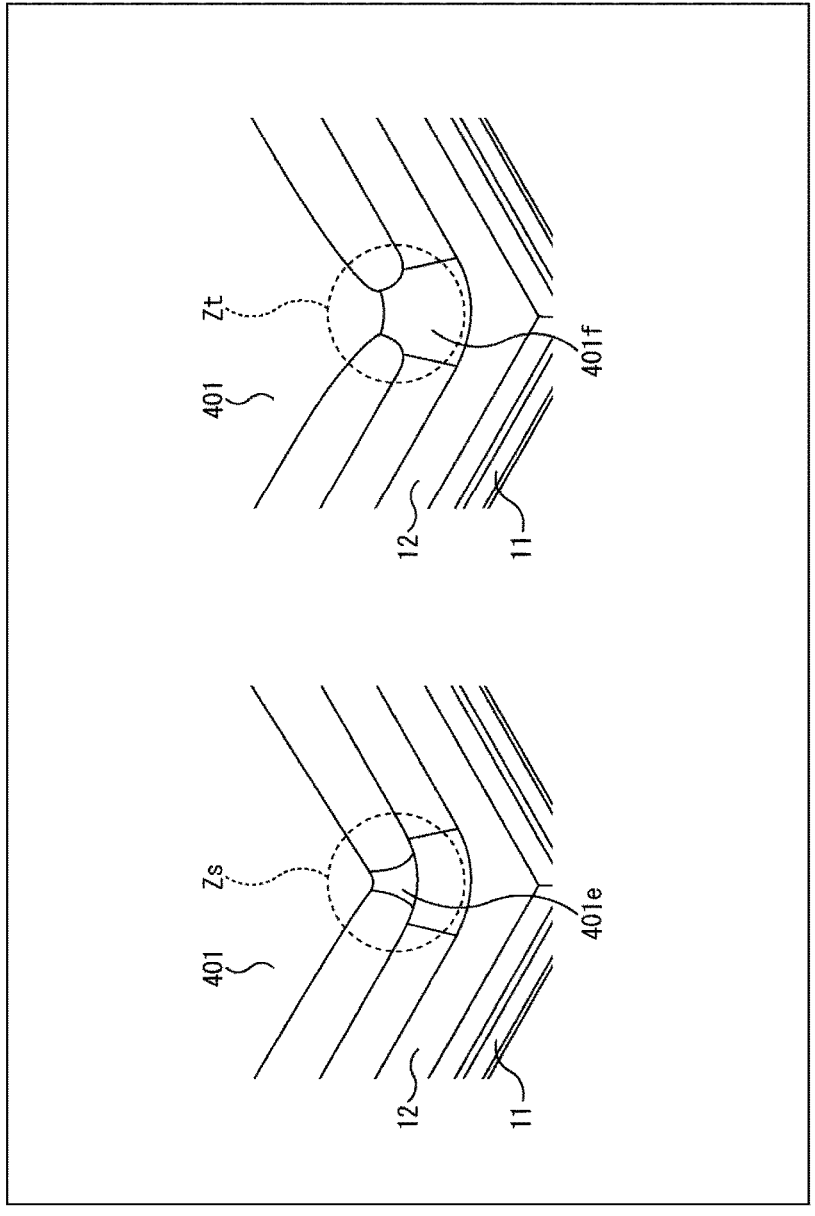
FIG. 58 is a figure for explaining configuration examples of a twenty-second embodiment of the imaging apparatus according to the present disclosure.

That is, in the examples explained thus far, as represented by an area Zs in the left portion in FIG. 58, the entire outer circumferential section including angled sections at the outer circumferential section of the lens 401 in addition to the longer sides and the shorter sides has a multi-step configuration section 401e including a multi-step side surface.

However, as represented by an area Zt in the right portion in FIG. 58, only part, such as angled sections, of the outer circumferential section of the lens 401 may have a non-multi-step configuration section 401f not including a multi-step configuration.

By adopting such a configuration, it becomes possible to enhance the reliability of the lens shape at the time of manufacturing of the lens 401.

Figure 59:
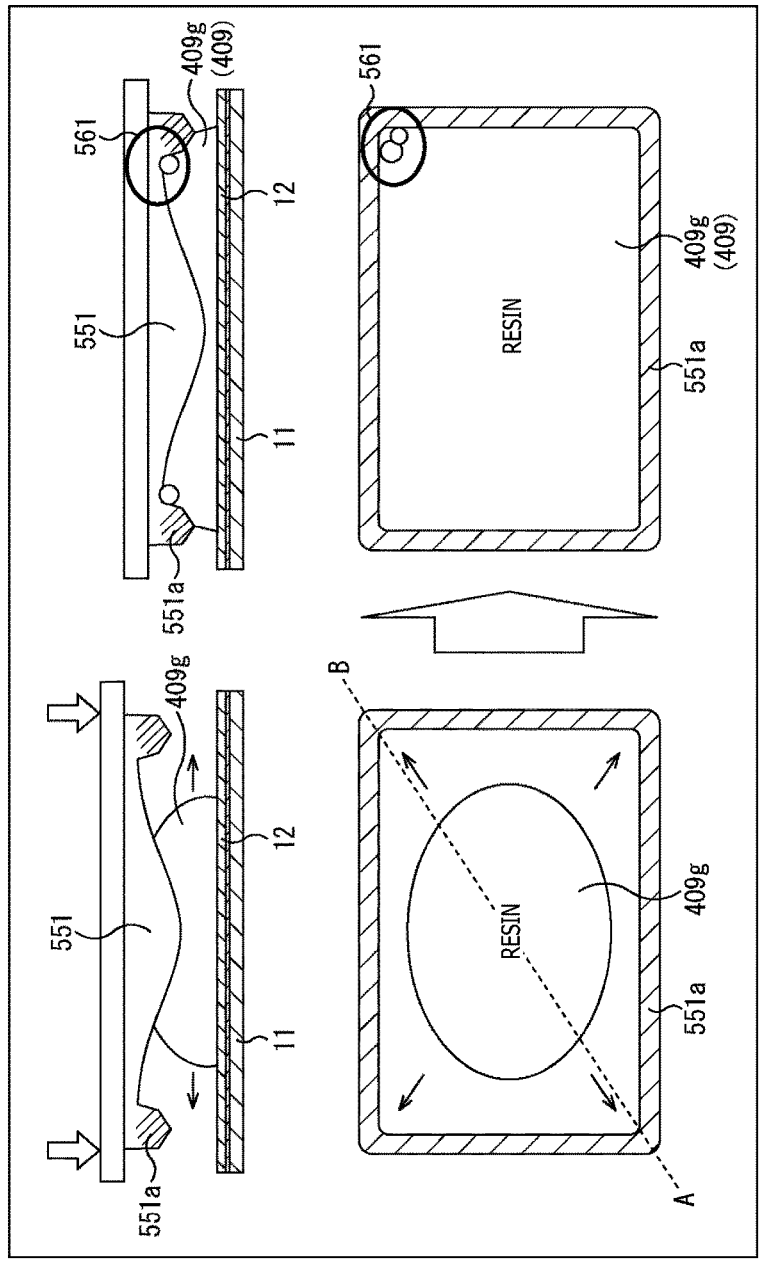
FIG. 59 is a figure for explaining principles of generation of bubbles if the entire outer circumferential section of a lens has a multi-step configuration.

More specifically, for example, as depicted in the upper left portion and the lower left portion in FIG. 59, a resin 409g to be the raw material of the lens 401 is placed on the glass substrate 12 in an uncured state, and, from above the resin 409, a shaping mold 551 is pressed downward from above in the figure as represented by a thick arrow in the upper left portion in FIG. 59. As a result of such operation, the resin 409g is pressed and expanded in directions of thin arrows in the upper left portion and the lower left portion in FIG. 59, and is shaped into the lens 401 like the one depicted in the upper right portion and the lower right portion in FIG. 59, and cured.

At this time, if the entire outer circumferential section of the lens 401 is given a multi-step configuration, a convexity 551a is formed over the entire outer circumferential section of the shaping mold 551.

By forming the convexity 551a over the entire outer circumferential section of the shaping mold 551 in such a manner, the entire outer circumferential section is given the multi-step configuration section 401e, but, as depicted in the upper right portion and the lower right portion in FIG. 59, air stays in particular near angled sections at the convexity 551a of the shaping mold 551, remains as bubbles 561 in some cases, and has negative influence on the completed shape of the lens 401 in some cases. Note that, in FIG. 59, the lower left portion and the lower right portion in the figure are top views of the shaping mold 551, and the upper left portion and the upper right portion in the figure are cross-sectional views taken at positions corresponding to a broken line AB in the lower left portion. Here, whereas the broken line AB is not depicted in the lower right portion in FIG. 59, the cross-sectional view on the upper right portion in FIG. 59 is a cross-sectional view taken at positions in the lower right portion that are identical to those corresponding to the broken line AB in the lower left portion.

Figure 60:
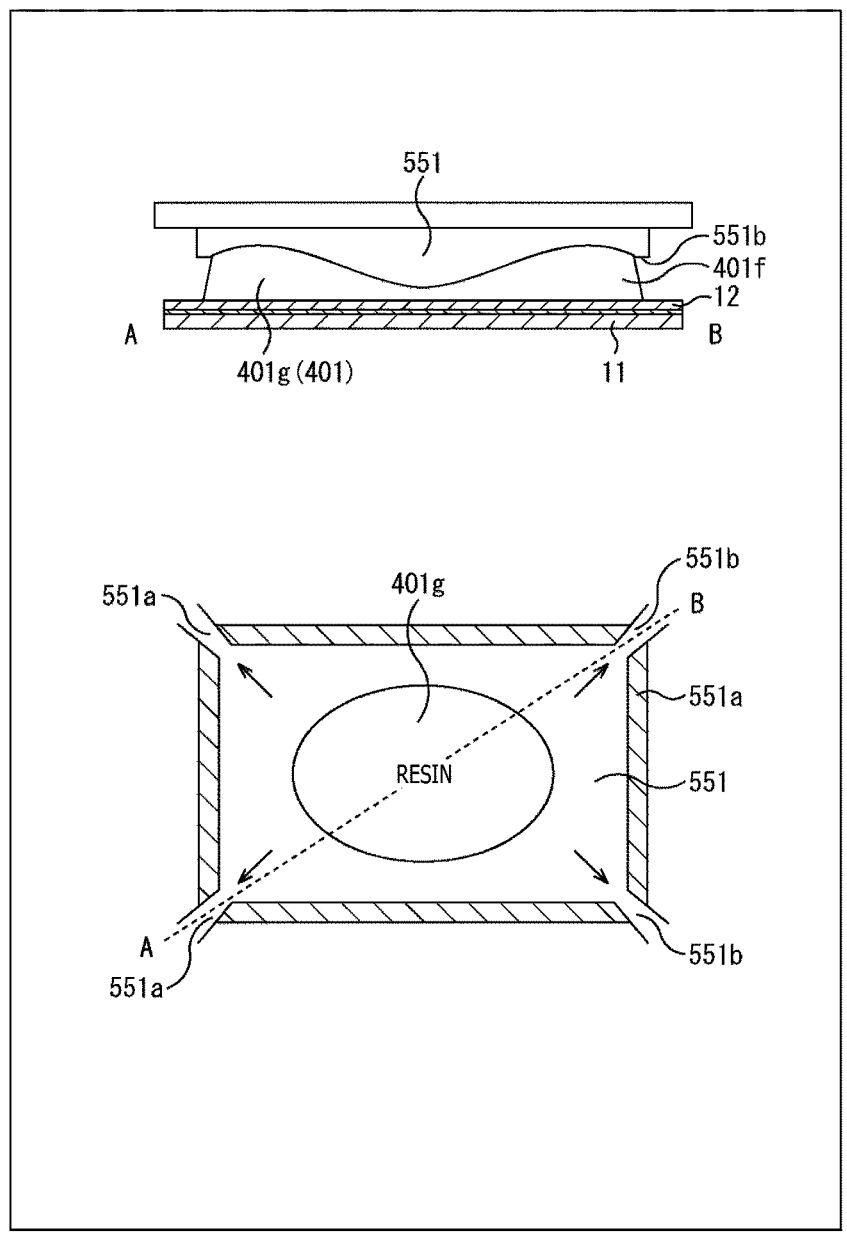
FIG. 60 is a figure for explaining a configuration example of the shape of the lens in FIG. 58 and a shaping mold.

In view of this, according to the present disclosure, as depicted in the upper portion and the lower portion in FIG. 60, ventilation guides 551b are formed at part, such as angled sections, of the outer circumferential section of the shaping mold 551 such that the side-surface section does not have a multi-step configuration. Thereby, the non-multi-step configuration section 401f not having a multi-step configuration is formed at the part, such as angled sections, of the outer circumferential section of the lens 401, and the non-multi-step configuration section 401f reduces occurrence of the bubbles 561 at the time of molding of the lens 401.

Note that, in FIG. 60, the lower portion depicts a top view of the shaping mold 551, and the upper portion depicts a cross-section taken along AB in the top view of the shaping mold 551.

By forming the ventilation guides 551b in the shaping mold 551, and giving part of the outer circumferential section of the lens 401 the non-multi-step configuration section 401f not having a multi-step configuration, advantages like the ones mentioned below can be attained.

Figure 61:
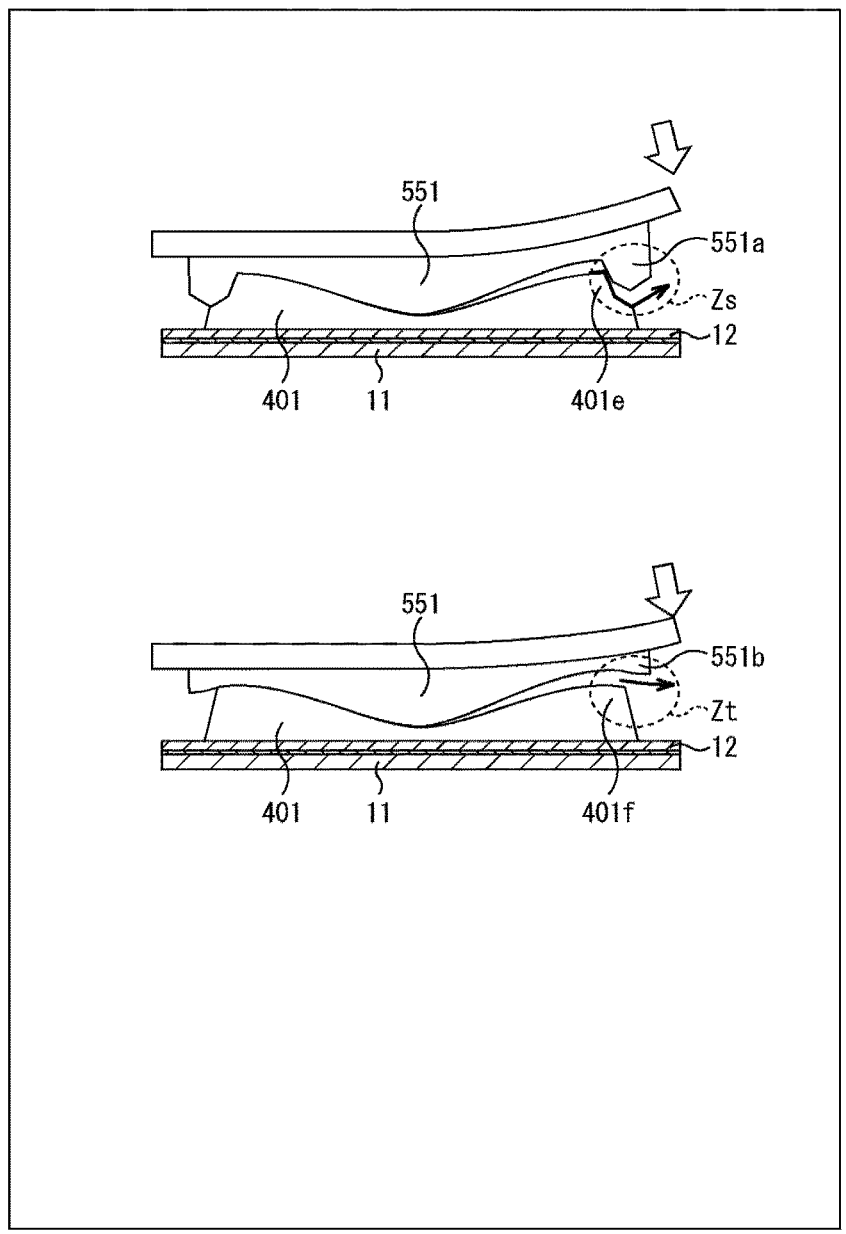
FIG. 61 is a figure for explaining advantages that are attained in a case where part of the outer circumferential section of the lens has a non-multi-step configuration section formed thereon.

That is, as represented by a thick arrow in the upper portion in FIG. 61, when the shaping mold 551 is pressed downward from above in the figure, and the lens 401 is formed, in a case where the convexity 551a is formed over the entire outer circumferential section, angled sections of the lens 401 can also be shaped into the multi-step configuration section 401e, but gas confined at concavities formed on the inner side of the convexity 551a cannot be discharged, and remains as the bubbles 561 in some cases.

However, according to the present disclosure, the ventilation guides 551b are formed. Thereby, as represented by a thick arrow in the lower portion in FIG. 61, when the shaping mold 551 is pressed from above in the figure, and the lens 401 is formed, the non-multi-step configuration section 401f not having steps is formed at part of the outer circumferential section of the lens 401.

By providing the ventilation guides 551b such that the non-multi-step configuration section 401f not having steps is formed at part of the outer circumferential section of the lens 401 in such a manner, it becomes possible to discharge gas confined at the concavities formed on the inner side of the convexity 551a, and so it becomes possible to reduce occurrence of the bubbles 561 in the lens 401.

In addition, because the non-multi-step configuration section 401f not having a multi-step side surface at the outer circumferential section of the lens 401 is part of the entire outer circumferential section of the lens 401 at which the ventilation guides 551b are formed, it becomes possible to attain advantages of a multi-step side surface as the shape of the lens 401.

Figure 62:
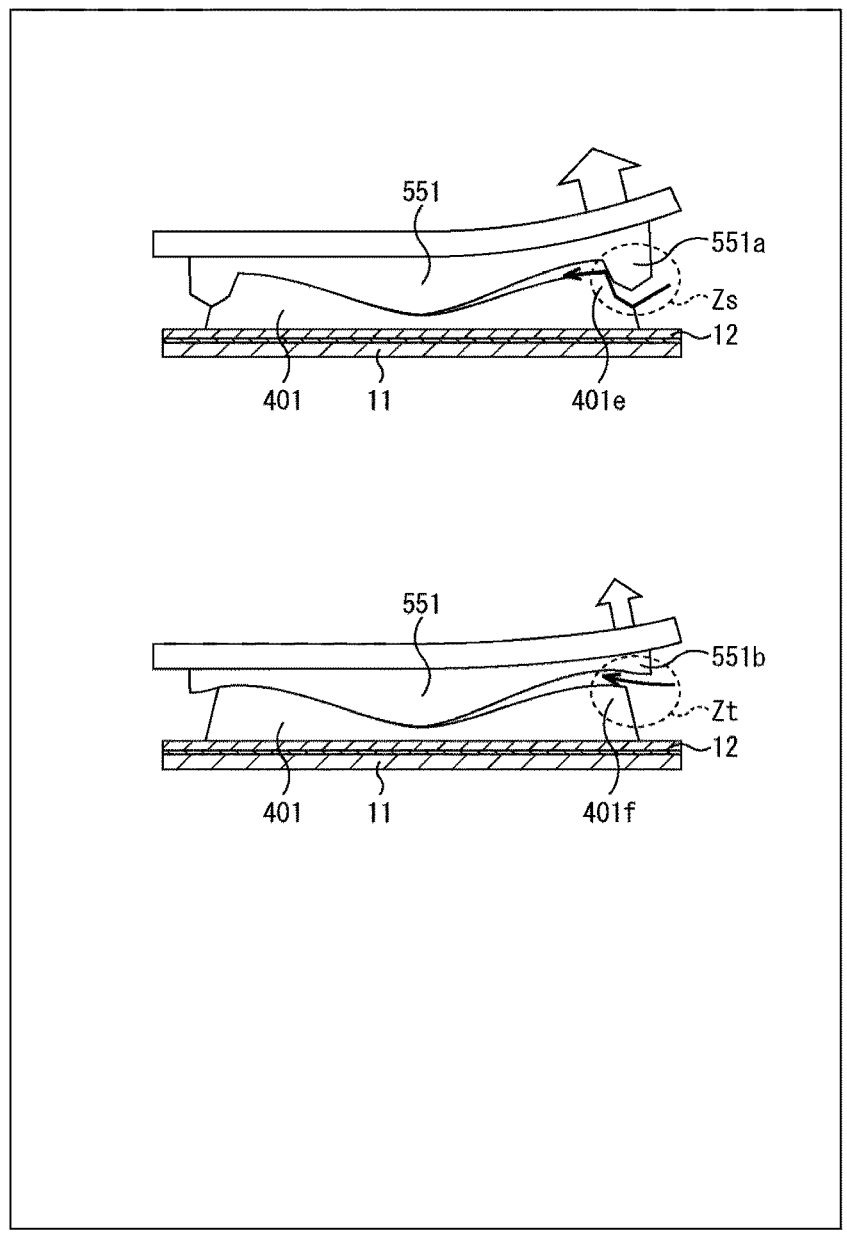
FIG. 62 is a figure for explaining advantages that are attained in a case where part of the outer circumferential section of the lens has a non-multi-step configuration section formed thereon.

Furthermore, as represented by a thick arrow in the upper portion in FIG. 62, when the shaping mold 551 is peeled upward in the figure also, in a case where the convexity 551a is formed over the entire outer circumferential section, and the multi-step configuration section 401e is formed over the entire outer circumferential section of the lens 401, it becomes difficult to cause air to flow to the inner side of the convexity 551a, so peeling of the shaping mold 551 and the lens 401 cannot be performed well, and there is a fear that the completed shape of the lens 401 is influenced.

However, by forming the ventilation guides 551b at part of the outer circumferential section, and forming the non-multi-step configuration section 401f at part of the outer circumferential section of the lens 401, as depicted in the lower portion in FIG. 62, it becomes possible to cause air to flow to the concavities formed on the inner side of the convexity 551a through the ventilation guides 551b and the non-multi-step configuration section 401f also when the shaping mold 551 is peeled upward in the figure.

Thereby, it becomes possible to smoothly perform peeling of the shaping mold 551 and the lens 401, and it becomes possible to reduce influence of the peeling of the shaping mold 551 on the completed shape of the lens 401.

<Width of Non-Multi-Step Configuration Section in Outer Circumferential Direction>

In addition, by forming the non-multi-step configuration section 401f, it becomes possible to enhance robustness of an AR coat against cracks due to distortions relative to the lens 401 when the AR coat is formed on the effective region on the surface of the lens 401 or over the entire surface.

In particular, the larger the width of the non-multi-step configuration section 401f in the outer circumferential direction is, the higher the robustness of the AR coat against cracks due to distortions relative to the lens 401.

Figure 63:
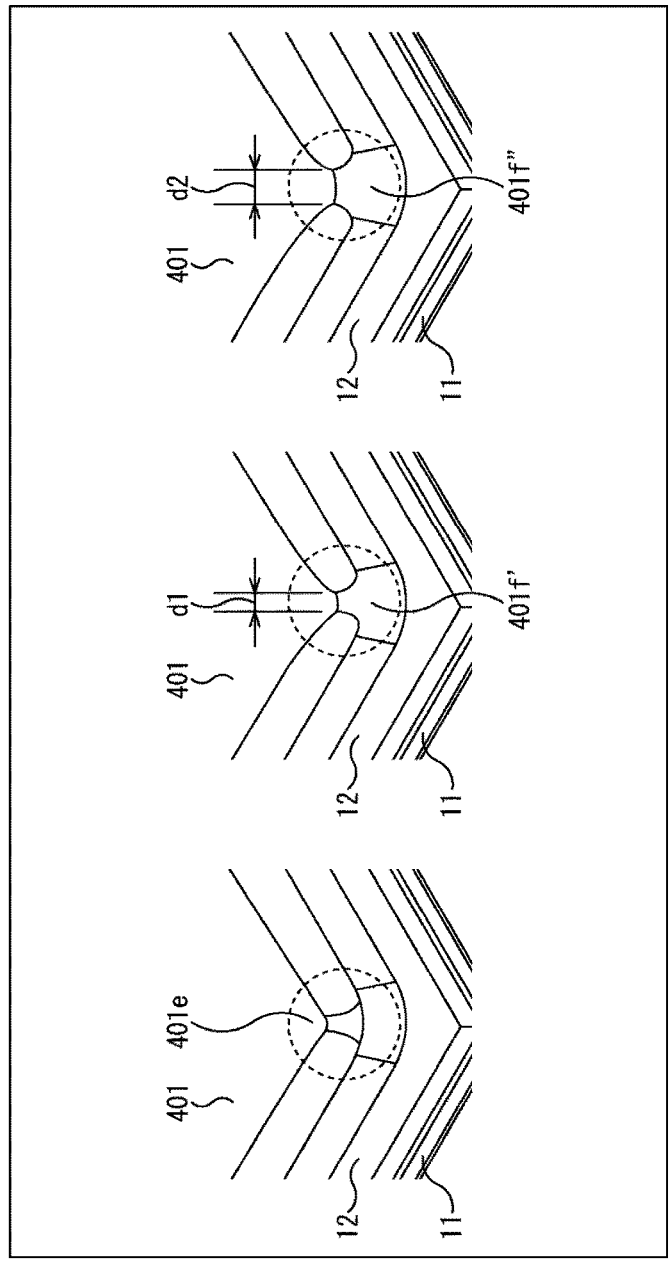
FIG. 63 is a figure for explaining advantages according to widths of the non-multi-step configuration section in the outer circumferential direction of the lens.

Here, the robustness of an AR coat against cracks due to distortions relative to the lens 401 when the AR coat is formed on the effective region of the surface or on the entire surface in each of cases as depicted in the following order from left in FIG. 63 that an angled section of the outer circumferential section of the lens 401 is the multi-step configuration section 401e, that a non-multi-step configuration section 401f having a width d1 in the outer circumferential direction is formed, and that a non-multi-step configuration section 401f" having a width d2 (>d1) in the outer circumferential direction is formed is compared with each other.

The robustness against cracks in a case where the AR coat is formed on the effective region of the surface or over the entire surface is the highest in the case of the non-multi-step configuration section 401f", is the next highest in the case of the non-multi-step configuration section 401f, and is the lowest in the case of the multi-step configuration section 401e.

That is, it can be said that the larger the width of the non-multi-step configuration section 401f in the outer circumferential direction is, the higher the robustness of the AR coat against cracks due to distortions relative to the lens 401.

Accordingly, it can be said that in a case where the AR coat is formed on the lens 401, it is desirable if the non-multi-step configuration section 401f having a width in the outer circumferential direction according to required robustness is formed.

Application Examples of Twenty-Second Embodiment

Figure 64:
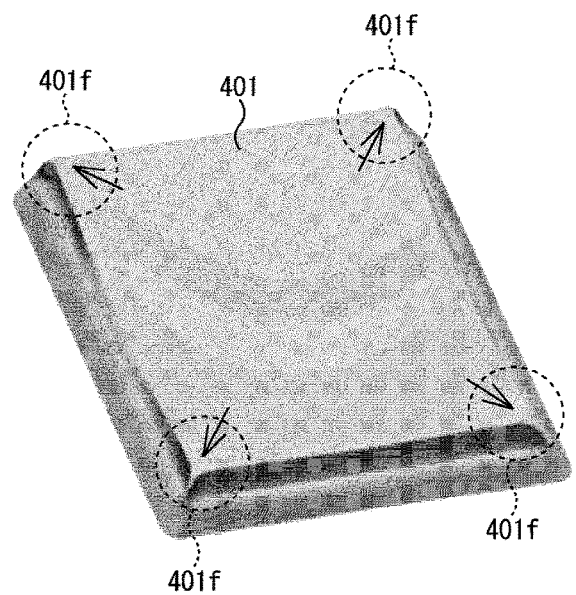
FIG. 64 is a figure for explaining an application example of the twenty-second embodiment of the imaging apparatus according to the present disclosure.

Whereas the non-multi-step configuration section 401f is provided at angled sections of the lens 401 as depicted in FIG. 64 in the example explained thus far, the non-multi-step configuration section 401f may be formed at other positions as long as the positions are at the outer circumferential section of the lens 401.

Figure 65:
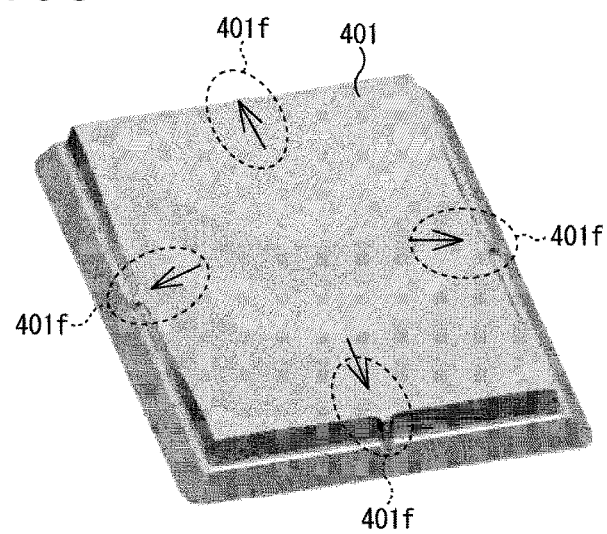
FIG. 65 is a figure for explaining an application example of the twenty-second embodiment of the imaging apparatus according to the present disclosure.

For example, as depicted in FIG. 65, the non-multi-step configuration section 401f may be formed near the center of each side of the outer circumferential section of the rectangular lens 401.

Figure 66:
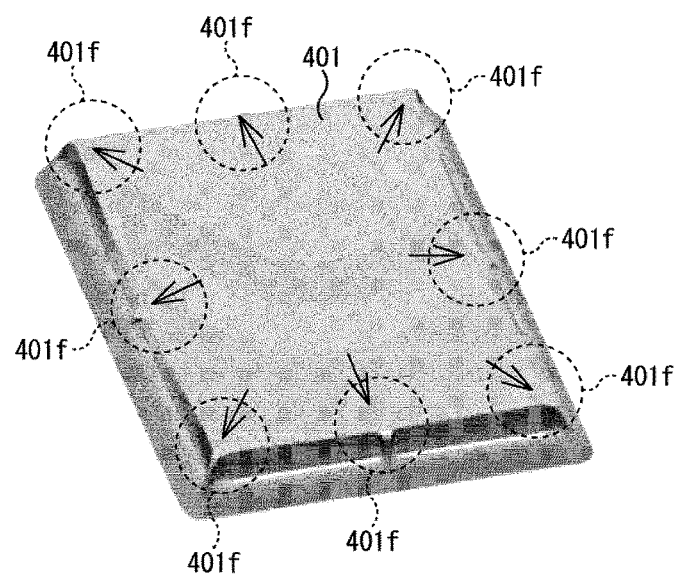
FIG. 66 is a figure for explaining an application example of the twenty-second embodiment of the imaging apparatus according to the present disclosure.

In addition, as depicted in FIG. 66, the non-multi-step configuration section 401f may be formed at each angled section at the outer circumferential section of the rectangular lens 401, and near the central section of each side.

Figure 67:
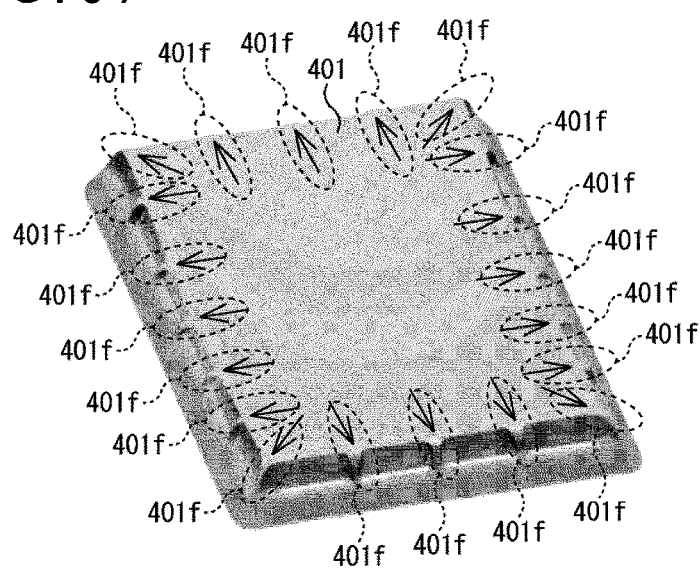
FIG. 67 is a figure for explaining an application example of the twenty-second embodiment of the imaging apparatus according to the present disclosure.

Furthermore, as depicted in FIG. 67, the non-multi-step configuration section 401f may be formed at each angled section at the outer circumferential section of the rectangular lens 401, at five points on the longer side sections, and at three points on the shorter side sections, and the numbers of points where the non-multi-step configuration section 401f is formed on the longer side sections and the shorter side sections may be other numbers.

In addition, the numbers of the non-multi-step configuration section 401f on the left side and the right side of the outer circumferential section of the lens 401 may be not equal, and advantages can be attained as long as the non-multi-step configuration section 401f is provided at least at one point. Furthermore, intervals between the non-multi-step configuration section 401f may be constant intervals or may be inconstant intervals.

Note that when the lens 401 including the non-multi-step configuration section 401f like the ones depicted in FIGS. 64 to 67 is formed, the ventilation guides 551b need to be formed at positions, on the shaping mold 551, corresponding to the non-multi-step configuration section 401f.

23. Twenty-Third Embodiment

There has been a problem that portions near angled sections more easily peel off in a case where the rectangular lens 131 is adhered or pasted onto the glass substrate 12 provided on the rectangular solid-state imaging element 11.

To cope with such a problem, the effective region 131a is set at the central section of the lens 131, the non-effective region 131b is set at the outer circumferential section of the effective region 131a, and furthermore the effective region 131a is given a size smaller than the outer circumferential size of the glass substrate 12 on the solid-state imaging element 11 in the configuration explained in the fifteenth embodiment explained with reference to FIG. 23.

In addition, it has been explained that because as the angles of angled sections of the rectangular lens 131 decrease, the angled sections peel off from the glass substrate 12 more easily, it is possible to realize a configuration in which the angled sections do not peel off from the glass substrate 12 easily by adopting arc shapes as the shapes of angled sections of the lens 131" as represented by the lens 131" in the central left portion in FIG. 24, and it is possible to reduce the risk of optically negative influence.

In view of this, as a twenty-third embodiment, furthermore, shapes that are suitable in a case where angled sections of the lens 131" are formed in arc shapes are explained below.

Figure 68:
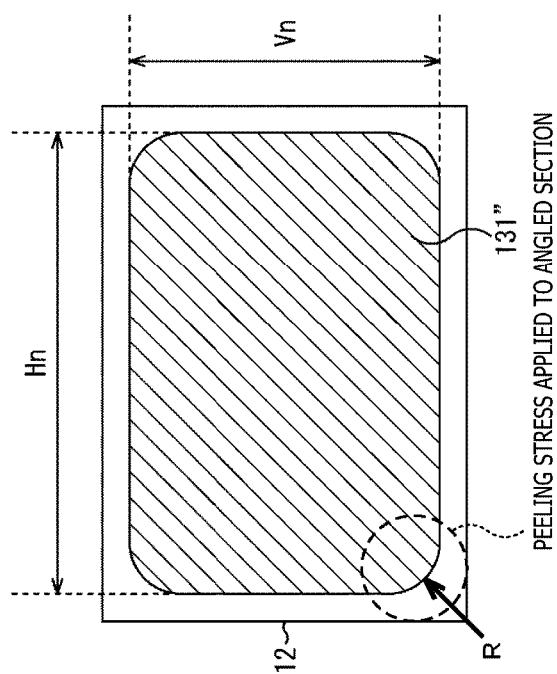
FIG. 68 is a figure for explaining a twenty-third embodiment of the imaging apparatus according to the present disclosure.

As depicted in FIG. 68, assuming that the average value of a length Hn of the longer sides and a length Vn of the shorter sides of the lens 131" that is substantially rectangular when seen in a plan view is 5 to 10 mm, peeling stresses applied to angled sections of the four corners in a case where a radius R of the angled sections is gradually changed to larger radii were computed.

Figure 69:
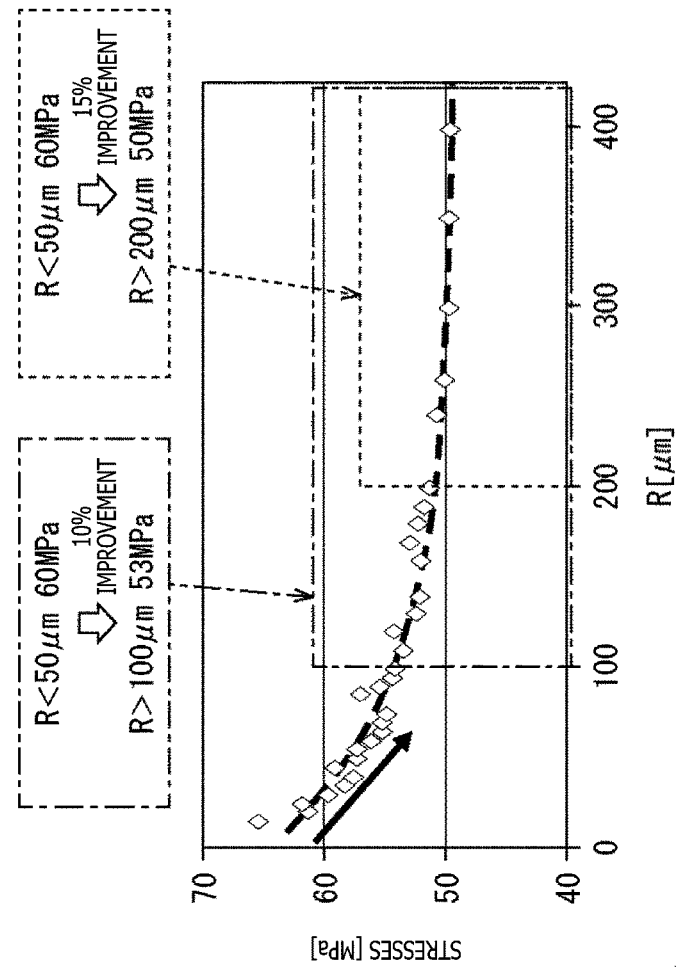
FIG. 69 is a figure depicting a relation between radii of angled sections of the four corners of a lens and peeling stresses applied to the angled sections.

FIG. 69 is a graph depicting a relation between the radius R of angled sections of the four corners and peeling stresses applied to the angled sections.

As depicted in FIG. 69, in a case where the radius R is smaller than 50 µm, the peeling stress is approximately 60 Mpa, but by making the radius R 100 µm, the peeling stress becomes 53 Mpa, and the peeling stress is improved approximately by 10%. Furthermore, if the radius R is made equal to or larger than 200 µm, the peeling stress becomes 50 Mpa, and the peeling stress is improved approximately by 15%.

Accordingly, by making the radius R of angled sections of the four corners of the lens 131" that is substantially rectangular when seen in a plan view equal to or larger than 100µ or further desirably equal to or larger than 200 µm, peeling stresses due to expansion or contraction of an AR coat at the time of implementation reflow heat load or at the time of a reliability test can be reduced.

Whereas FIG. 69 depicts an example in the case of a lens size whose average value of the length Hn of the longer sides and the length Vn of the shorter sides of the lens 131" is 5 to 10 mm, an effective radius R can be defined generally for lens sizes.

Specifically, in a case where the length of each side of the lens 131" is within the range from 1 to 50 mm, by setting the radius R [µm] of angled sections of the lens 131" such that the ratio between the radius R and the average side length AVE_LN={AVE (Hn+Vn)} [mm] of the lens 131" is higher than 1% ((R/AVE_LN)>1%), and desirably higher than 3% ((R/AVE_LN)>3%), peeling stresses applied to the angled sections can be reduced.

Figure 70A:
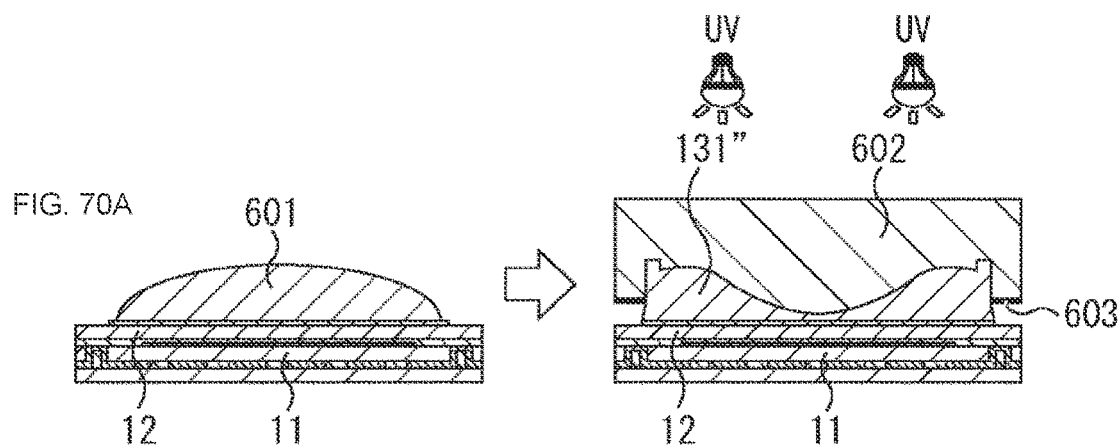
FIGS. 70A, 70B, and 70C depicts figures for explaining a method of forming angled sections of the four corners of a lens in arc shapes.
Figure 70B:
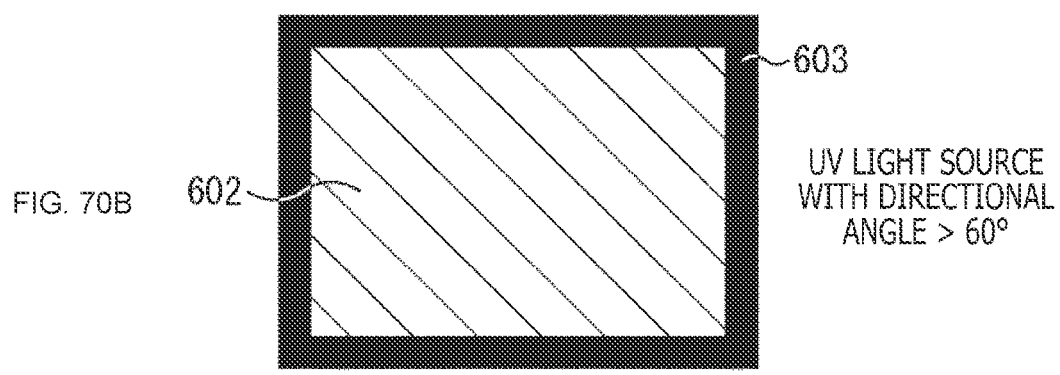
Figure 70C:
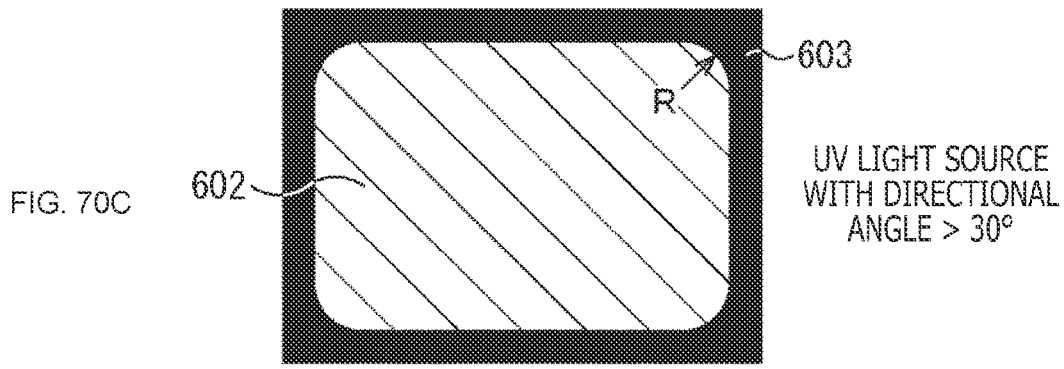

With reference to FIGS. 70A, 70B, and 70C, a method of forming the lens 131" having four corners whose angled sections are arc shapes is explained.

As depicted in A in FIG. 70A, after an ultraviolet light curing resin 601 is dropped on the glass substrate 12 provided on the solid-state imaging element 11, a shaping mold 602 having concave and convex shapes of the ultraviolet light curing resin 601 is pressed against the ultraviolet light curing resin 601 at a predetermined speed and load using an alignment mark formed at predetermined positions as a reference mark. Then, by irradiating the ultraviolet light curing resin 601 with ultraviolet light (UV light) from above in the figure for predetermined time, the lens 131" is formed. Thereafter, when the shaping mold 602 is released, the lens 131" is completed.

A light blocking film 603 is formed at the outer circumferential section of the backside (lower-surface side) of the shaping mold 602 such that the ultraviolet light curing resin 601 does not transmit light. The ultraviolet light curing resin 601 which has flowed out into the formation region of the light blocking film 603 is eliminated at a cleaning step that follows.

B and C in FIGS. 70B and 70C are plan views depicting the formation region of the light blocking film 603 of the shaping mold 602.

There are the following two formation methods as methods for forming angled sections of the lens 131" in arc shapes.

In a first formation method, as in FIG. 70B, angled sections of the four corners of each of the lens plane shape of the shaping mold 602 and the light blocking film 603 are formed to have right angles, and the ultraviolet light curing resin 601 is cured by using an UV light source having a large directional angle (e.g. a directional angle larger than 60°).

In a second formation method, as in FIG. 70C, angled sections of the four corners of each of the lens plane shape of the shaping mold 602 and the light blocking film 603 are formed in arc shapes having a desired radius R, and the ultraviolet light curing resin 601 is cured by using an UV light source having a small directional angle (e.g. a directional angle smaller than 30°).

The first formation method causes larger shape variations as compared with the second formation method, and the inclination of a tapered shape (the tapered shapes in the second examples from left in FIG. 25) of the outer circumferential section as seen in a cross-sectional view, that is, the inclination from the upper end section of the side surface of the lens 131" toward the lower end section of the side surface, increases. Accordingly, it is necessary to ensure that there is an enough space between the outer circumferential section of the lens 131" and the outer circumferential section of the glass substrate 12.

In contrast to this, the second formation method is more suitable because the lens shape control reliability is high as compared with the first formation method.

Figure 71:
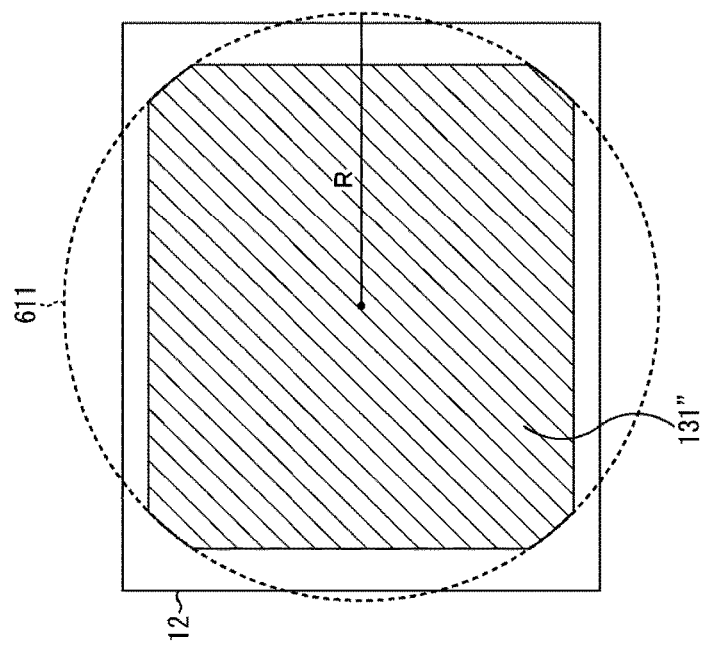

Note that the radius R of an arc shape at each angled section of the lens 131" can be made identical to the radii R of other angled sections in the four corners, and, other than this, as depicted in FIG. 71, the arcs of the four corners can also be formed such that the arcs match one circle 611 having a predetermined radius R.

In addition, the shapes of angled sections of the lens 131" may be curves matching not only a circle, but part of an oval shape.

Figure 72:
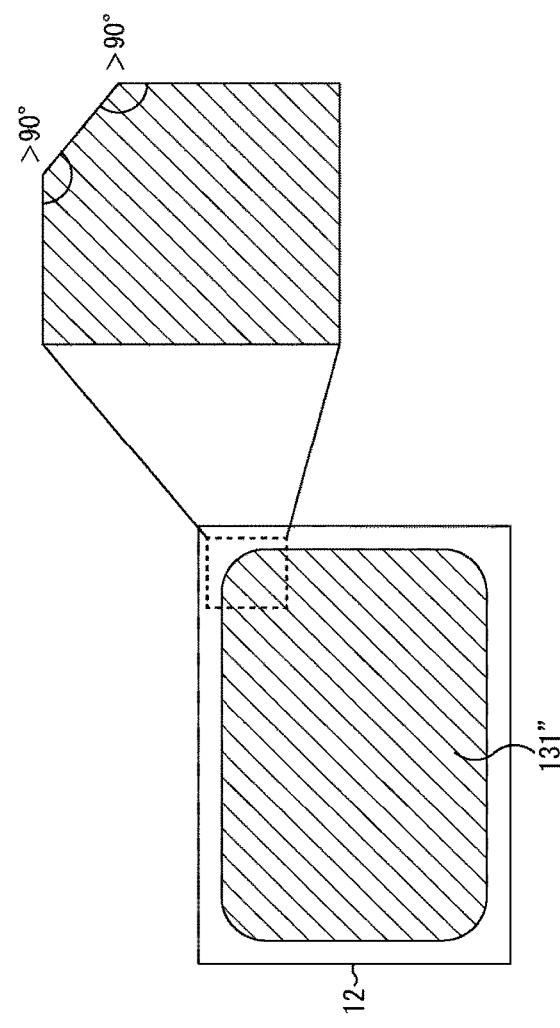
Figure 73:
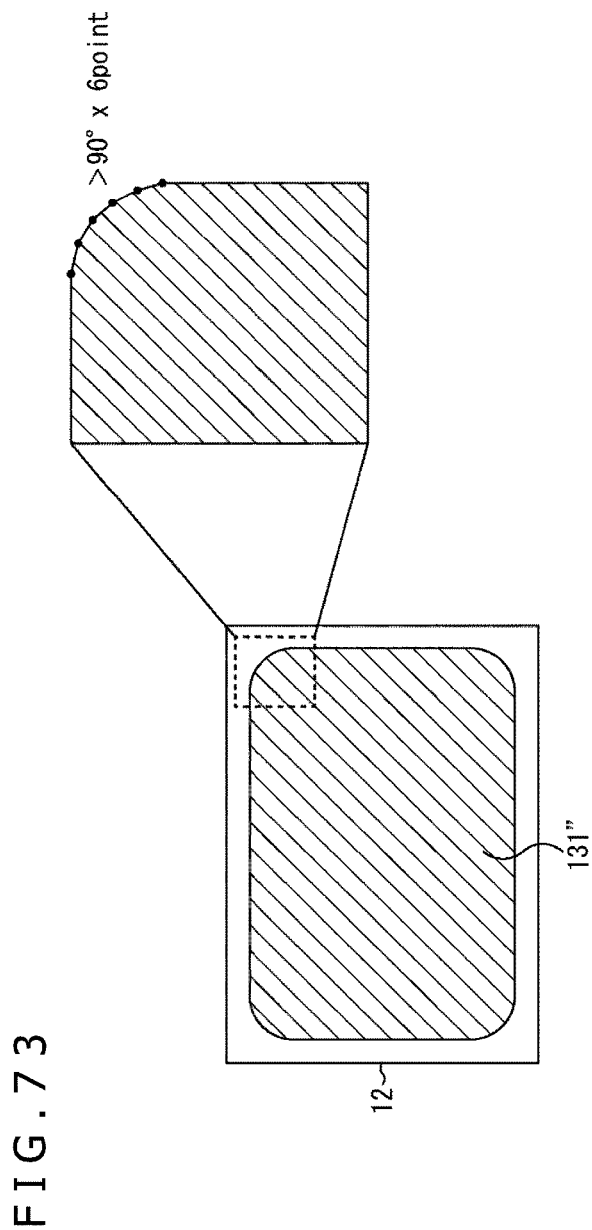

Furthermore, as depicted in FIG. 72 and FIG. 73, angled sections of the four corners of the lens 131" can also be given polygonal shapes that are configured by arranging a plurality of (two or more) obtuse angles (angles larger than 90°) at predetermined intervals.

FIG. 72 depicts an example in which angled sections of the lens 131" include polygonal shapes each including obtuse angles that are arranged at two points at a predetermined interval.

FIG. 73 depicts an example in which angled sections of the lens 131" include polygonal shapes each including obtuse angles that are arranged at six points at predetermined intervals.

According to the configuration of the twenty-third embodiment above, by forming angled sections of the four corners such that the angled sections do not have angles equal to or smaller than 90°, peeling stresses due to expansion or contraction of an AR coat at the time of implementation reflow heat load or at the time of a reliability test can be reduced.

24. Examples of Application to Electronic Equipment

The imaging apparatus 1 in FIG. 1, FIG. 4, FIG. 6 to 17, or the like mentioned above can be applied to various types of electronic equipment like, for example, an imaging apparatus such as a digital still camera or a digital video camera, a mobile phone having an imaging function, or other equipment having an imaging function.

Figure 74:
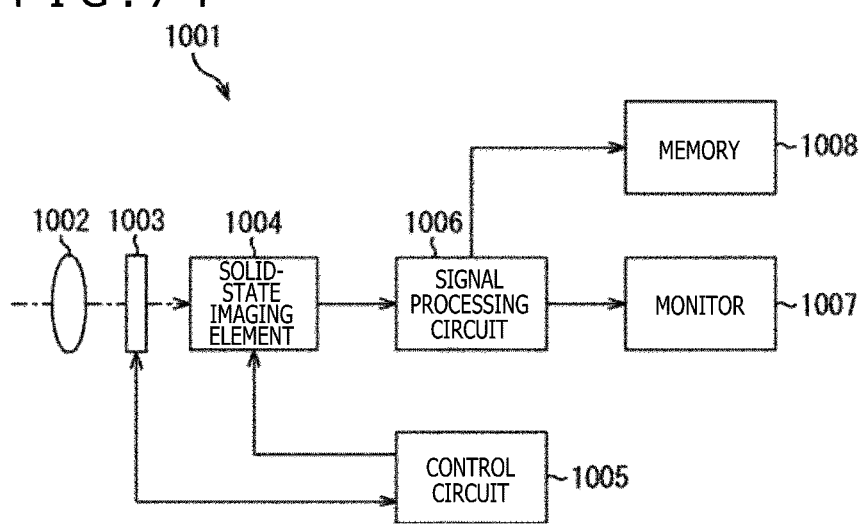

FIG. 74 is a block diagram depicting a configuration example of an imaging apparatus as electronic equipment to which the present technology is applied.

An imaging apparatus 1001 depicted in FIG. 74 includes an optical system 1002, a shutter apparatus 1003, a solid-state imaging element 1004, a drive circuit 1005, a signal processing circuit 1006, a monitor 1007, and a memory 1008, and is capable of capturing still images and moving images.

The optical system 1002 includes one lens or a plurality of lenses, guides light from a subject (incident light) to the solid-state imaging element 1004, and causes an image of the incident light to be formed on the light reception surface of the solid-state imaging element 1004.

The shutter apparatus 1003 is arranged between the optical system 1002 and the solid-state imaging element 1004, and controls a light illumination period and a light blocking period of light to enter the solid-state imaging element 1004 according to control of the drive circuit 1005.

The solid-state imaging element 1004 includes a package including the solid-state imaging element mentioned above. According to light an image of which is formed on the light reception surface via the optical system 1002 and the shutter apparatus 1003, the solid-state imaging element 1004 accumulates signal charge for a predetermined period. The signal charge accumulated in the solid-state imaging element 1004 is transferred according to a drive signal (timing signal) supplied from the drive circuit 1005.

The drive circuit 1005 outputs drive signals for controlling transfer operation of the solid-state imaging element 1004 and shutter operation of the shutter apparatus 1003, and drives the solid-state imaging element 1004 and the shutter apparatus 1003.

The signal processing circuit 1006 performs various types of signal processing on the signal charge output from the solid-state imaging element 1004. An image (image data) obtained by the signal processing circuit 1006 performing the signal processing is supplied to and displayed on the monitor 1007, is supplied to and stored (recorded) on the memory 1008, and so on.

In the thus-configured imaging apparatus 1001 also, by applying the imaging apparatus 1 in any of FIG. 1, FIG. 9, and FIGS. 11 to 22 instead of the optical system 1002 and the solid-state imaging element 1004 mentioned above, it becomes possible to reduce ghosts and flares resulting from internal diffused reflection while a size reduction and a height reduction of the apparatus configuration are realized.

25. Use Examples of Solid-State Imaging Apparatus

Figure 75:
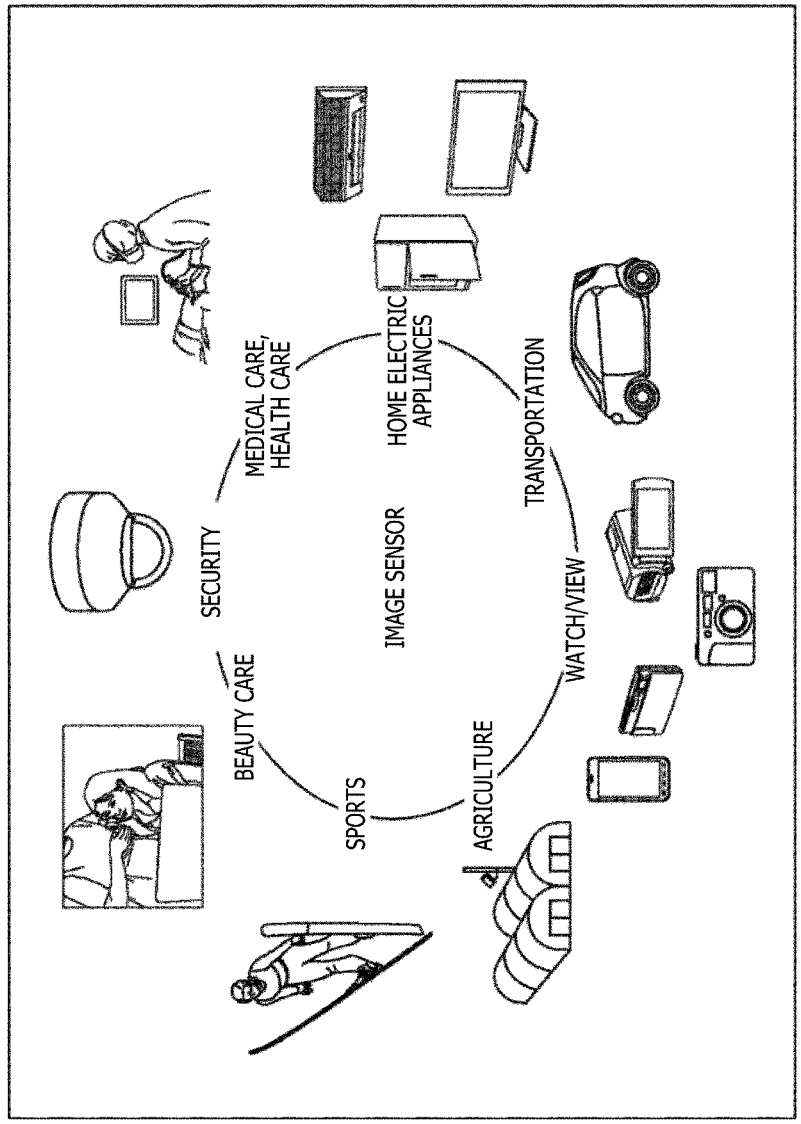

FIG. 75 is a figure depicting use examples in which the imaging apparatus 1 mentioned above is used.

The imaging apparatus 1 mentioned above can be used in various cases in which light such as visible light, infrared light, ultraviolet light, or X-rays is sensed in the following manner, for example.

- Apparatuses, such as digital cameras or mobile equipment having camera functions, that capture images aimed for watching and viewing
- Apparatuses aimed for transportation such as vehicle-mounted sensors that capture images of a space in front of an automobile, a space behind the automobile, spaces around the automobile, the interior of the automobile or the like, monitoring cameras that monitor travelling vehicles and roads or distance measurement sensors that perform measurement of distances between vehicles, and the like, for safe driving by automatic stops or the like, recognition of the state of the driver, and the like
- Apparatuses aimed for home electric appliances such as TVs, refrigerators, or air conditioners for performing equipment operation according to gestures of a user captured by the apparatuses
- Apparatuses aimed for medical care or health care such as endoscopes or apparatuses that perform imaging of blood vessels by receiving infrared light
- Apparatuses aimed for security such as monitoring cameras for crime prevention uses or cameras for human identification uses
- Apparatuses aimed for beauty care such as skin measurement devices that capture images of skin or microscopes that capture images of scalps
- Apparatuses aimed for sports such as action cameras or wearable cameras targeted at sports uses, or the like
- Apparatuses aimed for agriculture such as cameras for monitoring the states of fields and crops

26. Examples of Application to Endoscopic Surgery Systems

The technology according to the present disclosure (the present technology) can be applied to various products. For example, the technology according to the present disclosure may be applied to endoscopic surgery systems.

Figure 76:
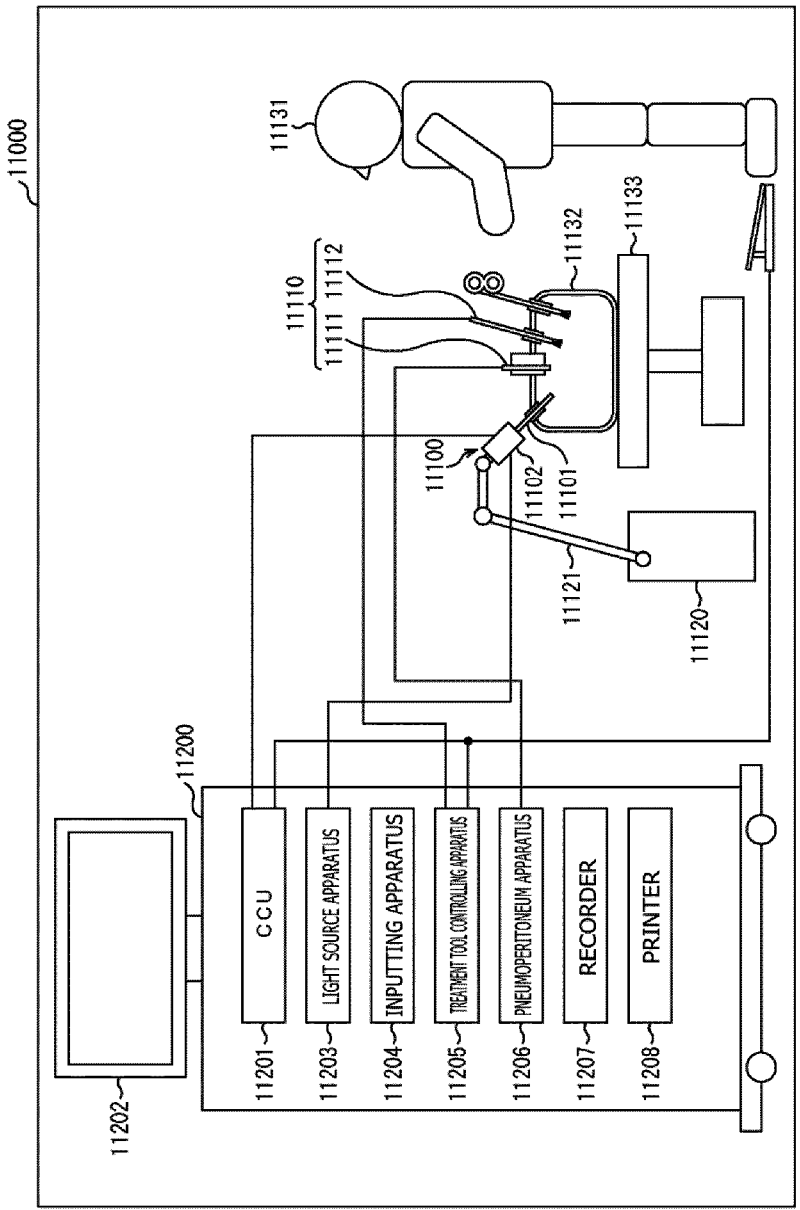

FIG. 76 is a view depicting an example of a schematic configuration of an endoscopic surgery system to which the technology according to an embodiment of the present disclosure (present technology) can be applied.

In FIG. 76, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 77:
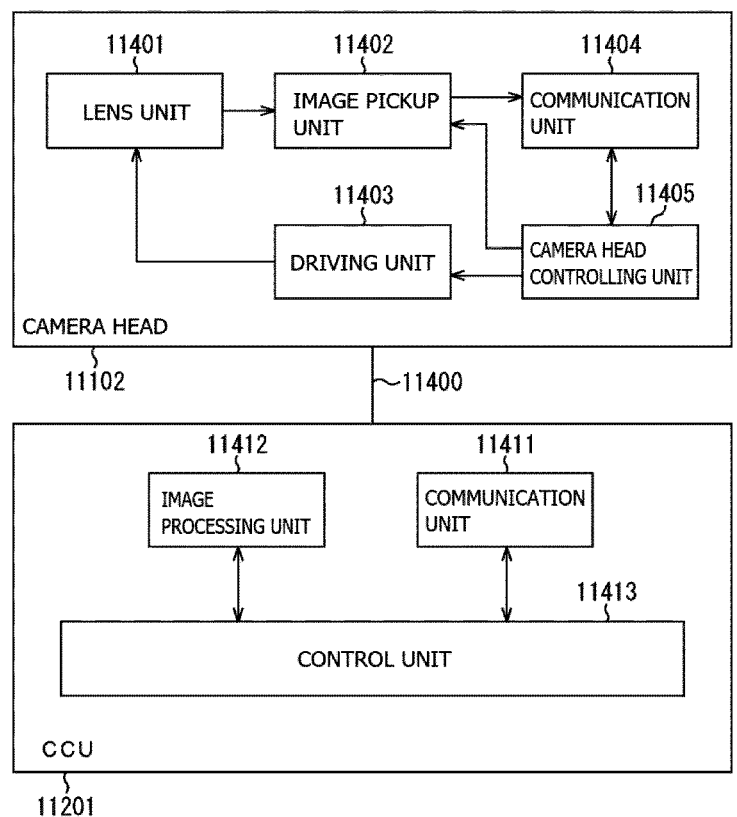

FIG. 77 is a block diagram depicting an example of a functional configuration of the camera head 11102 and the CCU 11201 depicted in FIG. 76.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of endoscopic surgery systems to which the technology according to the present disclosure can be applied has been explained thus far. The technology according to the present disclosure can be applied to, for example, the endoscope 11100, (the image pickup unit 11402 of) the camera head 11102, (the image processing unit 11412 of) the CCU 11201, or the like in the configurations explained above. Specifically, for example, the imaging apparatus 1 in FIG. 1, FIG. 9, FIG. 11 to 22, or the like can be applied to the lens unit 11401 and the image pickup unit 10402. By applying the technology according to the present disclosure to the lens unit 11401 and the image pickup unit 10402, it becomes possible to realize a size reduction and a height reduction of the apparatus configuration, and also to reduce occurrence of flares and ghosts resulting from internal diffused reflection.

Note that whereas an endoscopic surgery system has been explained as an example here, the technology according to the present disclosure may be applied to others such as a microscopic surgery system, for example.

27. Examples of Application to Mobile Bodies

The technology according to the present disclosure (the present technology) can be applied to various products. For example, the technology according to the present disclosure may be realized as an apparatus to be mounted on a mobile body of a type such as an automobile, an electric car, a hybrid electric car, a motorcycle, a bicycle, a personal mobility, an airplane, a drone, a ship, or a robot.

Figure 78:
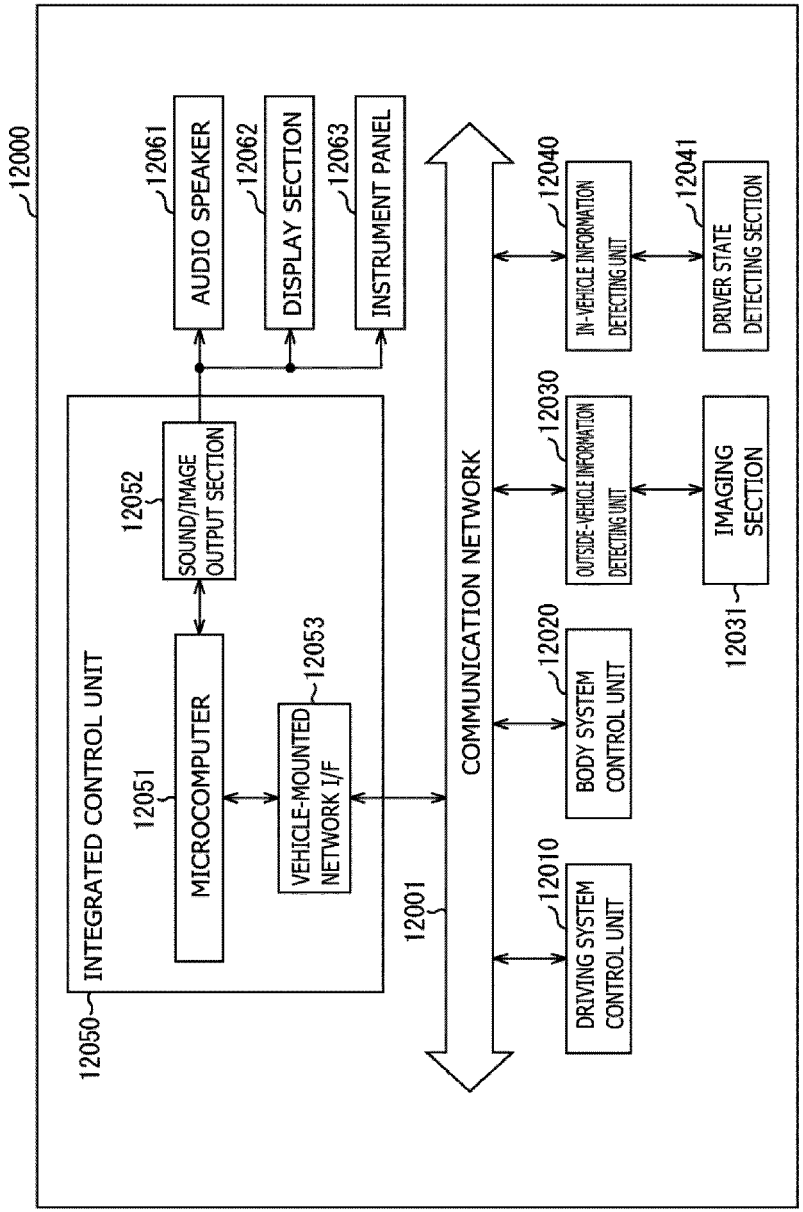

FIG. 78 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 78, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an image pickup unit 12031. The outside-vehicle information detecting unit 12030 makes the image pickup unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The image pickup unit 12031 is an optical sensor that receives light, and which outputs an electric signal corresponding to a received light amount of the light. The image pickup unit 12031 can output the electric signal as an image, or can output the electric signal as information about a measured distance. In addition, the light received by the image pickup unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 78, an audio speaker 12061, a display section 12062, and an instrument panel 12063 are illustrated as the output device. The display section 12062 may, for example, include at least one of an on-board display and a head-up display.

Figure 79:
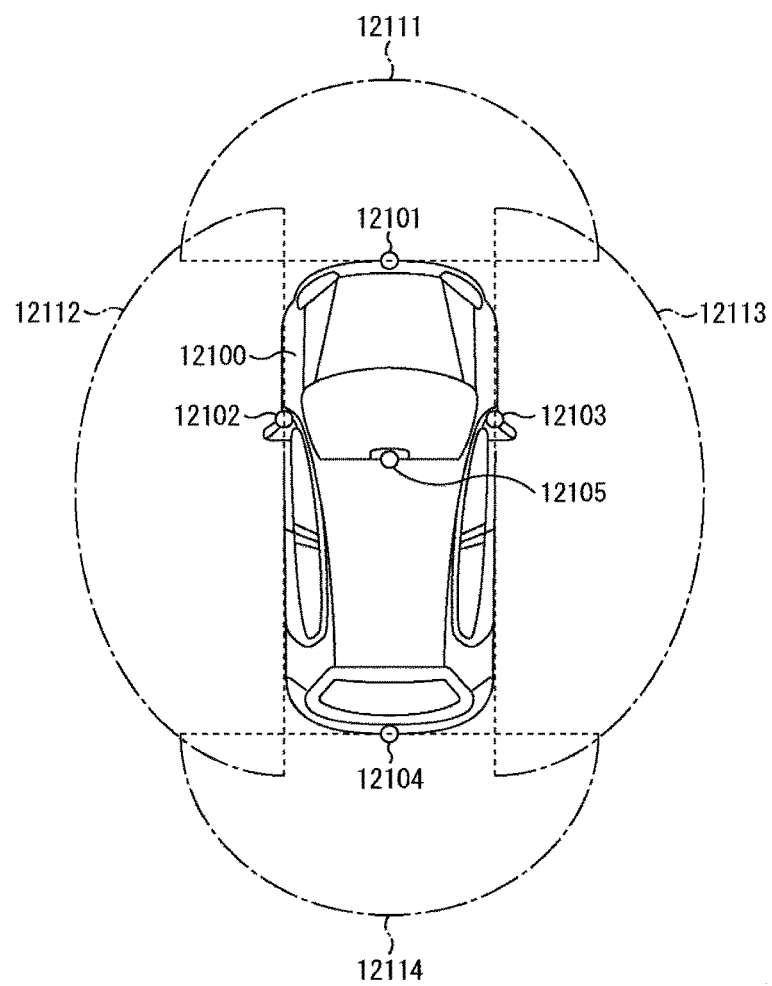

FIG. 79 is a diagram depicting an example of the installation position of the image pickup unit 12031.

In FIG. 79, the image pickup unit 12031 includes image pickup units 12101, 12102, 12103, 12104, and 12105.

The image pickup units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The image pickup unit 12101 provided to the front nose and the image pickup unit 12105 provided to the upper portion of the windshield within the interior of the vehicle obtain mainly an image of the front of the vehicle 12100. The image pickup units 12102 and 12103 provided to the sideview mirrors obtain mainly an image of the sides of the vehicle 12100. The image pickup unit 12104 provided to the rear bumper or the back door obtains mainly an image of the rear of the vehicle 12100. The image pickup unit 12105 provided to the upper portion of the windshield within the interior of the vehicle is used mainly to detect a preceding vehicle, a pedestrian, an obstacle, a signal, a traffic sign, a lane, or the like.

Incidentally, FIG. 79 depicts an example of photographing ranges of the image pickup units 12101 to 12104. An imaging range 12111 represents the imaging range of the image pickup unit 12101 provided to the front nose. Imaging ranges 12112 and 12113 respectively represent the imaging ranges of the image pickup units 12102 and 12103 provided to the sideview mirrors. An imaging range 12114 represents the imaging range of the image pickup unit 12104 provided to the rear bumper or the back door. A bird's-eye image of the vehicle 12100 as viewed from above is obtained by superimposing image data imaged by the image pickup units 12101 to 12104, for example.

At least one of the image pickup units 12101 to 12104 may have a function of obtaining distance information. For example, at least one of the image pickup units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the image pickup units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the image pickup units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the image pickup units 12101 to 12104 may be an infrared camera that detects infrared rays. The microcomputer 12051 can, for example, recognize a pedestrian by determining whether or not there is a pedestrian in imaged images of the image pickup units 12101 to 12104. Such recognition of a pedestrian is, for example, performed by a procedure of extracting characteristic points in the imaged images of the image pickup units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the image pickup units 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of vehicle control systems to which the technology according to the present disclosure can be applied has been explained thus far. The technology according to the present disclosure can be applied to the image pickup unit 12031, for example, in the configurations explained above. Specifically, for example, the imaging apparatus 1 in FIG. 1, FIG. 9, FIG. 11 to 22, or the like can be applied to the image pickup unit 12031. By applying the technology according to the present disclosure to the image pickup unit 12031, it becomes possible to realize a size reduction and a height reduction of the apparatus configuration, and also to reduce occurrence of flares and ghosts resulting from internal diffused reflection.

Note that the present disclosure can have the following configurations.

(1)
An Imaging Apparatus Including:
a solid-state imaging element that generates a pixel signal by photoelectric conversion according to a light amount of incident light;
a glass substrate provided on the solid-state imaging element; and
a lens provided on the glass substrate, in which
four corners of the lens that is substantially rectangular when seen in a plan view do not have angles equal to or smaller than 90°.

(2)
The imaging apparatus according to (1), in which the four corners of the lens have an arc shape with a predetermined radius.

(3)
The imaging apparatus according to (2), in which the predetermined radius is a radius that satisfies {(the predetermined radius)/(an average value of lengths of longer sides and shorter sides of the lens)}>1%.

(4)
The imaging apparatus according to (3), in which the predetermined radius is a radius that satisfies {(the predetermined radius)/(an average value of lengths of longer sides and shorter sides of the lens)}>3%.

(5)
The imaging apparatus according to (3) or (4), in which a length of each side of the lens is within a range from 1 to 50 mm.

(6)
The imaging apparatus according to (2), in which the predetermined radius is equal to or larger than 100 μm.

(7)
The imaging apparatus according to (6), in which the predetermined radius is equal to or larger than 200 μm.

(8)
The imaging apparatus according to (6) or (7), in which an average value of lengths of longer sides and shorter sides of the lens is within a range from 5 to 10 mm.

(9)
The imaging apparatus according to (2), in which arcs of the four corners of the lens match one circle having the predetermined radius.

(10)
The imaging apparatus according to (1), in which angled sections of the four corners of the lens have polygonal shapes that include a plurality of obtuse angles that are arranged at predetermined intervals.

(11)
Electronic Equipment Including:
an imaging apparatus including
a solid-state imaging element that generates a pixel signal by photoelectric conversion according to a light amount of incident light,
a glass substrate provided on the solid-state imaging element, and
a lens provided on the glass substrate,
four corners of the lens that is substantially rectangular when seen in a plan view not having angles equal to or smaller than 90°.

REFERENCE SIGNS LIST

1: Imaging apparatus
10: Integrated configuration section
11: Solid-state imaging element (having CPS structure)
11a: Lower substrate (logic board)
11b: Upper substrate (pixel sensor substrate)
11c: Color filter
11d: On-chip lens
12: Glass substrate
13: Adhesive
14: IRCF (infrared cut filter)
14': IRCF glass substrate
15: Adhesive
16: Lens group
131, 131', 131'': Lens
151: Adhesive
171: Lens group
191: Solid-state imaging element (having COB structure)
271: Lens
271a: AR coat
291: Lens
291a: Anti-reflection treatment section
301: Infrared cut lens
321: Glass substrate
351: Refractive film
452, 452', 452'', 452''': Shaping mold
453: Light blocking film
461: Ultraviolet light curing resin
601: Ultraviolet light curing resin
602: Shaping mold
603: Light blocking film
611: Circle

The invention claimed is:

1. An imaging apparatus, comprising:
a solid-state imaging element configured to generate a pixel signal by photoelectric conversion based on a light amount of incident light;
a glass substrate on the solid-state imaging element; and
a lens on the glass substrate, wherein
four corners of the lens that is substantially rectangular when seen in a plan view do not have angles equal to or smaller than 90°,
the four corners of the lens have an arc shape with a specific radius, and
a value of the specific radius is based on an average value of lengths of longer sides and shorter sides of the lens.

2. The imaging apparatus according to claim 1, wherein the specific radius satisfies {(the specific radius)/(the average value of the lengths of the longer sides and the shorter sides of the lens)}>1%.

3. The imaging apparatus according to claim 1, wherein the specific radius satisfies {(the specific radius)/(the average value of the lengths of the longer sides and the shorter sides of the lens)}>3%.

4. The imaging apparatus according to claim 2, wherein a length of each side of the lens is within a range from 1 to 50 mm.

5. The imaging apparatus according to claim 1, wherein the specific radius is equal to or larger than 100 μm.

6. The imaging apparatus according to claim 5, wherein the specific radius is equal to or larger than 200 μm.

7. The imaging apparatus according to claim 5, wherein the average value of the lengths of the longer sides and the shorter sides of the lens is within a range from 5 to 10 mm.

8. The imaging apparatus according to claim 1, wherein arcs of the four corners of the lens match one circle having the specific radius.

9. The imaging apparatus according to claim 1, wherein the lens comprises angled sections of the four corners,
the angled sections have polygonal shapes, and
the angled sections correspond to a plurality of obtuse angles at specific intervals.

10. An electronic equipment, comprising:
an imaging apparatus that includes:
a solid-state imaging element configured to generate a pixel signal by photoelectric conversion based on a light amount of incident light;
a glass substrate on the solid-state imaging element; and
a lens on the glass substrate, wherein
four corners of the lens that is substantially rectangular when seen in a plan view not having angles equal to or smaller than 90°,
the four corners of the lens have an arc shape with a specific radius, and
a value of the specific radius is based on an average value of lengths of longer sides and shorter sides of the lens.

* * * * *